(12) United States Patent
Korenaga

(10) Patent No.: US 6,864,602 B2
(45) Date of Patent: Mar. 8, 2005

(54) LINEAR MOTOR, STAGE APPARATUS, AND EXPOSURE APPARATUS

(75) Inventor: Nobushige Korenaga, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/265,440

(22) Filed: Oct. 7, 2002

(65) Prior Publication Data

US 2003/0102723 A1 Jun. 5, 2003

(30) Foreign Application Priority Data

Oct. 5, 2001 (JP) .................................... 2001-310052
Oct. 5, 2001 (JP) .................................... 2001-310053

(51) Int. Cl.⁷ .............................................. H02K 41/00
(52) U.S. Cl. ................................... 310/12; 318/135
(58) Field of Search ........................... 310/12, 13, 14, 310/135; 318/135; 355/53, 72

(56) References Cited

U.S. PATENT DOCUMENTS

| | | | | |
|---|---|---|---|---|
| 3,610,970 A | * | 10/1971 | Skinner .................... | 310/10 |
| 3,800,172 A | * | 3/1974 | Artin et al. ............... | 310/50 |
| 4,427,907 A | * | 1/1984 | Flick et al. ............... | 310/52 |
| 4,528,466 A | * | 7/1985 | von der Heide et al. ... | 310/12 |
| 4,870,310 A | * | 9/1989 | Triplett ................... | 310/74 |
| 5,402,680 A | | 4/1995 | Korenaga ................. | 73/518 |
| 5,471,100 A | * | 11/1995 | Sakamoto et al. ......... | 310/12 |
| 5,497,041 A | * | 3/1996 | Kondoh et al. ............ | 715/534 |
| 5,518,550 A | | 5/1996 | Korenaga et al. .......... | 118/729 |
| 5,684,856 A | | 11/1997 | Itoh et al. ................ | 378/34 |
| 5,841,250 A | | 11/1998 | Korenage et al. .......... | 318/135 |
| 6,002,465 A | | 12/1999 | Korenaga ................. | 355/53 |
| 6,013,959 A | * | 1/2000 | Hoppie .................... | 310/12 |
| 6,037,680 A | | 3/2000 | Korenaga et al. .......... | 310/12 |
| 6,075,297 A | * | 6/2000 | Izawa et al. .............. | 310/12 |
| 6,107,703 A | | 8/2000 | Korenaga ................. | 310/12 |
| 6,109,767 A | * | 8/2000 | Rodriguez ................ | 362/294 |
| 6,114,781 A | * | 9/2000 | Hazelton et al. .......... | 310/12 |
| 6,128,069 A | | 10/2000 | Korenaga ................. | 355/53 |
| 6,157,159 A | | 12/2000 | Korenaga et al. .......... | 318/649 |
| 6,163,091 A | * | 12/2000 | Wasson et al. ............ | 310/12 |
| 6,177,978 B1 | | 1/2001 | Korenaga ................. | 355/53 |
| 6,226,073 B1 | * | 5/2001 | Emoto ..................... | 355/53 |
| 6,242,823 B1 | * | 6/2001 | Griswold ................. | 310/30 |
| 6,265,793 B1 | | 7/2001 | Korenaga ................. | 310/12 |
| 6,271,606 B1 | | 8/2001 | Hazelton ................. | 310/12 |
| 6,313,552 B1 | * | 11/2001 | Boast ..................... | 310/14 |
| 6,320,645 B1 | | 11/2001 | Inoue et al. .............. | 355/53 |
| 6,359,677 B2 | | 3/2002 | Itoh et al. ................ | 355/53 |
| 6,365,993 B1 | * | 4/2002 | Calhoon et al. ........... | 310/12 |
| 6,414,742 B1 | | 7/2002 | Korenaga et al. .......... | 355/53 |
| 6,492,756 B1 | * | 12/2002 | Maslov et al. ......... | 310/156.12 |

FOREIGN PATENT DOCUMENTS

| | | |
|---|---|---|
| DE | 101 50 520 A 1 | 10/2001 |
| JP | 10-169538 | 6/1998 |
| JP | 11-69761 | 3/1999 |
| JP | 2000-83364 | 3/2000 |

\* cited by examiner

Primary Examiner—Thanh Lam
Assistant Examiner—Judson H. Jones
(74) Attorney, Agent, or Firm—Fitzpatrick, Cella, Harper & Scinto

(57) ABSTRACT

A linear motor includes a coil unit and a magnet unit. The coil unit includes an inner yoke extending in a moving direction and a coil arranged outside the inner yoke. The magnet includes a magnet arranged outside the coil. Each of the inner yoke, coil, and magnet includes a plurality of flat portions, the plurality of flat portions of the inner yoke are parallel to an axis of the coil. Each flat portion of the inner yoke is parallel to the corresponding flat portion of the coil and the corresponding flat portion of the magnet. A length of the inner yoke in a direction along the axis of the coil is longer than a length of the magnet in the direction along the axis of the coil, and the inner yoke has a prismatic structure formed by the plurality of flat portions supported by a support member.

48 Claims, 44 Drawing Sheets

SECTION A-A

SECTION A-A

105

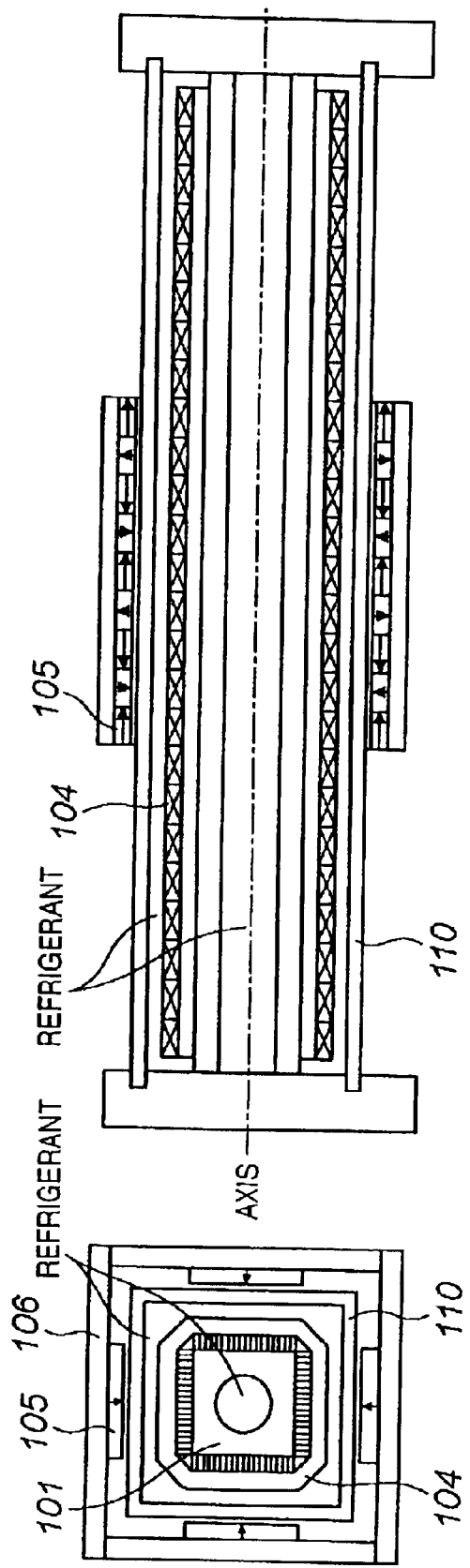

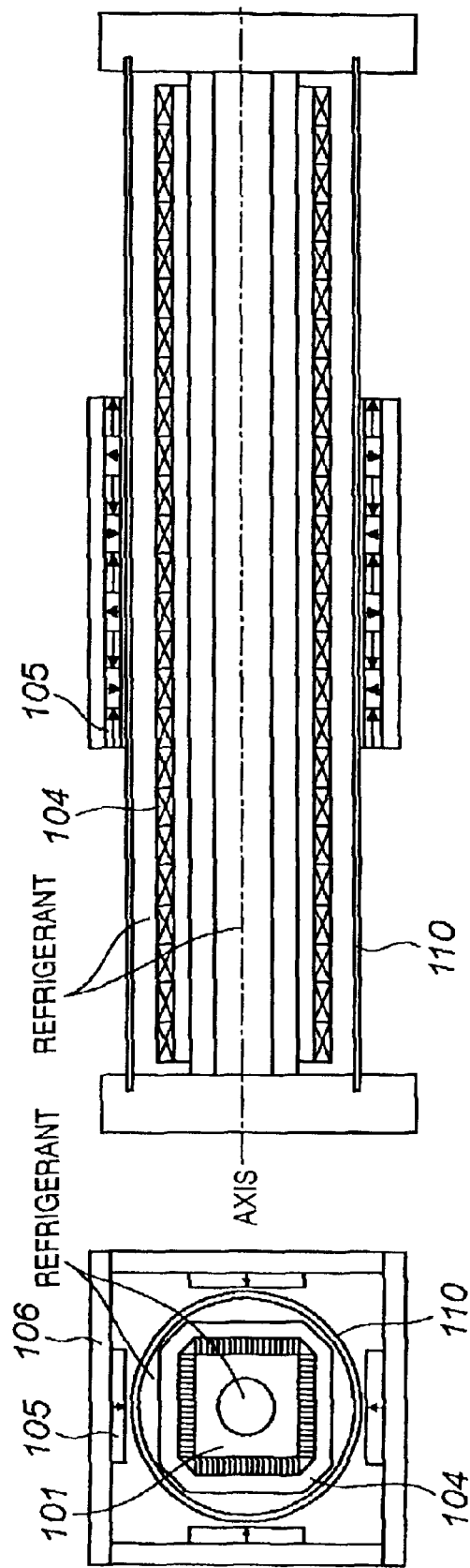

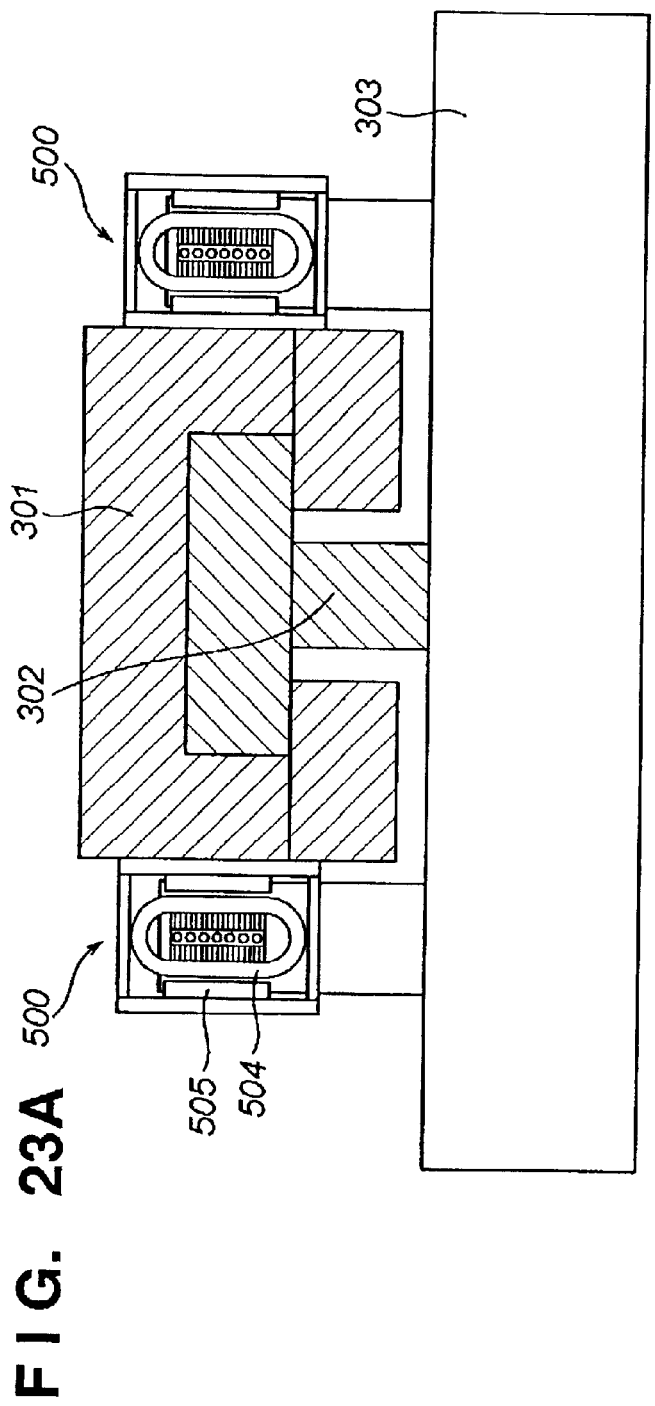

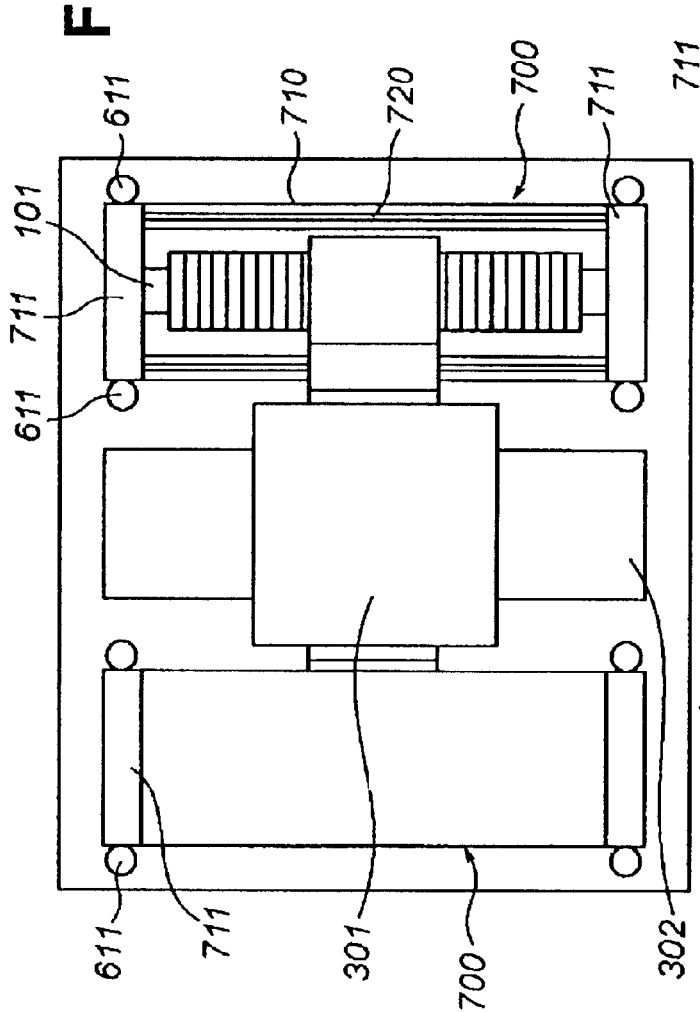
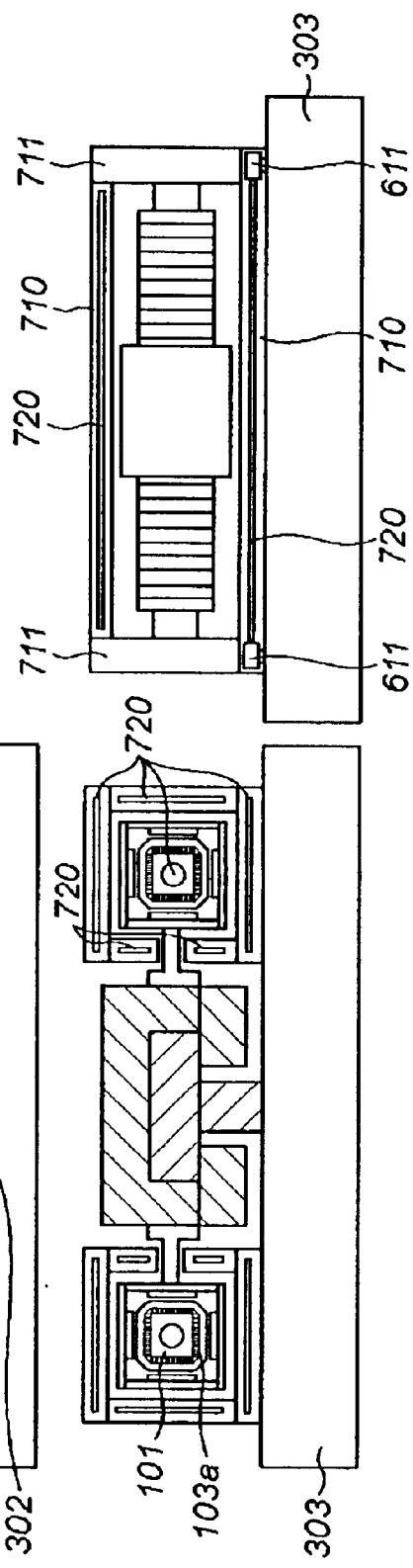
FIG. 25A
FIG. 25B
FIG. 25C

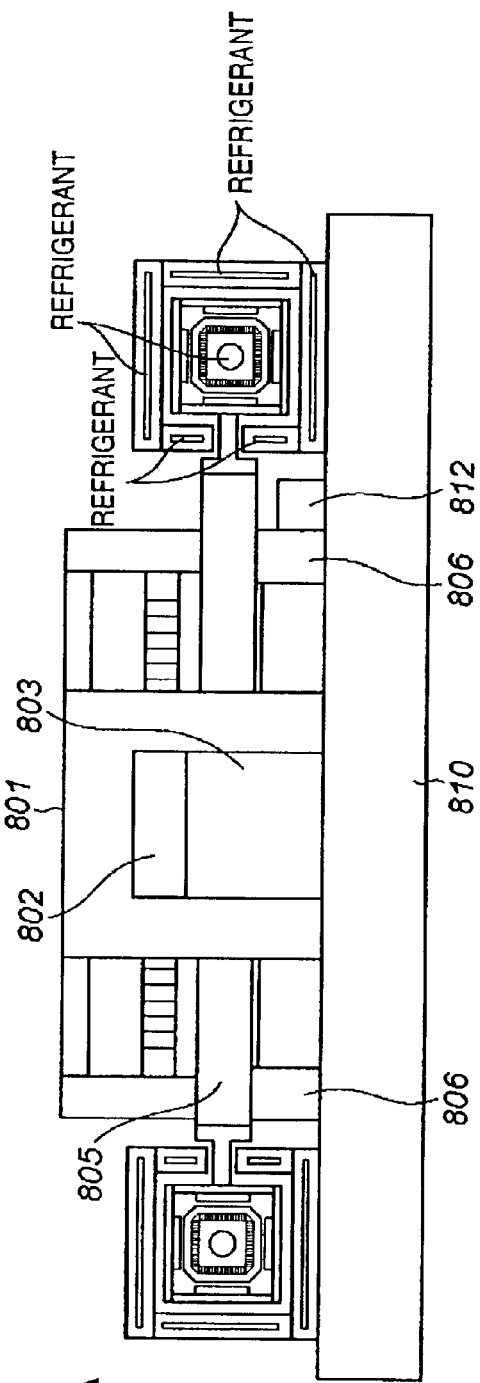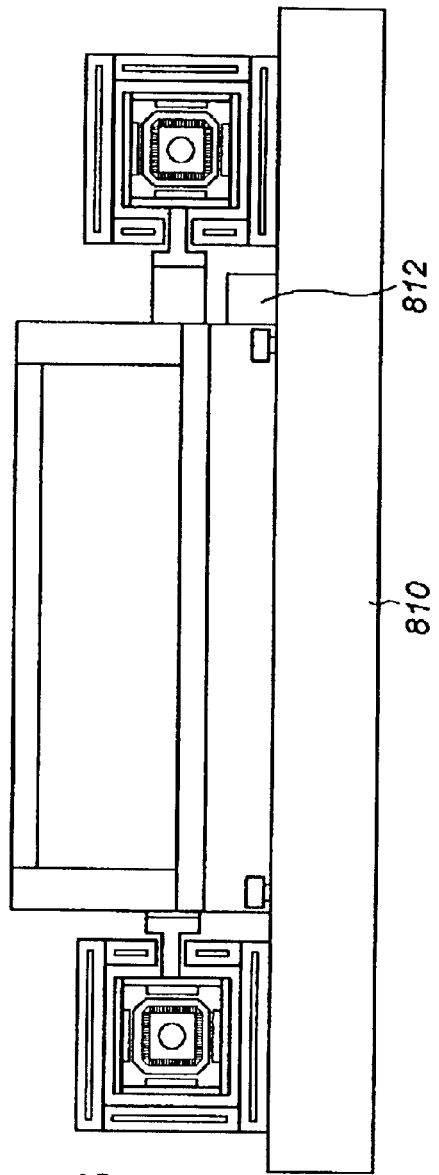
FIG. 27A
FIG. 27B

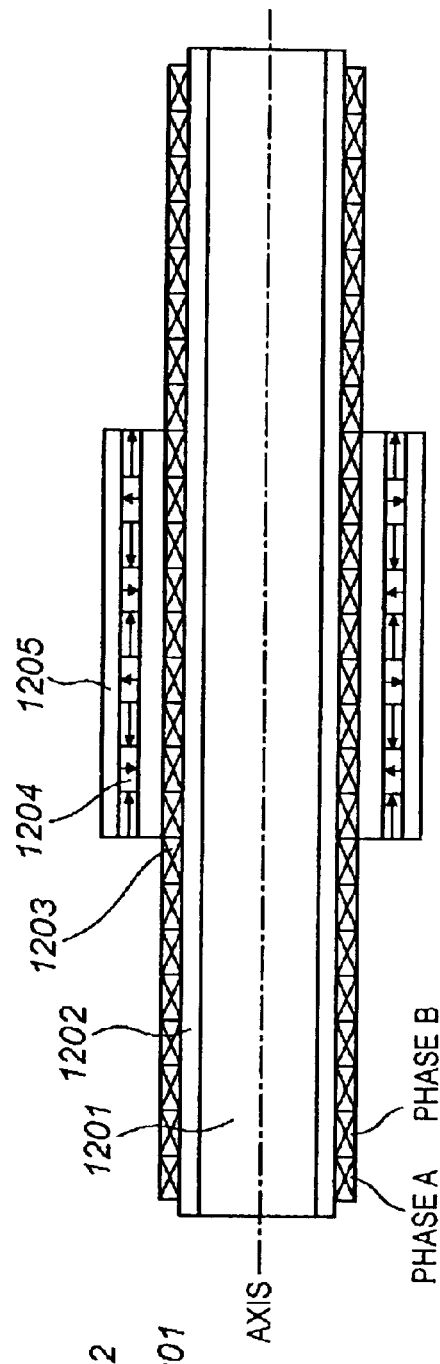
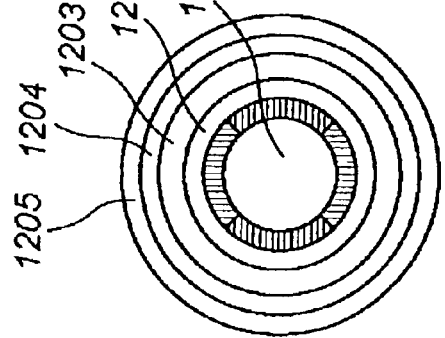
FIG. 32A
FIG. 32B
FIG. 32C

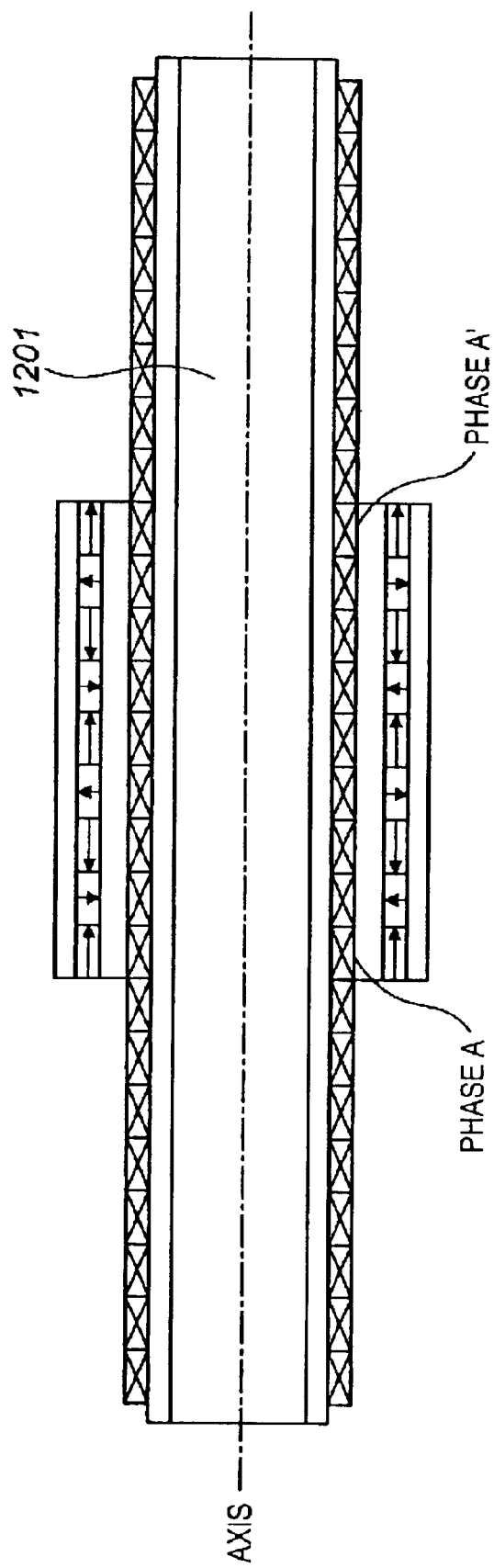

WAFER PROCESS

LINEAR MOTOR, STAGE APPARATUS, AND EXPOSURE APPARATUS

FIELD OF THE INVENTION

The present invention relates to a linear motor, a stage apparatus, and an exposure apparatus.

BACKGROUND OF THE INVENTION

As a linear motor, a cylindrical one as shown in FIGS. 32A and 32B is known. FIG. 32A is a sectional view of the linear motor taken along its axial direction, and FIG. 32B is a sectional view of the linear motor taken along a direction perpendicular to its axis. In the linear motor shown in FIGS. 32A and 32B, an annular multilayered yoke (iron core) 1202 formed by combining arcuated multilayered yoke members 1202a each shown in FIG. 32C is formed outside a cylindrical support rod 1201. A plurality of annular partial coils 1203 are arrayed outside the multilayered yoke 1202 along the axis of the cylindrical support rod 1201. The cylindrical support rod 1201, annular multilayered yoke 1202, and plurality of annular partial coils 1203 described above form the stator of the linear motor.

The movable element of the linear motor is formed outside the annular partial coils 1203 of the stator, and is formed of an annular yoke 1205 and a plurality of annular partial magnets 1204. The plurality of annular partial magnets 1204 include those magnetized in the radial direction of the annulus and those magnetized in the axial direction. More specifically, the direction of magnetization of each annular partial magnet 1204 is determined such that an alternating field is generated inside a cylinder formed of the plurality of annular partial magnets 1204.

In this conventional linear motor, a so-called Halbach layout generates a field close to a sine-wave field of two periods in the cylinder. The annular yoke 1205 is arranged outside the plurality of annular partial magnets 1204, and serves as a so-called back yoke. In other words, the annular yoke 1205 is formed on the rear side of the annular partial magnets 1204 so as to increase the magnetic flux of the magnets. In this example, since the annular partial magnets 1204 form the Halbach layout, the back yoke can be thin.

The annular multilayered iron core 1202 of the stator serves to intensity the magnetic field of the plurality of annular partial magnets 1204 generated inside the annulus. In this example, since the annular partial magnets 1204 form the Halbach layout, the annular multilayered yoke 1202 must be thicker than the back yoke.

The annular yoke 1205 as the back yoke can be a plain one as it is integral with the magnets 1204. As the annular multilayered yoke 1202 of the stator moves relative to the magnets 1204, it has a multilayered structure with an insulating layer formed in a direction along its axis, thereby preventing an eddy current.

The plurality of annular coils 1203 are formed of a plurality of phases (two phases A and B in this example).

This linear motor is driven by general sine-wave driving, and is controlled such that the current and magnetic flux intersect each other. Note that this arrangement employs a movable magnet, stationary coil method, and requires coil switching in addition to general sine-wave driving. This is to supply power to, of the plurality of partial coils 1203, only those that face the plurality of partial magnets 1204, so heat generation is reduced. FIG. 33 shows the switching timing for the phase A. In the state shown in FIG. 33, when the movable element moves to the right, the phase A becomes OFF, and the phase A' becomes ON. Conversely, when the movable element moves to the left, the phase A' becomes OFF and the phase A becomes ON. Regarding phases that oppose other magnets, the phases A and B are all OFF.

The conventional cylindrical linear motor described above has the following problems in terms of the manufacture and performance, since the partial magnets 1204, the partial coils 1203, and the multilayered yoke 1202 of the stator are cylindrical.

The first problem is that the multilayered iron core of the stator is difficult to fabricate, and an eddy current is difficult to prevent. Conventionally, the annular multilayered yoke 1202 is formed by combining the arcuated multilayered yoke members 1202a. It is difficult to fabricate such arcuated multilayered yoke members 1202a. Hence, rectangular parallelepiped multilayered yoke members must be fabricated first, and then must be formed into arcuated shapes by wire cutting or the like. With this method, a large number of processing steps are required. It is thus difficult to fabricate a structure with a length corresponding to the length of the stator in the axial direction with one process. Also, it is difficult to obtain highly precise arcs.

The magnetic fluxes of the annular partial magnets 1204 enter the multilayered yoke 1202. Hence, in the concentric arrangement shown in FIGS. 32A and 32B, it is desirable that the multilayered structure of the multilayered yoke 1202 is ideally formed completely radially. In the arrangement of FIGS. 32A and 32B, however, since the layers of the multilayered yoke 1202 are not completely radial, an eddy current is undesirably generated by some components of the magnetic fluxes. It is still also difficult to fabricate a completely radial multilayered iron core.

The second problem is that the magnet unit of the movable element is difficult to fabricate and variations in thrust are caused. The magnet unit of the movable element is formed by inserting the plurality of annular partial magnets 1204 inside the cylindrical yoke 1205. When inserting the annular partial magnets 1204 in the cylindrical yoke 1205, it is difficult to set their tolerances. When the tolerances are decreased, the positional precision may improve. With this structure, however, as the short annular partial magnets 1204 must be inserted in the long cylindrical yoke 1205, scuffing tends to occur, and it is difficult to insert the cylindrical magnets 1204 deep into the annular yoke 1205. Conversely, when the tolerances are increased, the annular partial magnets 1204 may be inserted in the cylindrical yoke 1205 easily. However, tilt or eccentricity may occur so the annular partial magnets 1204 cannot be attached with high precision. As the cylindrical yoke 1205 and each annular partial coil 1203 come into contact with each other through only one point, they are not fixed securely to each other. Furthermore, magnets and iron attract each other, and magnets attract and repel each other, making the assembly more difficult. When the assembly precision of the cylindrical magnets 1204 is degraded, variations in thrust are caused, leading to degradation in precision of the linear motor. A method of making the constituent members of the cylindrical yoke 1205 and annular partial magnets 1204 into small pieces and assembling them has been studied. With this method, however, a cylindrical surface must still be fixed to another cylindrical surface. The number of components increases to increase the number of processing steps, and to guarantee the assembly precision as a whole becomes more difficult. In this manner, a thorough solution cannot be made.

The third problem is that it is difficult to draw out a conductor wire from the stator coil, thus decreasing the thrust. In the annular coil 1203, a conductor wire at the winding start portion is always on the inner side. To draw out the conductor wire at the winding start portion to the outside of the annular coil 1203, the conductor wire need be drawn out to the outer surface of the annular coil 1203, and need be drawn out along the outer surface of the annular coil 1203 in the axial direction. Also, a space such as a groove need be formed in the annular multilayered yoke 1202, and the conductor wire need be extended in the space. In the former case, the lead conductor wire is extended in the gap between the magnets 1204 and coils 1203. When the mechanical clearance between the magnets and coils (minimum distance between the magnets and coils) is to be made constant, the magnetic gap between the magnets 1204 and stator multilayered iron yoke 1202 must be increased. This decreases the thrust. In the latter case, machining of the multilayered iron core 1202 becomes more difficult, and the magnetic gap increases partially, leading to a decrease in thrust.

The conductor wire at the winding end portion of each coil 1203 is always located on the outer surface of the coil. When this conductor wire is directly extended along the outer surface of the coil 1203, a decrease in thrust is caused to accompany an increase in magnetic gap. If the conductor wire at the winding end portion is guided to the inner side of the coil 1203 first and is then extended on the inner surface of the coil 1203, the same problem as that arising when the conductor wire at the winding start portion is extended on the inner surface of the coil 1203 occurs. That is, the multilayered iron core becomes difficult to machine, and the thrust is decreased by an increase in partial magnetic gap.

SUMMARY OF THE INVENTION

The present invention has been made in view of the above situation, and has as its object to provide a linear motor with a structure that can be fabricated easily, and a stage apparatus and an exposure apparatus having this linear motor. Additional objects of the present invention include to reduce an eddy current in the yoke, to reduce variations in thrust, to facilitate drawing of the winding out from the coil, and to suppress a decrease in thrust caused by drawing of the winding. Other practical objects of the present invention will be described in the detailed description of the invention.

According to the first aspect of the present invention, there is provided a linear motor having a stator and movable element, wherein the stator has a stator yoke and a stator coil arranged outside the stator yoke, and the movable element has a movable magnet arranged outside the stator coil, the stator yoke, stator coil, and movable magnet each having a plurality of flat portions, the plurality of flat portions of the stator coil being parallel to an axis of the stator, and the flat portions of the stator yoke being parallel to the corresponding flat portions of the stator coil and the corresponding flat portions of the movable magnet.

According to a preferred embodiment of the present invention, each flat portion of the stator yoke preferably has a multilayered structure formed by stacking a large number of layers perpendicular to the flat portion and parallel to the axis of the stator.

According to the second aspect of the present invention, there is provided a linear motor having a stator and movable element, wherein the stator has a stator yoke and a stator coil arranged outside the stator yoke, and the movable element has a movable magnet arranged outside the stator coil, the movable magnet and the stator yoke each having a plurality of rectangular parallelepiped portions, the stator coil having a plurality of flat portions parallel to an axis of the stator, and the parallelepiped portions of the movable magnet being parallel to the corresponding parallelepiped portions of the stator yoke and the corresponding flat portions of the stator coil.

According to the third aspect of the present invention, there is provided a linear motor having a stator and movable element, wherein the stator has a stator yoke comprising a plurality of multilayered bodies each formed by stacking a large number of layers parallel to an axis of the stator, and a stator coil arranged outside (or inside) the stator yoke, and the movable element has a movable magnet arranged outside (or inside) the stator coil, and the multilayered bodies of the stator yoke have rectangular parallelepiped shapes or non-arcuated shapes similar to rectangular parallelepiped shapes. For example, at least one of the stator coil and movable magnet has a plurality of rectangular parallelepiped portions, and the plurality of rectangular parallelepiped portions are arranged to be parallel to the plurality of multilayered bodies of the stator yoke.

According to a preferred embodiment of the present invention, in the stator yoke, the plurality of flat portions or rectangular parallelepiped portions are preferably supported by a support member, and the stator yoke preferably has a prismatic structure.

According to a preferred embodiment of the present invention, a winding start portion and/or winding end portion of the stator coil is preferably positioned near a boundary of one flat portion or rectangular parallelepiped portion and another flat portion or rectangular parallelepiped portion of the stator coil. Furthermore, according to a preferred embodiment of the present invention, a conductor wire drawn out from the stator coil is preferably arranged to extend near the boundary of one flat portion or rectangular parallelepiped portion and another flat portion or rectangular parallelepiped portion of the stator coil along an axis of the stator.

According to a preferred embodiment of the present invention, each of the stator yoke, stator coil, and movable magnet preferably has four flat portions or rectangular parallelepiped portions. Alternatively, in another respect, each of the stator yoke, stator coil, and movable magnet preferably has three flat portions or rectangular parallelepiped portions. In still another respect, each of the stator yoke, stator coil, and movable magnet preferably has two flat portions or rectangular parallelepiped portions.

According to a preferred embodiment of the present invention, a support member for supporting the stator yoke from inside preferably has a flow channel therein through which a refrigerant is to flow. The flow channel preferably has, e.g., a circular section. Alternatively, in another respect, the flow channel preferably comprises a plurality of flow channels formed in the support member. In still another respect, the flow channel preferably has a plurality of grooves arranged radially about an axis of the stator as a center. In still another respect, the flow channel preferably has a honeycomb-like section.

According to a preferred embodiment of the present invention, a support member for supporting the stator yoke is preferably made of a metal. Alternatively, in another respect, a support member for supporting the stator yoke is preferably made of a ceramic material.

According to a preferred embodiment of the present invention, a partition is preferably arranged between the stator coil of the stator and the movable magnet of the movable element, and a flow channel through which a refrigerant is to flow is preferably formed between the stator coil and the partition. The partition may have a polygonal section, a circular section, or a section with any other shape. According to a preferred embodiment of the present invention, the partition is preferably made of an insulating material.

According to a preferred embodiment of the present invention, the stator preferably has a plurality of partial stator coils arrayed in a direction of an axis of the stator, and the linear motor preferably further has an aligning member for aligning the plurality of partial stator coils. The aligning member preferably has a comb tooth shape at a section thereof taken along a direction of the axis of the stator coil, and the partial stator coils are preferably aligned among comb teeth that form the comb tooth shape.

Alternatively, the stator may have a plurality of partial stator coils arrayed in a direction of the axis of the stator, and each of the partial stator coils maybe wound on a bobbin. The bobbin preferably has a notch in a side plate thereof. Also, the side plate of the bobbin preferably has a thickness larger than ½ a diameter of a winding of the stator coil.

A preferred embodiment of the present invention preferably has a gas release-preventive cover outside the stator coil.

According to a preferred embodiment of the present invention, the movable element preferably has a back yoke outside the movable magnet. The back yoke preferably has a plurality of flat portions arranged to be parallel to the plurality of flat portions of the movable magnet. The back yoke preferably has a hollow prismatic structure which is formed by connecting the plurality of flat portions that form the back yoke. Alternatively, the plurality of flat portions that form the back yoke are preferably supported by a support member.

According to the fourth aspect of the present invention, there is provided a linear motor which has a stator coil wound around a driving axis, a stator yoke arranged inside the stator coil, and a movable magnet arranged outside the stator coil, and which generates a thrust, upon interaction of the stator coil and movable magnet, to drive the movable magnet toward the driving axis, wherein the stator yoke has a plurality of multilayered yoke members, each of the multilayered yoke members being formed by stacking thin plates with the same shape to be parallel to each other.

According to the fifth aspect of the present invention, there is provided a linear motor which has a stator coil wound around a driving axis, a stator yoke arranged inside the stator coil, and a movable magnet arranged outside the stator coil, and which generates a thrust, upon interaction of the stator coil and movable magnet, to drive the movable magnet toward the driving axis, wherein the stator yoke has a plurality of multilayered yoke members, each of the multilayered yoke members being formed by stacking thin plates to be parallel to each other, and the movable magnet has a plurality of magnets respectively opposing the plurality of multilayered yoke members, directions of magnetization of the magnets in predetermined sections perpendicular to the driving axis being parallel to surfaces of the thin plates that form the multilayered yoke members opposing the magnets. Of each of the stator yoke members, a first surface which opposes the magnets preferably includes a convex surface, and a second surface opposite to the first surface preferably includes a flat surface.

The present invention exhibits its effect in any apparatus that utilizes the above linear motor.

A stage apparatus according to the sixth aspect of the present invention is characterized by comprising the linear motor described above, and a stage driven by the linear motor.

According to a preferred embodiment of the present invention, the stage apparatus preferably further comprises a mass element connected to a stator of the linear motor, and a surface plate for slidably supporting a structure including the stator and the mass element. The mass element is preferably arranged to surround the stator and movable element of the linear motor. The mass element preferably has a flow channel therein through which a refrigerant is to flow. The movable element preferably has a reflection body at least on that surface thereof which faces the stator, and the mass element preferably has an absorption body at least on that surface thereof which faces the stator.

An exposure apparatus according to the seventh aspect of the present invention is characterized by having the above stage apparatus as a stage apparatus for aligning a substrate or master.

Still another aspect of the present invention is characterized by including the steps of exposing a wafer with a device pattern using the above exposure apparatus, and developing the exposed wafer.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 19A, 19B, 20A, and 20B are views showing the arrangement of a linear motor according to the second embodiment of the present invention;

FIGS. 23A to 23C are views showing a linear motor according to the fifth embodiment of the present invention, and a stage apparatus utilizing it;

FIGS. 25A to 25C are views showing a linear motor according to the seventh embodiment of the present invention, and a stage apparatus utilizing it;

FIGS. 26, 27A, 27B, 28A, and 28B are views showing the arrangement of a bi-axial stage apparatus according to the eighth embodiment of the present invention;

FIGS. 32A to 32C, and FIG. 33 are views showing a conventional linear motor;

DETAILED DESCRIPTION OF THE PREFERRED EMBODIMENTS

The preferred embodiments of the present invention will be described with reference to the accompanying drawings.

[First Embodiment]

Figure 1:
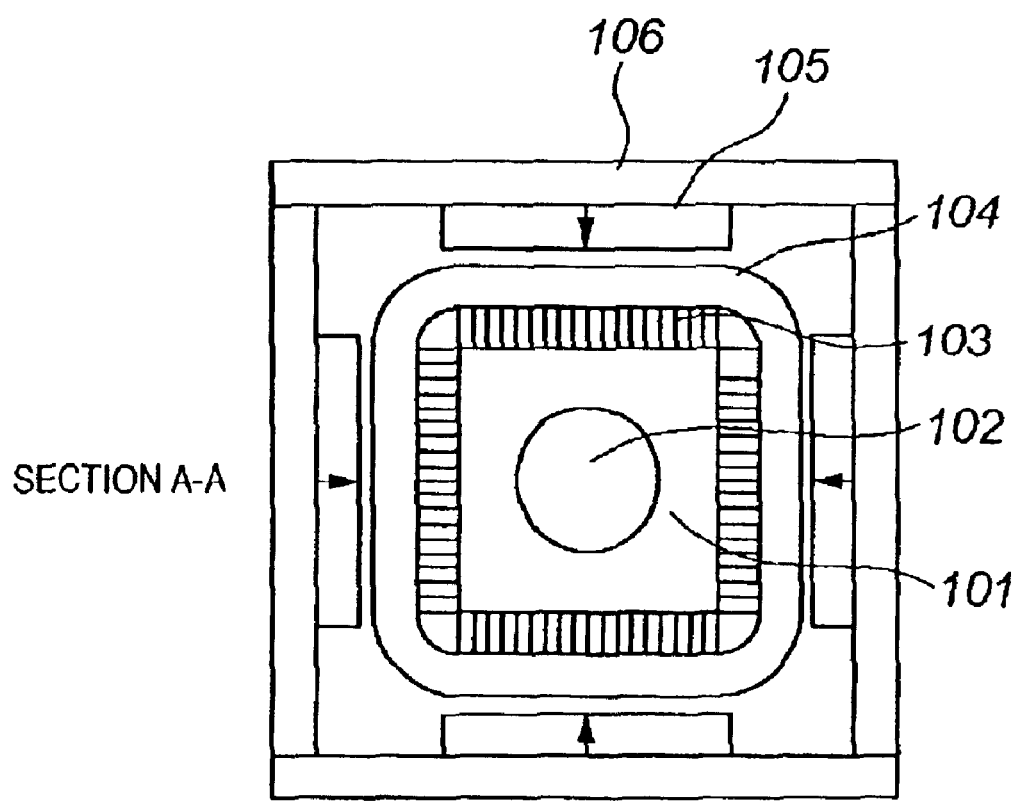
FIGS. 1 to 18 are views showing the arrangement of a linear motor according to the first embodiment of the present invention.
Figure 2:
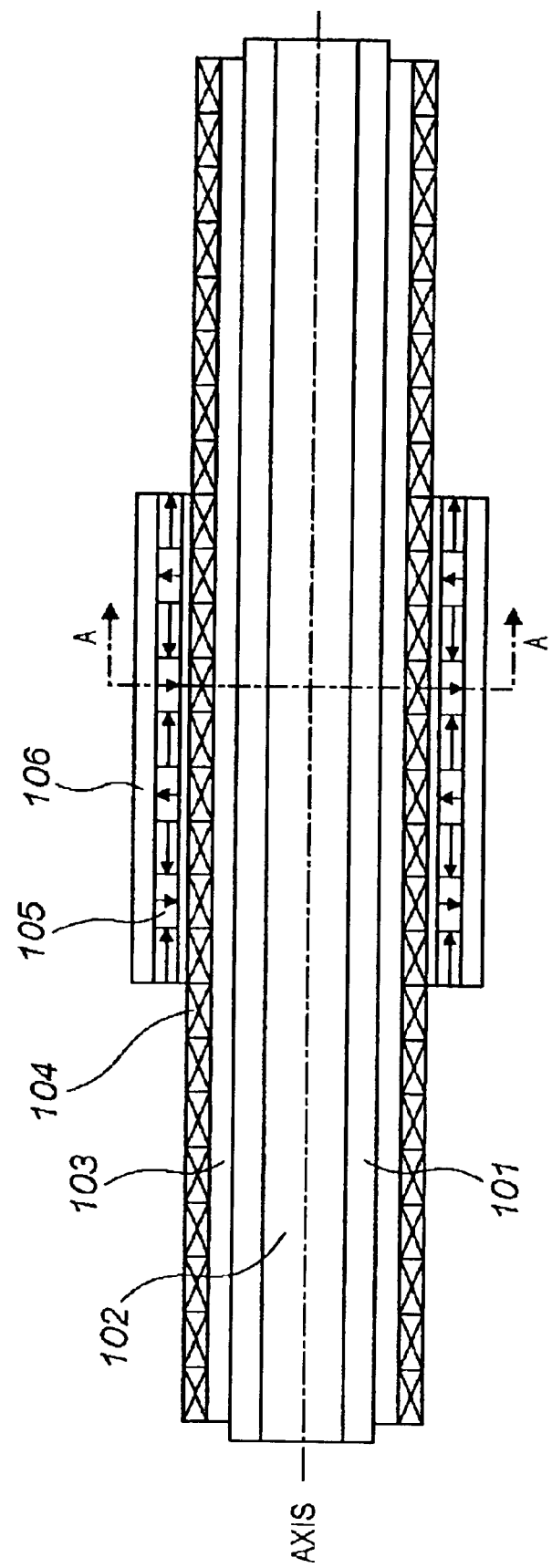
Figure 3:
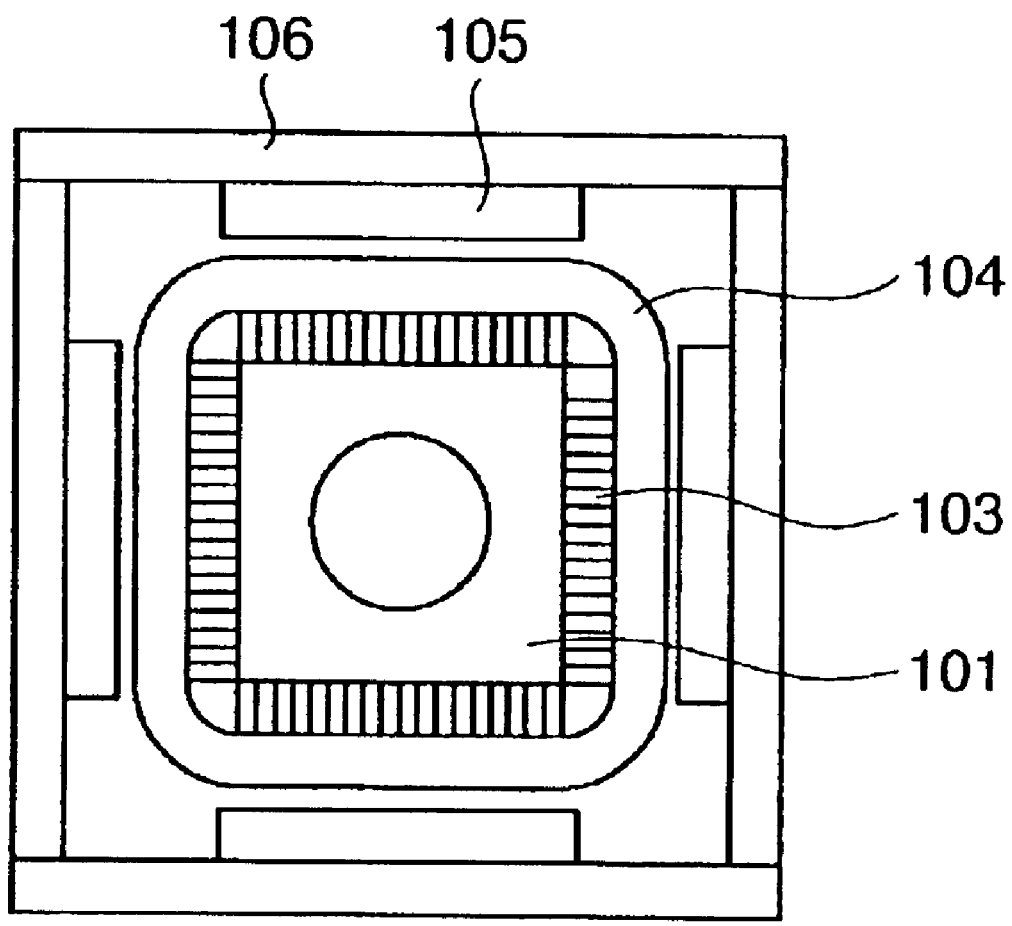
Figure 4:
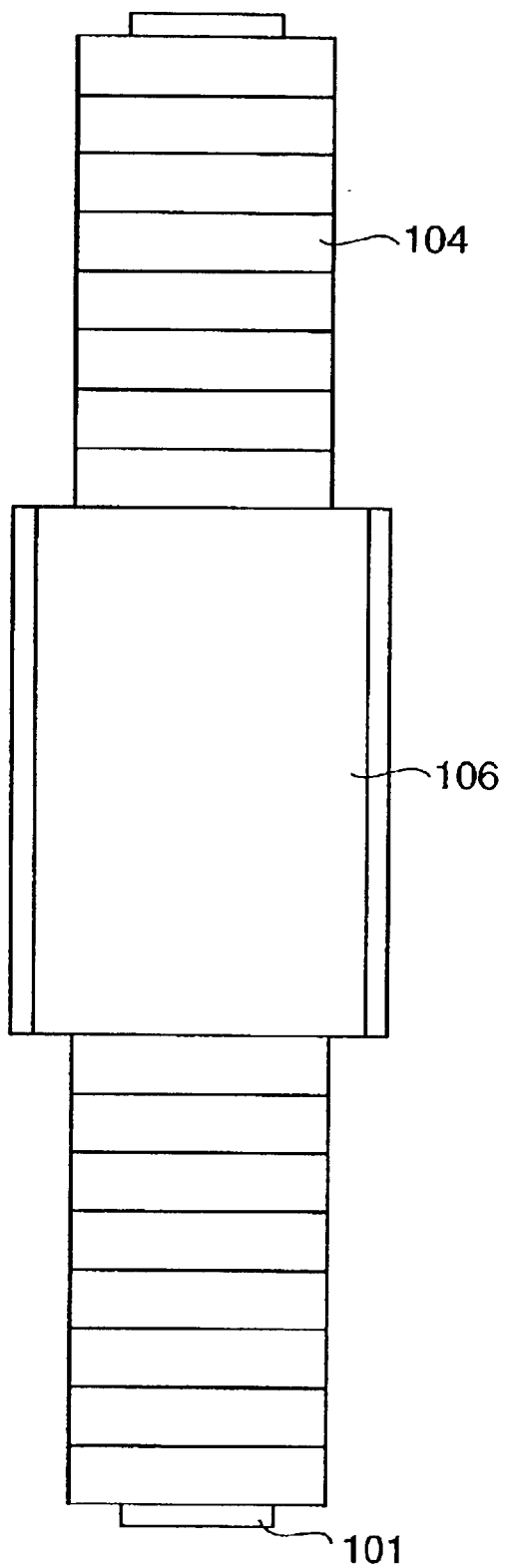

FIGS. 1 to 18 are views showing the structure of a linear motor according to the first embodiment of the present invention. FIG. 1 is a sectional view taken along the line of arrows A—A of FIG. 2, FIG. 2 is a sectional view of the linear motor taken along an axial direction (driving direction), FIG. 3 is a view (front view) of the linear motor seen from the axial direction, and FIG. 4 is a view (side view) of the linear motor seen from the side surface.

One characteristic feature of this embodiment resides in that a structure with a substantially polygonal section (more precisely, a square section) is employed in place of a cylindrical shape, as in the conventional example. More specifically, in the linear motor of this embodiment, magnet arrays 105 of a movable element (movable magnet arrays), back yokes 106 of the movable element, and a coil array 104 of a stator (stator coil array) are formed not in an annular shape but in a substantially polygonal shape (a square shape, to be more precise). This is the characteristic feature of this embodiment.

First, the stator is formed of a support member 101, a multilayered yoke (multilayered iron core) 103 serving as a stationary yoke, and the coil array 104. More specifically, the stator has the quadrangular prismatic support member 101 at its most center. The support member 101 serves as a base for supporting the quadrangular prismatic multilayered yoke 103 and coil array 104 on its outer surface, and has a flow channel 102 therein through which a refrigerant is to flow.

The flow channel 102 formed in the support member 101 has, e.g., a circular section, and is connected to a pipe (not shown) to form a refrigerant circulating path. This refrigerant is used for cooling the linear motor. Accordingly, the support member 101 is preferably made of a material with a good thermal conductivity.

Figure 5:
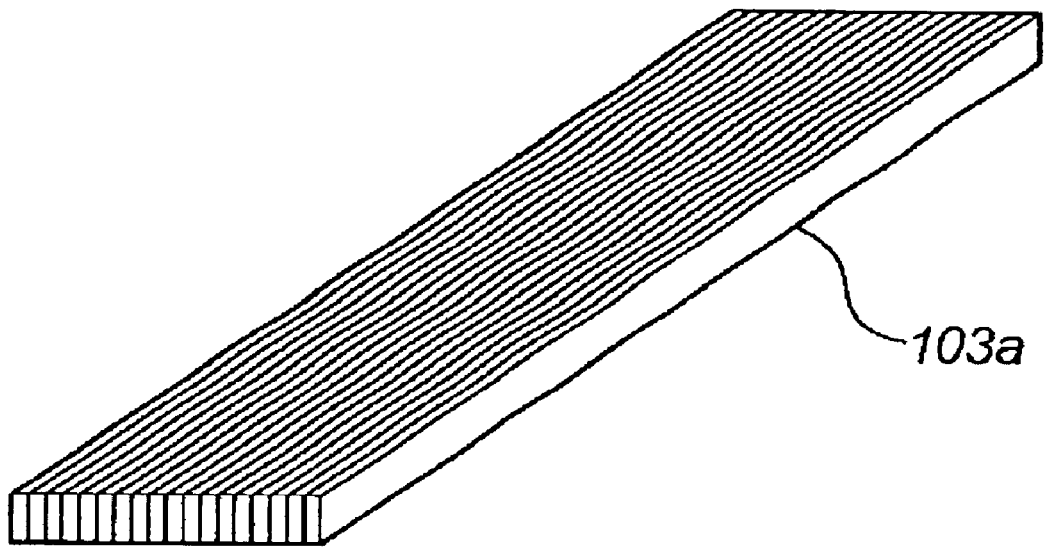

Four plate-like multilayered yoke members 103a each as shown in FIG. 5 are attached to the four outer surfaces of the quadrangular prismatic support member 101 such that they do not come into contact with each other. When the four plate-like multilayered yoke members 103a are supported by the support member 101 in an attempt to prevent them from coming into surface contact with each other, the ends of the respective multilayered yoke members 103a need not be machined at high precision. Conventionally, the cylindrical multilayered yoke is formed by combining the multilayered yoke members such that the surface at the end (end in the direction of the arc) of each multilayered yoke member comes into contact with the surface at the end of an adjacent multilayered yoke member. Therefore, the ends of the respective multilayered yoke members must be machined at high precision.

In this embodiment, the four plate-like multilayered yoke members 103a form the multilayered yoke 103 having a square section. Each multilayered yoke member 103a has a plate-like (flat) or rectangular parallelepiped shape obtained by stacking a plurality of rectangular (typically, with the same shape) magnetic thin plates having insulated surfaces, as shown in FIG. 5. In this manner, since the multilayered yoke members 103a that form the multilayered yoke 103 can be formed by merely stacking and bonding rectangular thin plates, they can be fabricated very easily. The multilayered yoke members 103a are attached to the outer surface of the square support member 101 such that a large number of thin plates which make up the multilayered yoke members 103a are perpendicular to the outer surface of the support member 101 and parallel to the driving axis. In other words, the respective stacked magnetic tin plates that form each multilayered yoke member 103a are arranged parallel to a surface defined by the position of the central magnetic thin plate and the central axis of the support member 101 or multilayered yoke 103. Thus, the magnetic fluxes generated by the magnet arrays 105 circulate along the insulating layers of the thin plates, so generation of an eddy current can be minimized.

The coil array 104 formed of a plurality of partial coils is formed further outside the four plate-like multilayered yoke members 103a, attached to the outer surface of the square support member 101, along the axis. The coil array 104 includes four flat portions, and has a substantially quadrilateral shape at its section taken along a direction perpendicular to the axis. Each of the winding start portion and winding end portion of the winding of each of the partial coils that form the coil array 104 is arranged near the boundary of a flat portion and another flat portion, i.e., at a corner of the coil array 104 having a substantially quadrilateral shape. This will be described later in detail.

Figure 6:
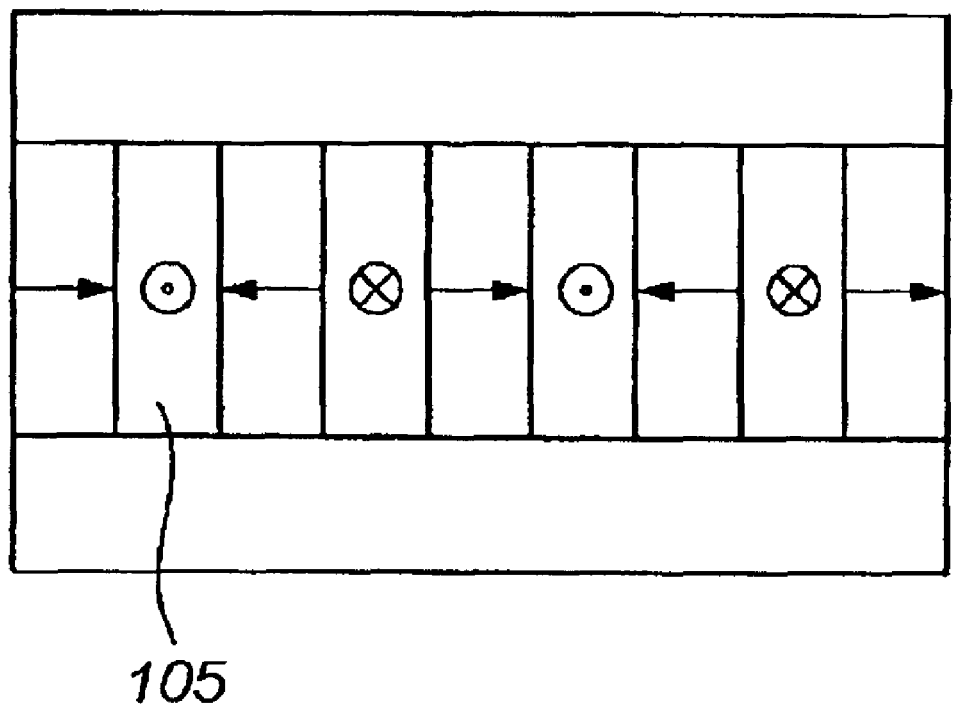

As shown in FIG. 6, the movable element is formed by combining four flat units each constituted by the magnet array 105, formed by arraying a plurality of magnets in a planar manner, and the flat back yoke 106 formed on the rear side of the magnet array 105, such that it has a square shape in its section taken along a direction perpendicular to the axis. In this embodiment, the directions of the poles of the plurality of magnets that form each flat magnet array 105 form a so-called Halbach layout, so that alternating fields are generated on the surfaces of the magnets. It is very easy to fabricate a structure in which the flat magnet array 105 is formed on the flat back yoke 106. Conventionally, the magnets must be aligned by inserting an annular member in a closed space, i.e., a cylinder. Regarding this, according to this embodiment, small flat magnets need only be arranged in an array on a large flat surface and be aligned. A space around the back yoke 106 can thus be freely used in the fabrication. Hence, a jig or the like for aligning the magnets at high precision can be utilized easily, so the magnets can be aligned at high precision. It is also very easy to fabricate a square movable element by combining four units each obtained by forming the flat magnet array 105 on the flat back yoke 106. Hence, the magnets can be aligned at high precision in the movable element as a whole. Consequently, variations in thrust caused by aligning errors of the magnets can be reduced.

A magnetic flux generated in and by each magnet array 105 formed in the movable element includes a component perpendicular to the surface of the magnet array 105 and a component parallel to this surface. These two components circulate through the plate-like multilayered yoke members 103*a* of the stator. The plurality of thin plates that form each multilayered yoke member 103*a* of the stator are arranged to be perpendicular to the surface (flat portion) of the corresponding magnet array 105. The magnetic flux perpendicular to the magnet surface formed by the magnet array 105 and the magnetic flux parallel to the magnet surface both enter the thin plates. As the thin plates are insulated from each other, the loop of the eddy current is limited within the thin surfaces of the thin plates. Therefore, occurrence of the eddy current can be minimized by a very simple arrangement that can be fabricated easily.

As described above, in place of the conventional cylindrical shape, the magnet arrays 105 and back yokes 106 form substantially square shapes obtained by combining flat shapes, and the coil arrays 104 form a substantially quadrilateral shape. Then, all the problems of the prior art, i.e., the arcuated multilayered iron core of the stator is difficult to fabricate, the eddy current is not suppressed sufficiently, the cylindrical yoke and annular magnets of the movable element are difficult to assemble, and the aligning precision of the annular magnets is accordingly degraded to promote variations in thrust, can be solved.

How to draw out a coil winding, which is the remaining problem, a countermeasure for preventing a decrease in thrust which is caused by the drawing of the coil winding, and the effect of the countermeasure will be described.

Figure 16:
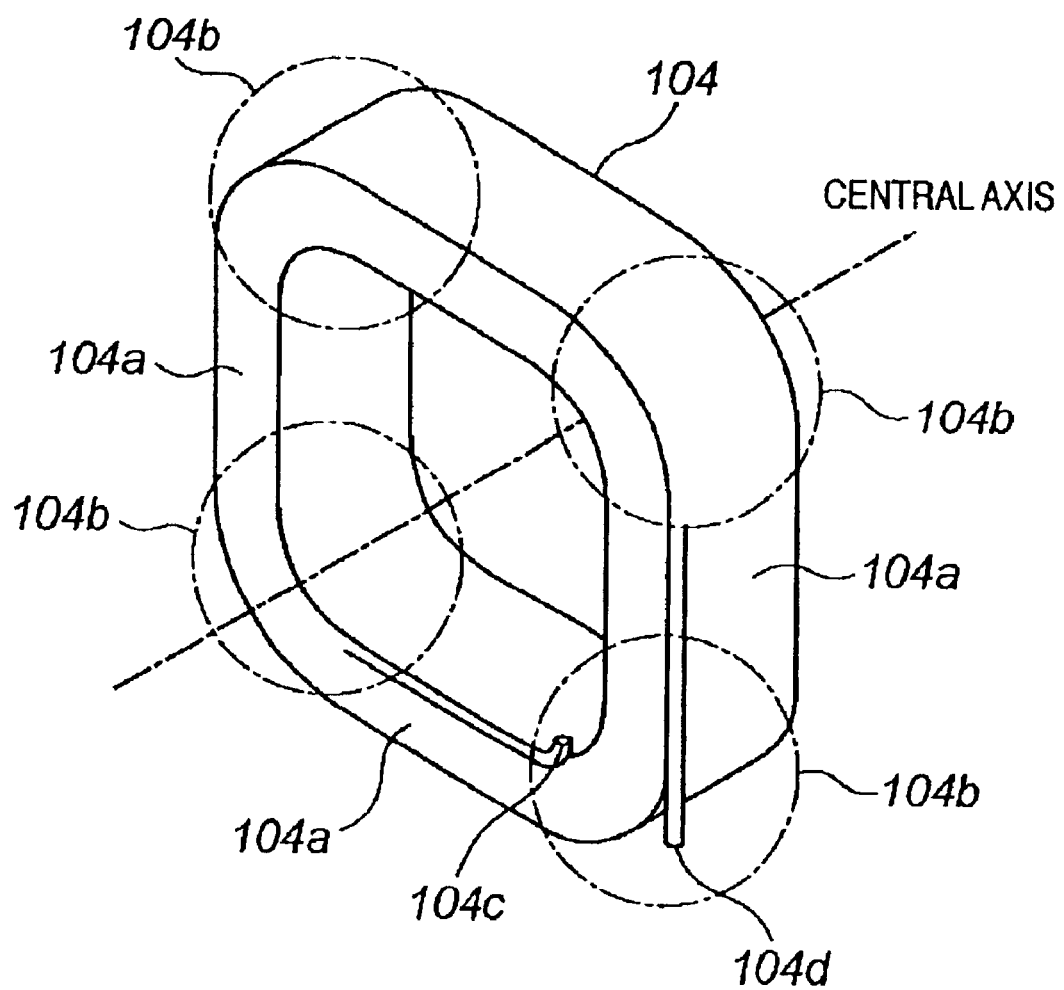
Figure 17:
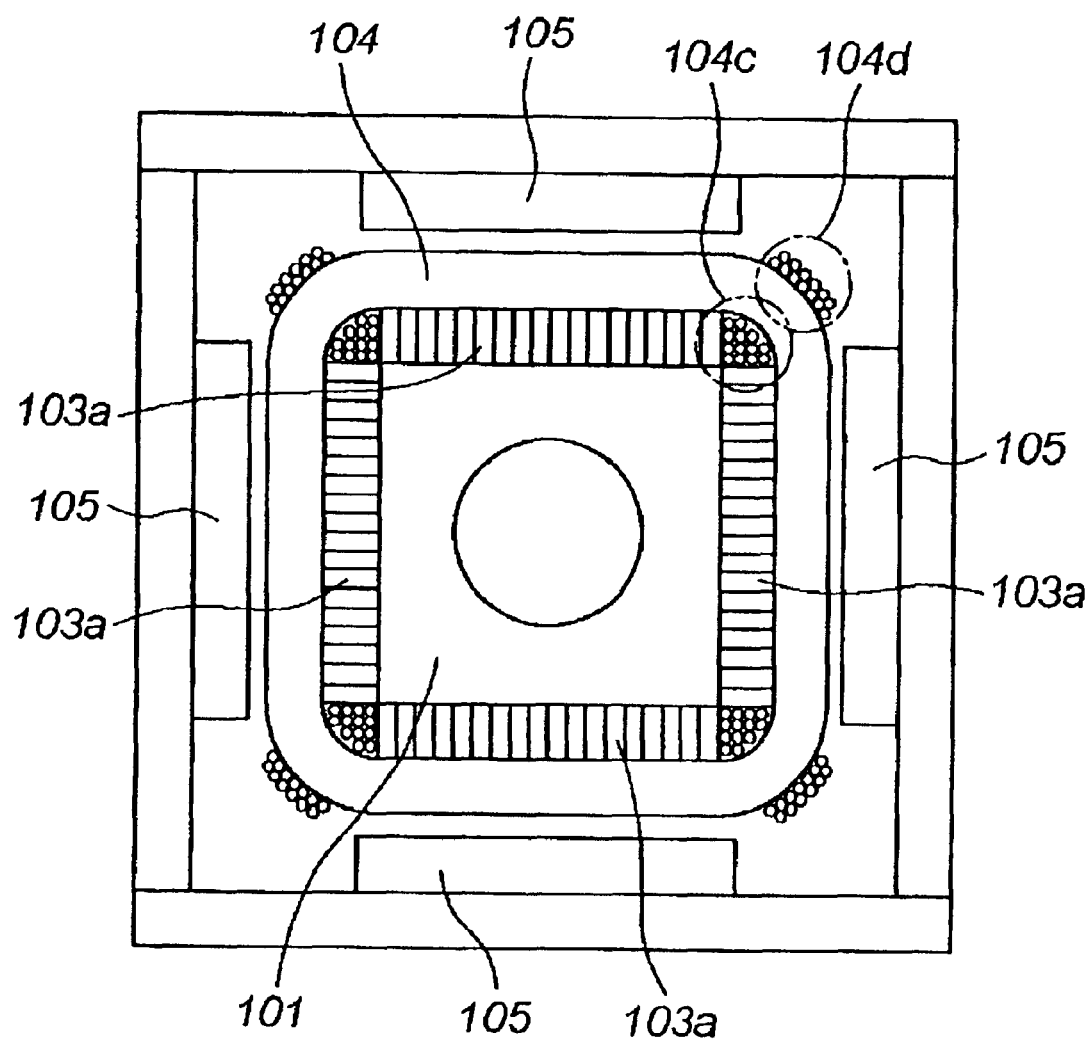

In this embodiment, as shown in FIG. 16, a winding start portion 104*c* and winding end portion 104*d* of the coil are arranged each at the corner (near the boundary of one flat portion 104*a* and another) of the substantially square coil array 104. The winding start portion 104*c* is always located on the inner surface of the coil array 104, and the winding end portion 104*d* thereof is always located on the outer surface of the coil array 104. The conductor wire may be drawn out from the vicinity of such corner of the coil array 104 along the axis. FIG. 17 shows this state. According to this embodiment, the winding start portion 104*c* and winding end portion 104*d* of the winding are arranged at the corners of the substantially square coil array 104, and the conductor wires are drawn out from there along the axis. Hence, the lead conductor wires are drawn out through near the corners of the substantially square coil array 104 in the axial direction to the end of the coil array 104 in the axial direction. As is apparent from FIG. 17, no magnet arrays 105 or multilayered yoke members 103*a* (multilayered iron core 103) are present at the corners of the substantially square coil array 104. Hence, when the lead conductor wires of the coil array 104 are extended through these spaces, they can be drawn out to the end of the coil array 104 in the axial direction without arranging them in the magnetic gap or partial cutting of the multilayered yoke members 103*a*, i.e., without accompanying any decrease in thrust at all. Namely, the four flat magnet arrays 105 are arranged to form a substantially square shape. The coil array 104 of the stator has a substantially square shape to match the shape formed by the coil array 104. The multilayered iron core 103 of the stator has a substantially square shape to match the shape of the coil array 104. Thus, spaces can be formed at the corners of the coil array 104 without accompanying a decrease in thrust. These spaces can be utilized as spaces where the lead conductor wires of the coil array 104 are to be extended.

Figure 18:
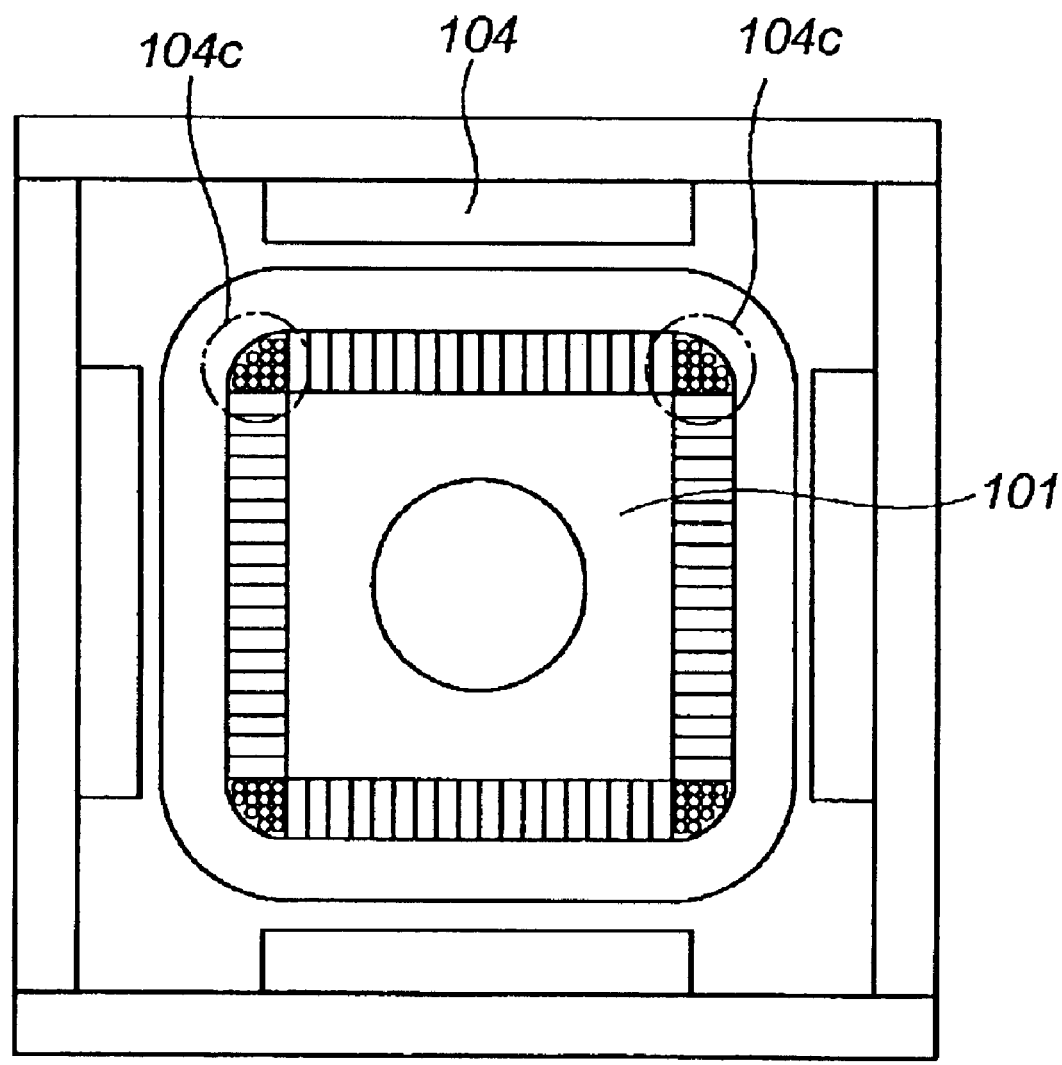

Alternatively, as shown in FIG. 18, all the windings can be drawn out from the inner surface of the coil array 104. In this case, the winding end portion located on the outer surface of the coil array 104 must be guided to the inner surface at the corner of the coil array 104. Contrary to FIG. 16, the winding start portion at the inner surface of the coil array 104 can be guided to the outer surface thereof, and all the windings can be drawn out from the outer surface thereof. Either method utilizes spaces (inner or outer surface) at the corners of the square coil array 104.

How to align the plurality of partial coils which form the coil array 104, and insulation between the coil array 104 and multilayered yoke 103 will be described. When the axial sizes of the respective partial coils that form the coil array 104 are not defined highly precisely, if the plurality of partial coils are merely fitted in a rod-like member formed of the support member 101 and multilayered yoke 103 (four plate-like multilayered yoke members 103*a*), size errors of the respective partial coils in the axial direction accumulate. Hence, the respective partial coils must be aligned. Insulation between the coil array 104 (partial coils) and multilayered iron core 103 (multilayered yoke members 103*a*) is also necessary.

Figure 9:
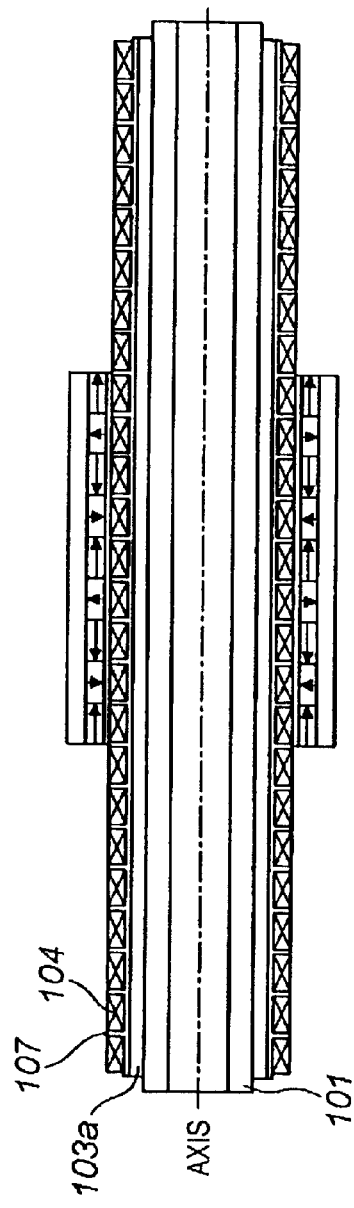
Figure 10:
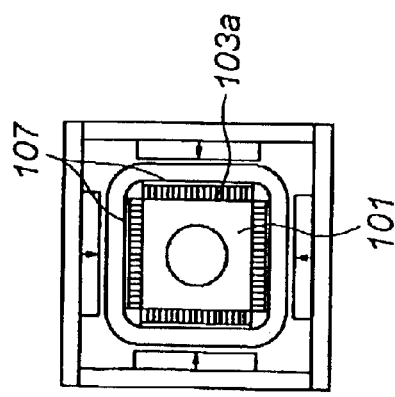
Figure 11:
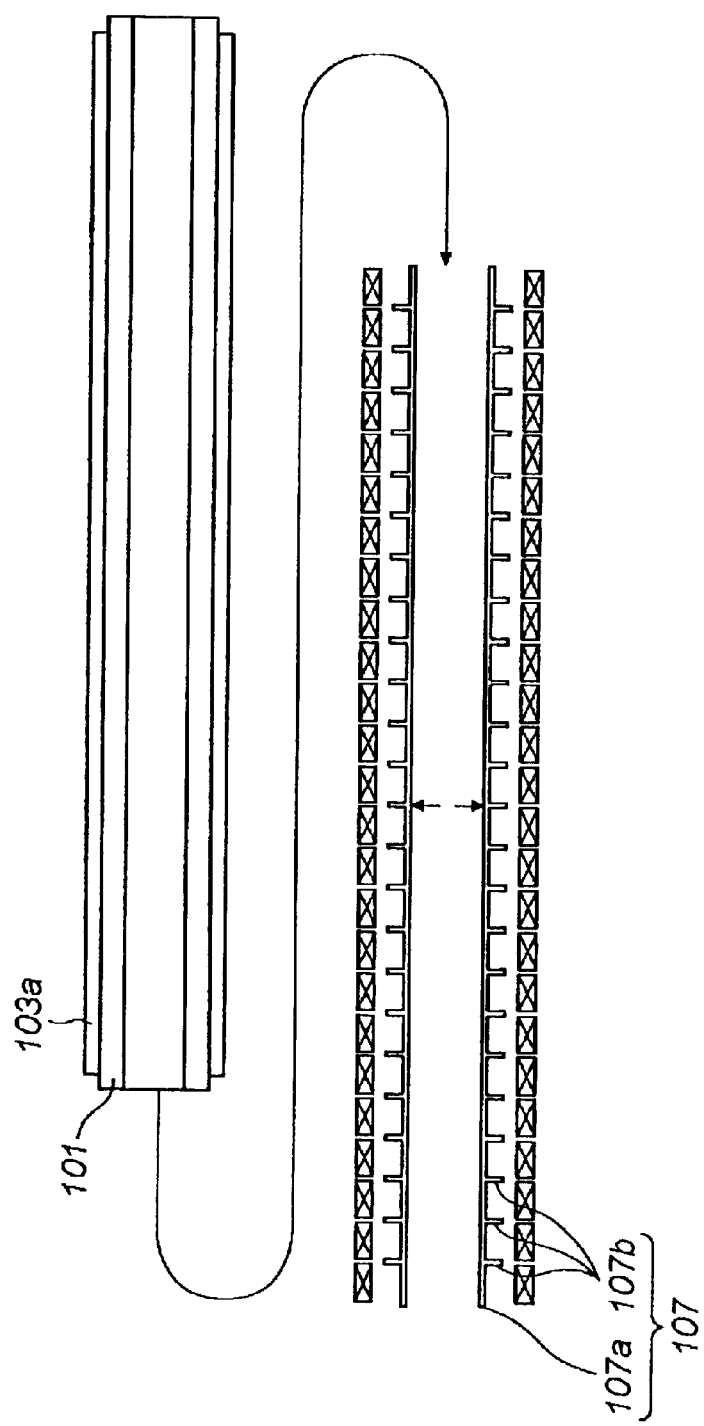
Figure 12:
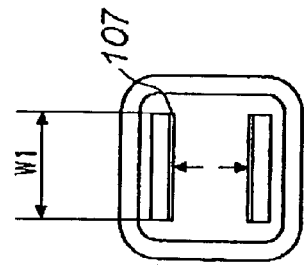

The first method of solving these issues is a method that uses aligning plates. FIGS. 9 to 12 show this method. FIGS. 9 and 10 show a state after the plurality of coils 104 are assembled by using aligning plates 107. FIG. 9 is a sectional view of the linear motor taken along the direction of the axis, and FIG. 10 is a sectional view of the linear motor taken along a plane perpendicular to the axis. FIGS. 11 and 12 show a method of fabricating the structure shown in FIGS. 9 and 10. Different from the structure shown in FIGS. 1 and 2, the structure shown in FIGS. 9 and 10 has the aligning plates 107 between the coil arrays 104 and the respective multilayered yoke members 103*a*. Each aligning plate 107 is a plate having a comb tooth-like section with a width w1 almost equal to that of the flat portion of the coil array 104 and extending in the axial direction. The partial coils are arranged among the comb teeth of the comb tooth-like shape. The aligning plate 107 is arranged between the multilayered yoke member 103*a* and the coil arrays 104. A total of four aligning plates 107 are used. Each aligning plate 107 has comb teeth 107*b* at high pitch precision. The coils 104 are aligned by the pitch precision of the comb teeth 107*b*. Hence, errors in the widths of the respective partial coils that form the coil array 104 will not accumulate to displace the respective partial coils. The aligning plate 107 is made of an insulating material. A base 107*a* of the aligning plate 107 insulates the respective partial coils of the coil array 104 and the plate-like multilayered yoke member 103*a* from each other, and the comb teeth 107*b* of the aligning plate 107 insulate the partial coils from each other. In this embodiment, since the four aligning plates 107 are arranged such that their ends in the widthwise direction are separated from each other, the spaces at the corners of the coil array 104 are left as they are on both the inner and outer surfaces of the coil array 104. Therefore, the aligning plates 107 do not interfere with the drawing-out operation of the windings of the coil array 104 in accordance with the above method.

An assembling procedure for the aligning plates 107 and coil array shown in FIGS. 11 and 12 will be described. First, the partial coils that form the coil array 104 are juxtaposed next to each other in the axial direction and are preliminarily roughly aligned. Subsequently, the two aligning plates 107 are inserted in the coil array 104 such that their bases 107*a* oppose each other. Two other aligning plates 107 (not shown) are inserted in the coil array 104 such that they intersect the previous two aligning plates 107 and that their bases 107*a* oppose each other. After that, the four aligning plates 107 are moved to the outside, and the partial coils are fitted among the comb teeth 107b. Finally, a rod-like member formed of the support member 101 and multilayered yoke 103 (four plate-like multilayered yoke members 103a) is inserted in the opening of the series of coil array 104, thus assembling the stator.

Figure 13:
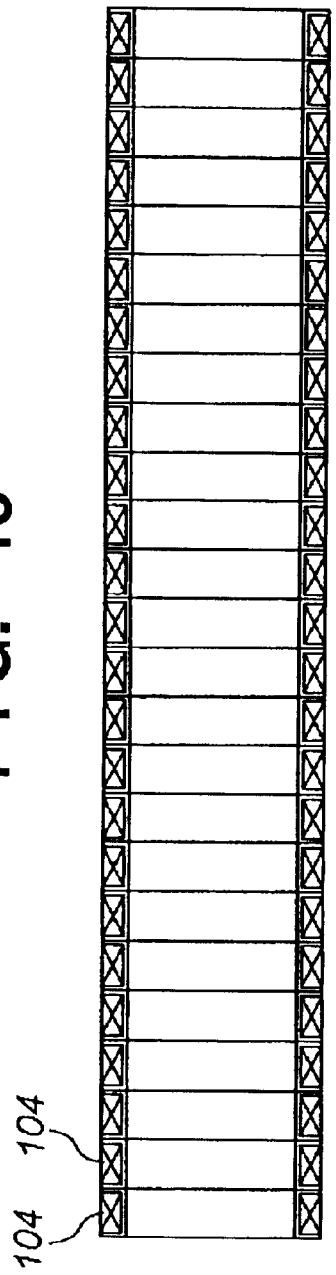
Figure 14:
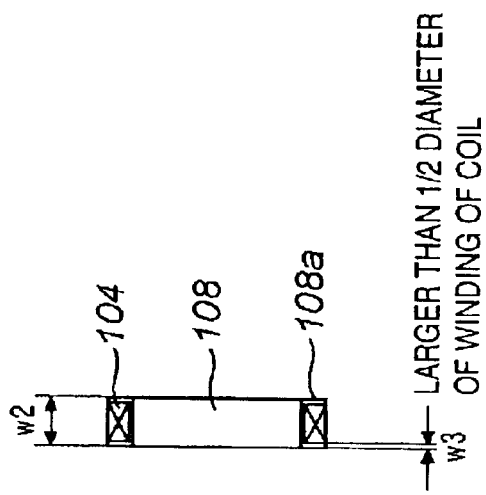
Figure 15:
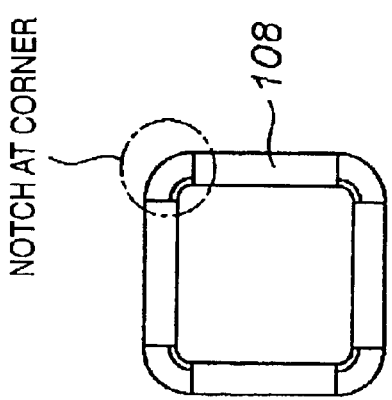

Another preferred aligning and insulating method uses coil bobbins. FIGS. 13 to 15 show this method. According to this method, bobbins 108 having high precision in the axial direction are prepared, and conductor wires are wound on them, thus fabricating the respective partial coils. The partial coils with bobbins are juxtaposed next to each other to form the coil array 104. A rod-like member formed of the support member 101 and multilayered yoke 103 (four plate-like multilayered yoke members 103a) is inserted in the coil array 104, thus assembling the stator. Although errors in width (lengths in the axial direction) of the bobbins accumulate, when errors in width of the respective bobbins are suppressed, the entire error accumulation amount can be reduced. The bobbins 108 are also made of an insulating material, and insulate the partial coils from each other, and the partial coils and the plate-like multilayered yoke members 103a from each other. Side plates formed on each bobbin 108 have notches at their corners. Because of this consideration, the conductor wires at the winding start portion and winding end portion of each partial coil of the coil array 104 can be extended near the corners along the axis. A thickness w3 of each side plate formed on the bobbin 108 is larger than ½ the diameter of the winding of the coil 104. This consideration is made in view of a case wherein a conductor wire connected to the winding start portion is to be drawn out to extend along the outer surface of the coil array 104 or a case wherein a conductor wire connected to the winding end portion is to be drawn out to extend along the inner surface of the coil array 104. More specifically, in these cases, the conductor wire must be extended across the side surface of the coil array 104 from the inner surface toward the outer surface, or vice versa. In order to assure a gap corresponding to one wiring between the partial coils, the side plate 108a of the coil bobbin 108 must have a thickness larger than ½ the diameter of the winding.

Figure 7:
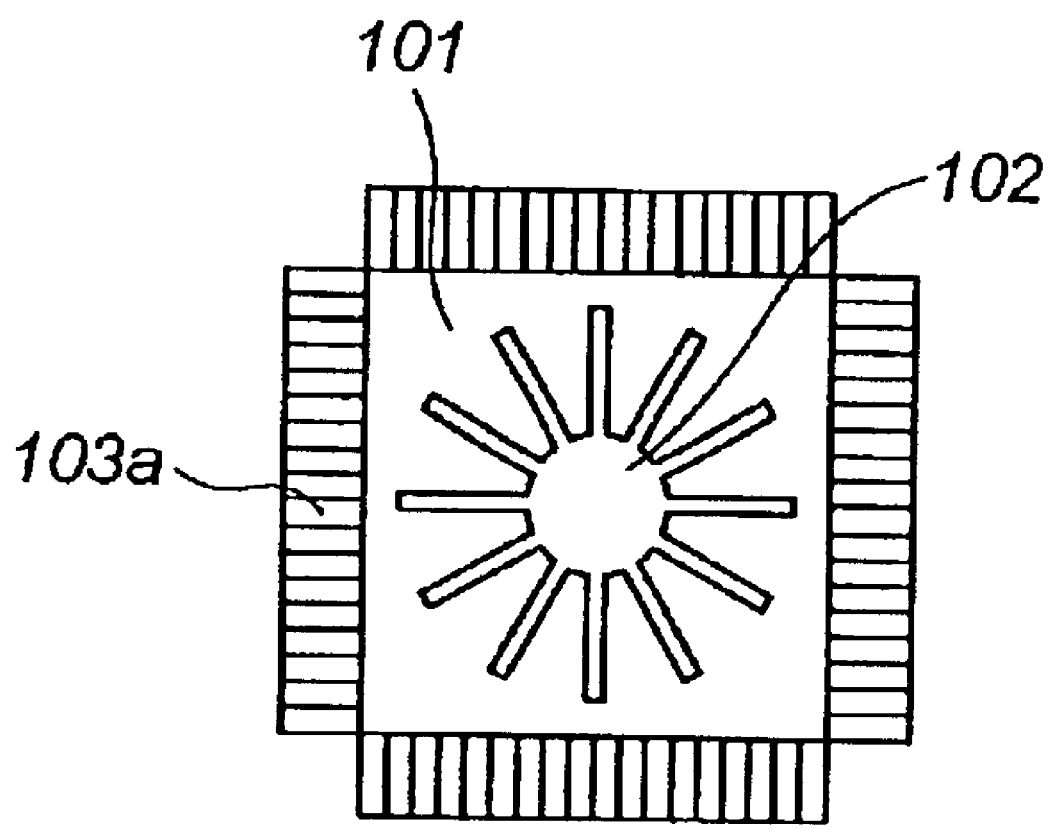
Figure 8:
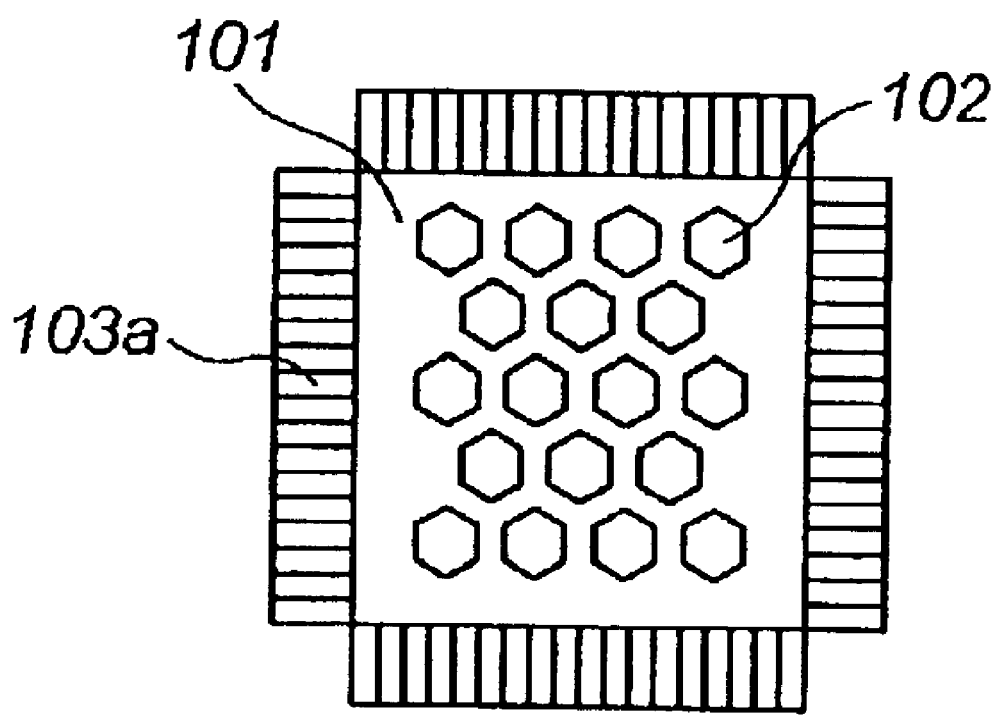

FIGS. 7 and 8 show modifications of the support member 101. A refrigerant circulating path is formed in the support member 101, and a refrigerant is circulated in it, thereby cooling the linear motor. Accordingly, the support member 101 is preferably made of a material with good thermal conduction, e.g., SiC or aluminum. Even when the support member 101 is made of a conductor such as aluminum, the magnetic flux of the magnets circulates in the multilayered yoke members 103a. Hence, the magnetic flux does not leak to the support member 101, and no eddy current is generated. When the support member 101 is fabricated from SiC, complicated machining is difficult to perform, so a simple flow channel 102 as shown in FIG. 1 is preferably formed in the support member 101. When the support member 101 is fabricated from aluminum, it can have a complicated sectional shape by means of, e.g., extrusion. Hence, a radial flow channel (flow channel having a plurality of grooves arranged radially about an axis as the center) as shown in FIG. 7, or a honeycombed flow channel as shown in FIG. 8 may be formed, so the heat transfer efficiency between the support member 101 and the refrigerant is improved easily. Although the material of the support member 101 and the shape of the flow channel 102 are not limited, the support member 101 preferably has an outer shape with a flat portion that matches the coil array 104 which is formed to include flat portions.

[Second Embodiment]

FIGS. 19A, 19B, 20A, and 20B are views showing the second embodiment of the present invention. In this embodiment, in addition to the arrangement of the first embodiment, a partition 110 is formed between magnet arrays 105 and a coil array 104. A refrigerant is circulated between the partition 110 and coil array 104 as well, so the cooling ability of the coil array 104 is improved. The partition 110 may have a square shape, as shown in FIGS. 19A and 19B, a cylindrical shape, as shown in FIGS. 20A and 20B, or any other shape. The partition 110 is made of an insulating material such as a ceramic material or resin.

[Third Embodiment]

Figure 21A:
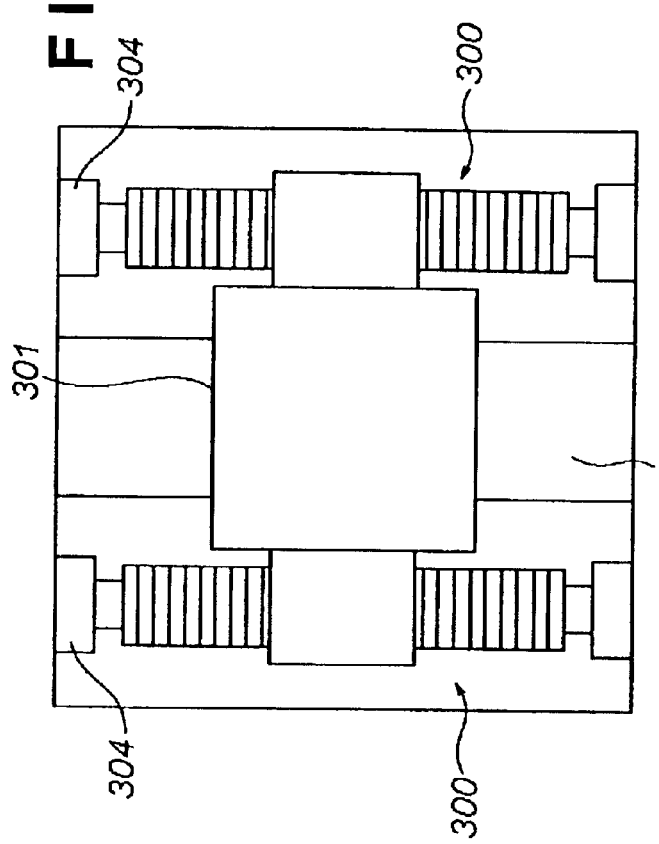
FIGS. 21A to 21C are views showing a uni-axial stage apparatus according to the third embodiment of the present invention.
Figure 21C:
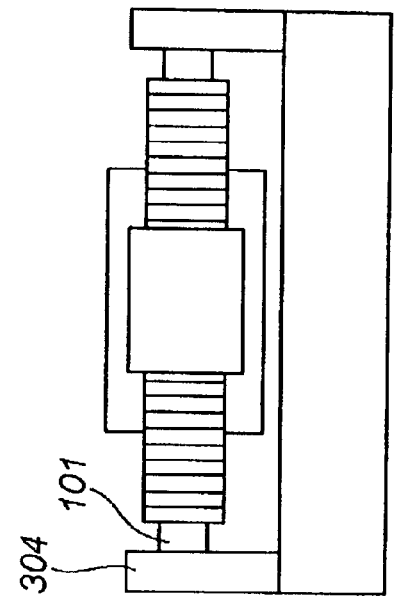
Figure 21B:
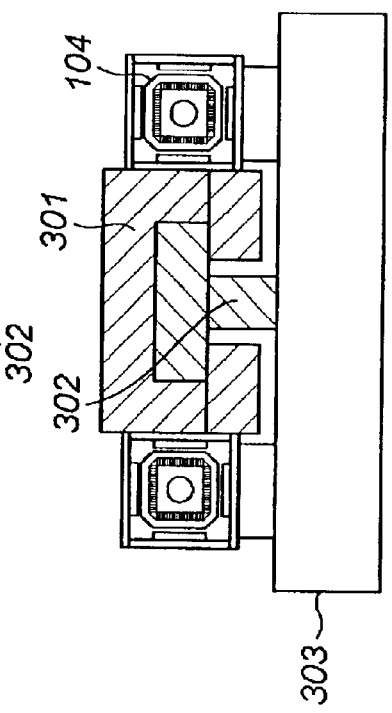

FIGS. 21A to 21C are views showing a uni-axial stage apparatus according to the third embodiment of the present invention. FIG. 21A is a plan view, FIG. 21B is a sectional view, and FIG. 21C is a side view. This uni-axial stage apparatus has a linear motor according to the first embodiment, which has a substantially square coil array 104.

A so-called T-shaped air slide 302 is fixed on a surface plate 303, and a stage 301 is supported to be slidable in a uni-axial direction along the T-shaped air slide 302. Linear motors 300 each having a substantially square coil array 104 according to the first embodiment are arranged on the two sides of the stage 301. The movable elements of the linear motors 300 are connected to the stage 301, and the stators thereof are fixed to the surface plate 303 through support columns 304 arranged at the front and rear ends of support members 101. A cooling medium circulates in the stators of the linear motors 300 through the support columns 304.

The stage apparatus of this embodiment is advantageous in that heat generated with the same thrust is smaller than that of a case using a conventional cylindrical linear motor. In this stage apparatus, as the interiors of the stators are cooled, heat generation by coils can be exhausted efficiently. This stage apparatus is also advantageous in the following respect. Namely, since the aligning precisions of the magnets and coils of the linear motors 300 are higher than in the conventional cylindrical linear motor, variations in thrust are small, and an error from a target, which occurs particularly when the linear motors are driven at a constant speed, can be decreased.

[Fourth Embodiment]

Figure 22A:
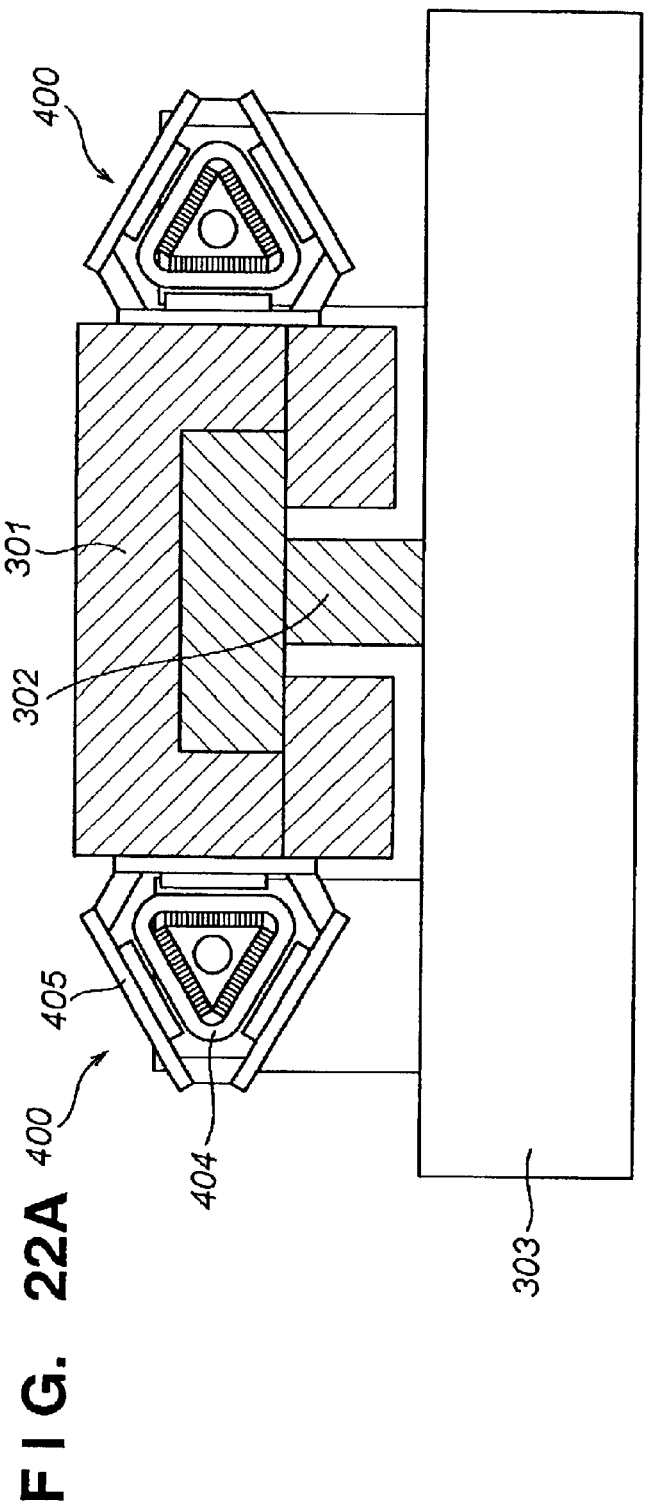
FIGS. 22A to 22C are views showing a linear motor according to the fourth embodiment of the present invention, and a stage apparatus utilizing it.
Figure 22C:
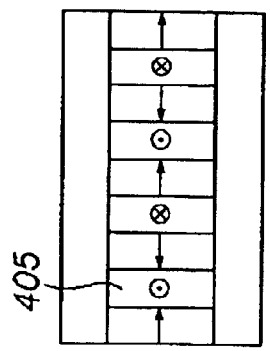
Figure 22B:
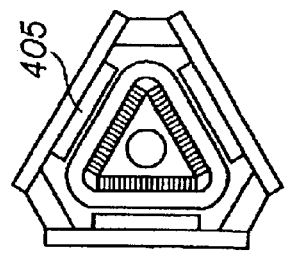

FIGS. 22B and 22C are views showing a linear motor according to the fourth embodiment of the present invention, and FIG. 22A is a view showing a stage apparatus utilizing this linear motor. In the first embodiment, the number of units of flat magnet arrays 105 that form the movable element is four, and the coil array 104 has a substantially square shape. In the fourth embodiment, the number of units of flat magnet arrays 405 is three, and each coil 404 has a substantially triangular shape. The characteristic feature of this structure resides in that its spaces at the corners of the coil, particularly the spaces on the outer surfaces of the corners of the coil, are larger than in the first embodiment. Therefore, the number of windings that can be drawn out is larger than that of the first embodiment. This increases the number of partial coils that can be arranged, so the stroke can be extended.

Except for a linear motor 400, the arrangement of the stage apparatus is the same as that of the third embodiment. When this linear motor 400 is applied to a stage apparatus, since the movable element has a substantially triangular section, the movable element has a higher rigidity than in the third embodiment, and the minimum-degree eigenfrequency increases.

[Fifth Embodiment]

FIGS. 23B and 23C are views showing a linear motor according to the fifth embodiment of the present invention and FIG. 23A is a view showing a stage apparatus utilizing this linear motor. In this embodiment, the number of units of flat magnet arrays 505 that form the movable element is two, and each coil 504 has a substantially elliptical shape. According to this embodiment, the spaces at the corners (ends) of the coil 504 become much larger than in the fourth embodiment, so a larger number of coils 504 than in the fourth embodiment can be arranged.

When this linear motor 500 is applied to a stage apparatus, the movable element has a higher rigidity than in the fourth embodiment, and the control performance is further improved.

[Sixth Embodiment]

Figure 24A:
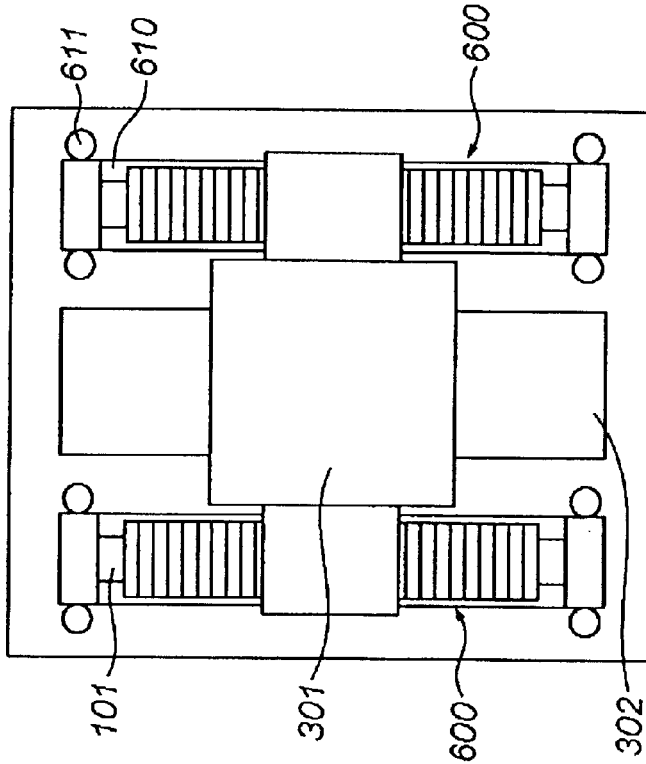
FIGS. 24A to 24C are views showing a linear motor according to the sixth embodiment of the present invention, and a stage apparatus utilizing it.
Figure 24C:
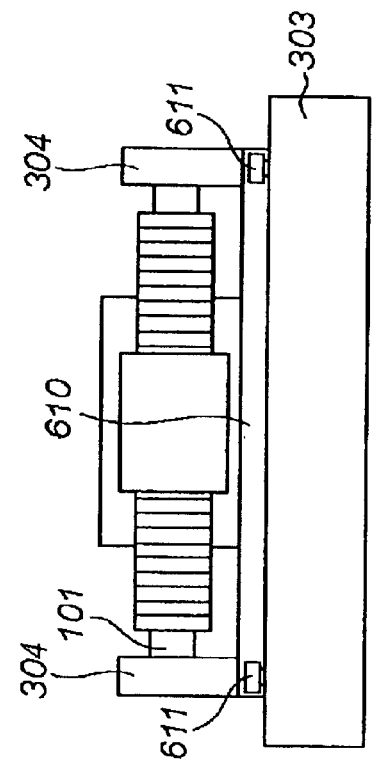
Figure 24B:
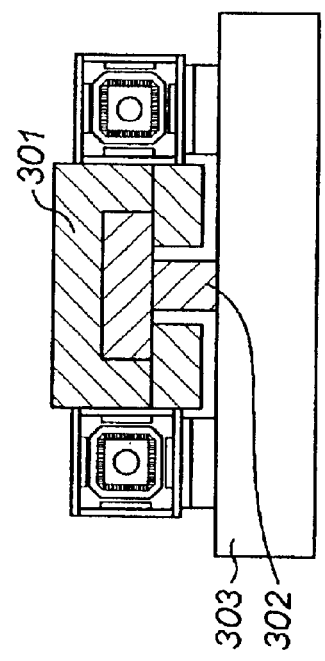

FIGS. 24A to 24C are views showing linear motors according to the sixth embodiment, and a stage apparatus utilizing them. FIG. 24A is a plan view, FIG. 24B is a sectional view, and FIG. 24C is a side view. In the third embodiment, the linear motor stators are fixed to the surface plate 303 through the support columns 304. In the sixth embodiment, linear motor stators on the right and left sides of a stage 301 are fixed to mass elements 610 through support columns 304. The mass elements 610 form an air slide (not shown) with respect to the surface plate 303, and are guided by rollers 611 provided on their side surfaces, so they are supported to be slidable in the uni-axial direction. When the stage 301 is accelerated by linear motors 600, a thrust for acceleration acts on the stage 301, and its reactive force acts on the linear motor stators. As the linear motor stators are fixed to the slidable mass elements 610, the stators and the mass elements 610 are integrally accelerated by the reactive force in a direction opposite to the stage 301. The linear motor stators and the mass elements 610 form a so-called passive counter, so no acceleration reactive force acts on the surface plate 303, or no change in barycenter occurs there. This arrangement is particularly effective when the surface plate 303 is supported by, e.g., a vibration damping table. While vibration from the floor is insulated by the vibration damping table, the posture of the surface plate is not changed during acceleration or stage movement. Hence, further improvement in precision can be achieved.

The rollers 611 may be mechanical ones as shown in FIGS. 24A and 24C. Alternatively, magnetic bearings or linear motors may be used to apply a force to the rollers 611 in a non-contact manner, so lateral movement and rotation of the rollers 611 are regulated.

[Seventh Embodiment]

FIGS. 25A to 25C are views showing linear motors according to the seventh embodiment of the present invention, and a stage apparatus utilizing them. FIG. 25A is a plan view, FIG. 25B is a sectional view, and FIG. 25C is a side view.

This embodiment provides an improvement over the sixth embodiment. In this embodiment as well, linear motors each with a substantially square section according to the first embodiment are applied to a uni-axial stage, and the stators of the linear motors are integrally coupled to uni-axially movable mass elements, thus realizing a passive counter. The arrangement inherent to this embodiment is as follows. Namely, mass elements 710 are arranged to surround the movable element and stator of a corresponding linear motor 700, and are connected to each other by end plates 711 provided at the front and rear ends. Flow channels 720 are formed in the mass elements 710 arranged to surround the movable element and stator. A refrigerant is circulated through the flow channels 720, thereby cooling the mass elements 710.

When the mass elements 710 are arranged to surround the movable element, the barycenter of the integral body of the stator and mass elements 710 can be set to almost coincide with the line in which the thrust of the corresponding linear motor 700 acts. Thus, when the integral body of the stator and mass elements 710 is accelerated by the reactive force in a direction opposite to a stage 301, the moment of the integral body to act on a surface plate 303 can be decreased to substantially zero. As a result, local deformation of the surface plate 303 near the slide surface between the integral body and the surface plate 303 can be prevented. Also, the length of the entire integral body in the axial direction can be decreased to be smaller than that of a case wherein the mass elements 710 are arranged in front of and behind the stator, rather than at the two ends of the stator.

When the movable element and accordingly the entire linear motor 700 are surrounded by the mass elements 710, and the flow channels 720 are formed in the mass elements 710 so the refrigerant circulates through the flow channels 720, the mass elements 710 can serve also as heat partitions. This can remove heat generation by the coils almost completely. This heat generation otherwise cannot be completely removed by the refrigerant provided in the stator. Most of the heat generated by the coils is transferred to the refrigerant in the support member 101 by heat conduction through a multilayered iron core 103 (plate-like multilayered yoke member 103*a*) and the support member 101. Heat is released to the air outside the coils as well. Then, the atmosphere outside the coils fluctuates. When the position of the stage 301 is controlled by, e.g., an interferometer, the measurement precision is degraded. In order to further recover the heat released to air outside the coils, the entire stator is surrounded by walls serving as the mass elements 710, and a refrigerant is set to flow in the walls, thereby cooling the interiors of the walls. As a result, most of the generated heat that cannot be completely removed by the refrigerant in the stator is absorbed by the walls formed of the mass elements 710, and is discharged to the outside by the refrigerant circulating in the walls.

The arrangement of the second embodiment also has a function of recovering heat that cannot be completely removed by the refrigerant in the support member of the stator. In the second embodiment, however, a partition is formed between the magnets and coils, and the refrigerant is circulated within the partition. Thus, the magnetic gap becomes large, and heat generated with the same thrust is increased. In terms of not increasing the magnetic gap, the partition may be preferably as thin as possible. As the internal pressure of the refrigerant acts on the partition, however, the thickness of the partition cannot be decreased very much. Particularly, when water is used as the refrigerant in place of oil, insulation between the coils and refrigerant must be assured. As the partition and magnets move relative to each other, if the partition is formed of a conductor, an eddy current is generated to cause further heat generation. Namely, in the second embodiment, the material of the partition is limited. It is easy to form a cylindrical partition from a metal but is difficult to form it from a ceramic material or resin. In the seventh embodiment, since nothing is formed between the magnets and coils, heat generation by coils with the same thrust does not increase. Also, insulation between the coils and refrigerant need not be considered. Consequently, safety and reliability of the coils improve.

As described above, when the method of forming a heat partition to surround the movable element and stator and supplying a refrigerant in the partition is compared with the method of forming a partition between the movable element and stator coils and supplying a refrigerant between the partition and stator coils, the former has excellent effects in that it can solve all the problems of (1) an increase in magnetic gap due to the partition and a refrigerant space, (2) insulation between the partition and stator coils, and (3) limitation on the material of the partition.

[Eighth Embodiment]

FIGS. 26, 27A, 27B, 28A, and 28B are views showing the arrangement of a bi-axial stage apparatus according to the eighth embodiment of the present invention. In this embodiment, a bi-axis stage is formed by using as the base the arrangement of the uni-axial stage apparatus according to the seventh embodiment.

The linear motor represented by the first embodiment is of a type which uses movable magnets and stator coils, and the space density of the coils is increased. Thus, the first embodiment is characteristic in that its stator is heavy. In the sixth and seventh embodiments, mass elements are further added to the stator, so the stator is heavier. When a bi-axial stage is to be formed by using the seventh embodiment as the base, if two uni-axial stages are merely overlaid, as a heavy linear motor is loaded in the upper stage, the mass of a structure conveyed by the lower stage increases considerably. In view of this, the arrangement of a so-called quartered square-shaped stage, with which the convey mass does not increase even when a linear motor with a heavy stator is used, is employed.

Figure 26:
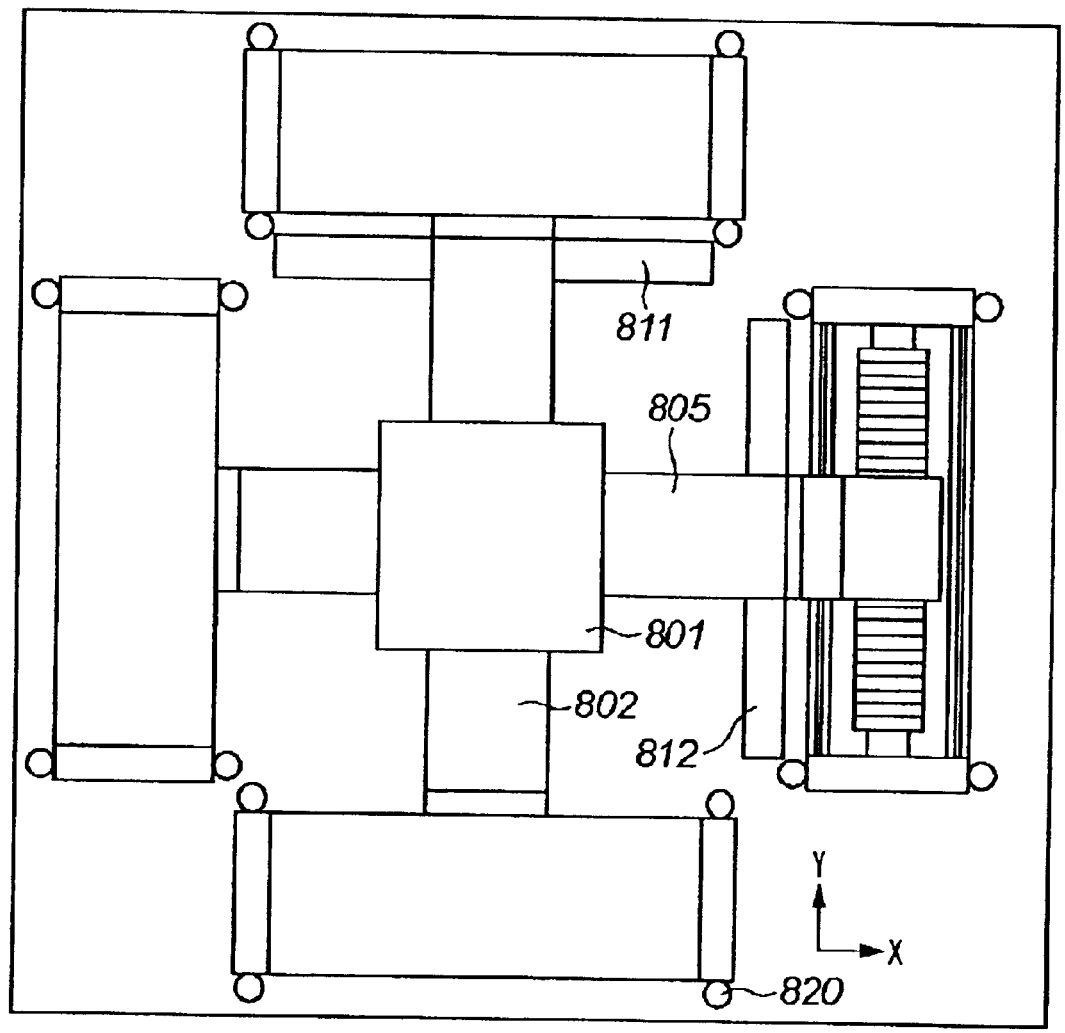
Figure 28B:
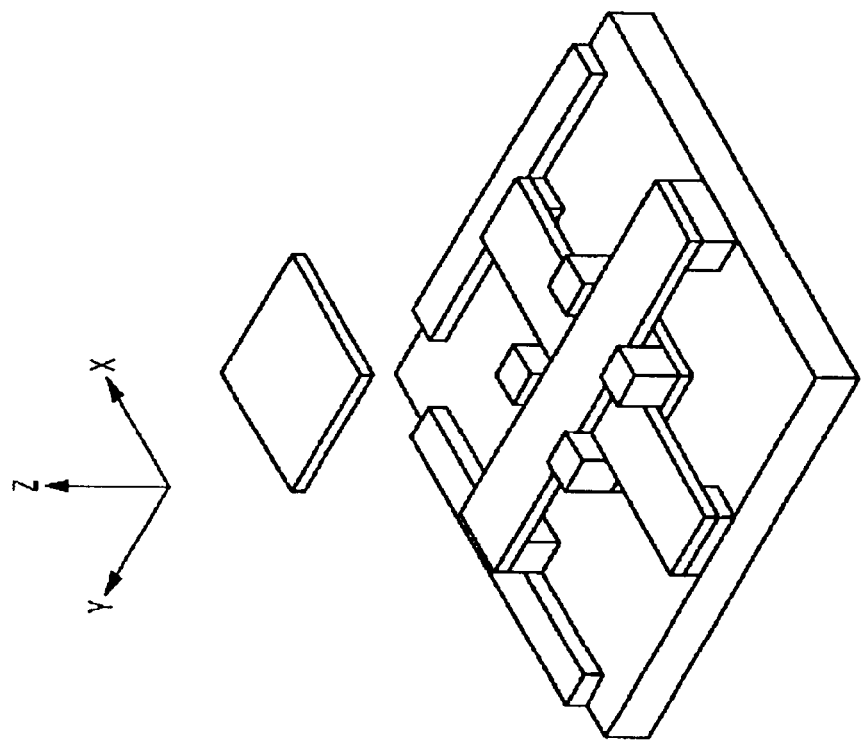
Figure 28A:
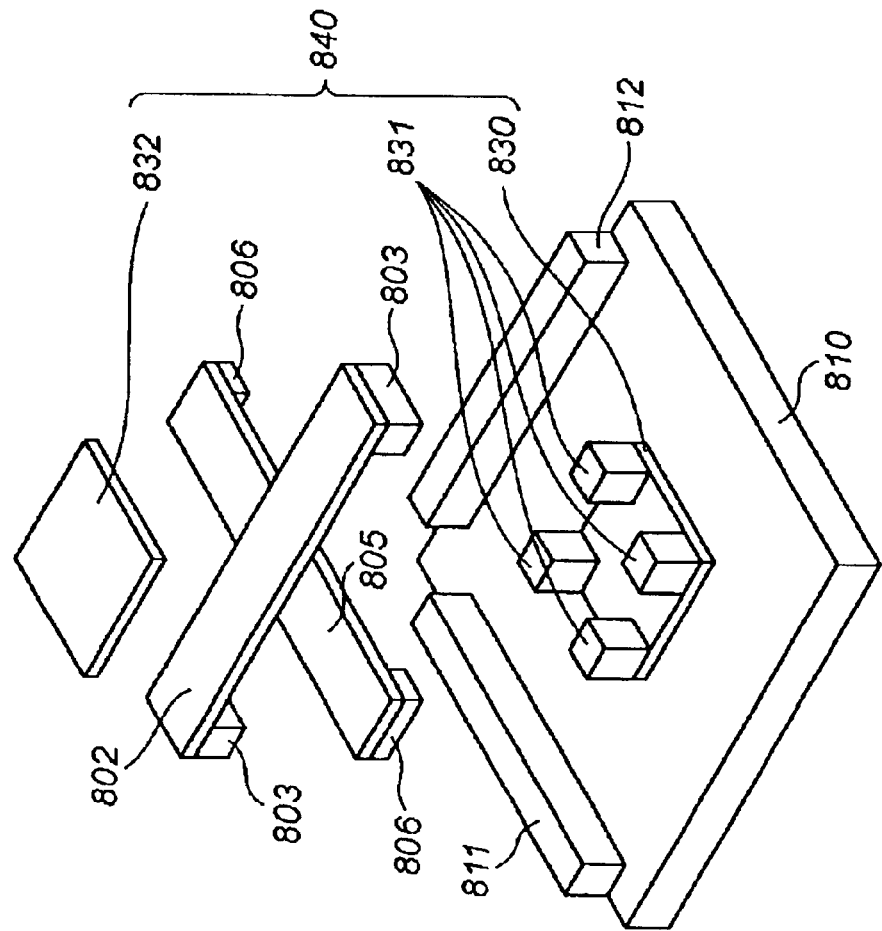

The basic arrangement of the stage is as follows. As shown in FIGS. 28A and 28B, an X beam 802 and Y beam 805 respectively guided by an X yaw guide 811 and Y yaw guide 812 are formed on a surface plate 810, and a stage 801 which is slidably guided alternately by the X beam 802 and Y beam 805 through an air slide is arranged at the intersection of the X beam 802 and Y beam 805. This stage is combined with the linear motor according to the seventh embodiment shown in the seventh embodiment, and a passive counter with a cooling function. FIG. 26 is a plan view, and FIGS. 27A and 28B are front views. Since the X beam 802 is arranged above the Y beam 805, a linear motor stator for driving the X beam 802 is supported through a bulking plate to be slidable with respect to the surface plate 810. Regarding a linear motor stator for driving the Y beam 805, a stator and mass elements themselves arranged to surround it are supported to be slidable with respect to the surface plate 810, in the same manner as in the seventh embodiment.

The basic function and effect of this embodiment are similar to those of the seventh embodiment. As the heavy linear motor stator is not conveyed, both the X and Y driving systems have the same convey mass. Hence, linear motors having the same specification can be used as the X and Y driving systems. A heat source can be arranged away from the stage. Since the stage has a quartered square-type arrangement, a passive counter can be formed two-dimensionally. These are the characteristic features of this embodiment.

[Ninth Embodiment]

Figure 29A:
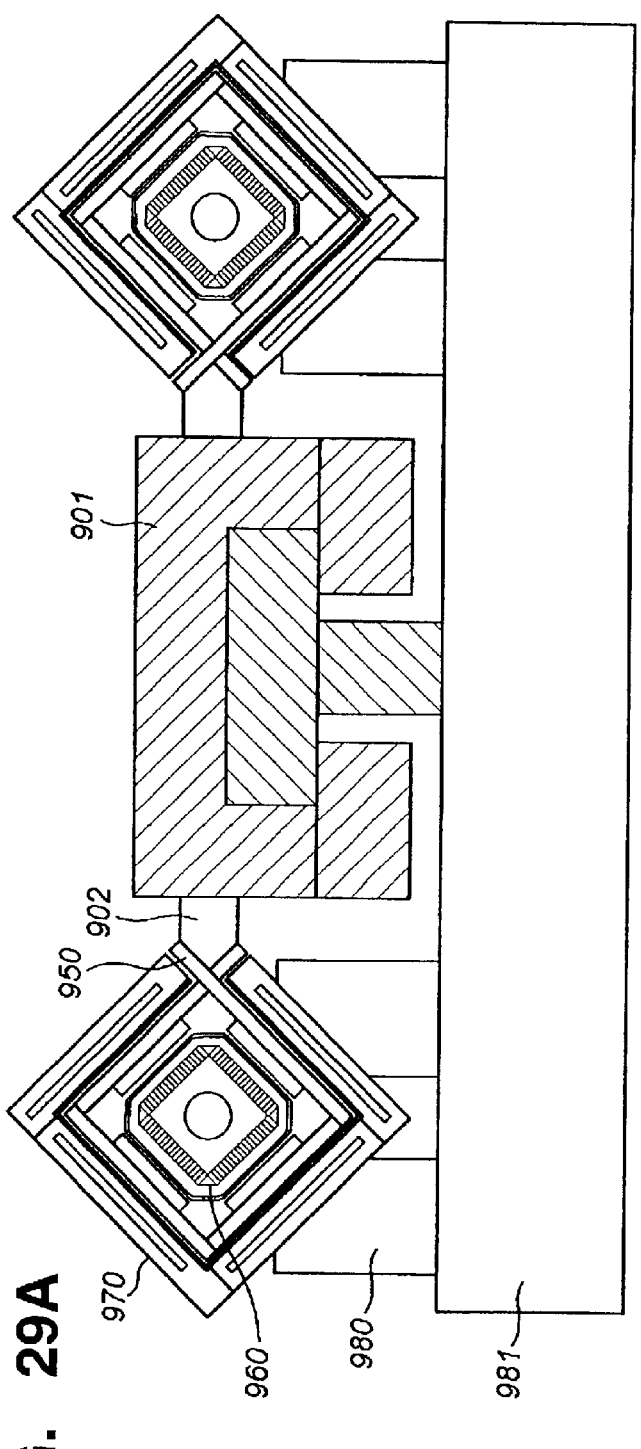
FIGS. 29A to 29C are views showing a stage apparatus according to the ninth embodiment of the present invention.
Figure 29C:
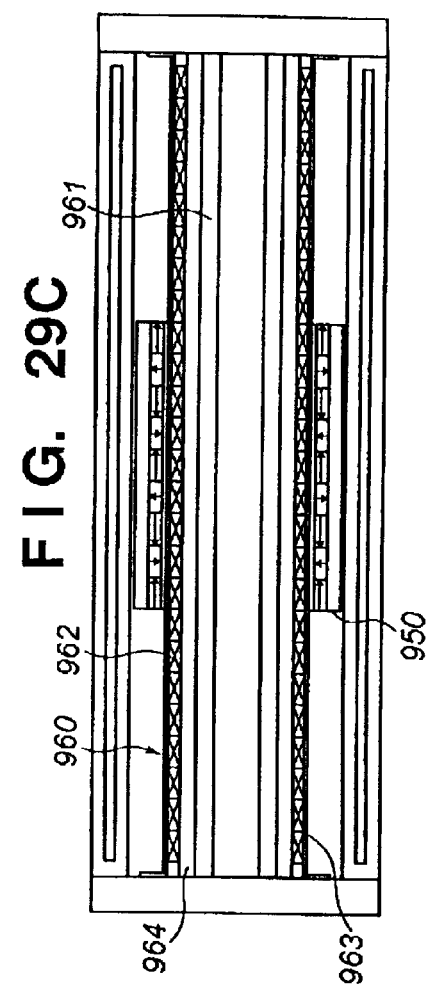
Figure 29B:
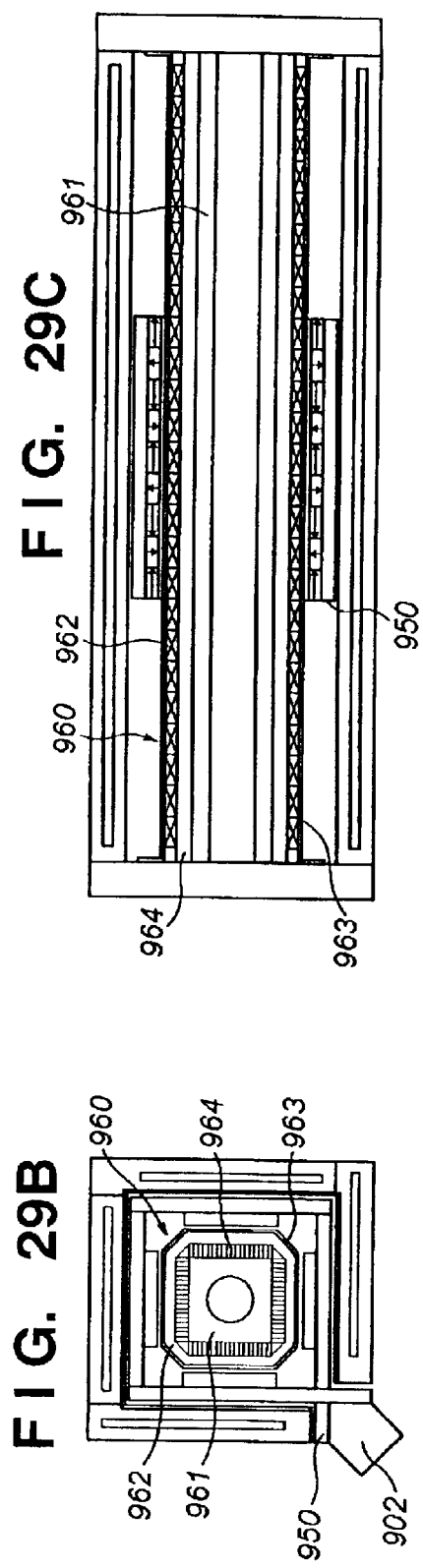

FIG. 29A is a view showing a stage apparatus according to the ninth embodiment of the present invention. FIGS. 29B and 29C are views showing linear motors mounted on this stage. This embodiment is obtained by improving the seventh embodiment so it is particularly suitable for use in a vacuum.

The basic arrangement of this embodiment is almost the same as that of the seventh embodiment. A connecting portion 902 between a movable element 950 of each linear motor and a stage 901 is formed at the corner of the substantially square movable element 950, and several processes against vacuum are performed. These are the characteristic features of this embodiment. The connecting portion 902 between each movable element 950 and the stage 901 is formed at the corner of the movable element 950, in order to further improve the ability of recovering heat that cannot be completely removed by a refrigerant circulating in a support member 961 of a stator 960, as in the seventh embodiment. In the seventh embodiment, the connecting portion between each movable element and the stator is formed at almost the center of one side of the square movable element. Since the heat partition for surrounding the movable element and stator cannot accordingly be formed at this connecting portion, the heat partition is cut at the center of one side of the substantially square movable element, as shown in FIG. 29B. The side (surface) of the movable element is a portion that faces the side (surface) of a coil, and thus heat is transferred to it easily. According to the geometrical arrangement of this stage arrangement, heat generated by the coils can be easily transferred to the sides (surfaces) of the movable element by conduction if the stage apparatus is used in an atmosphere, and by radiation if the stage apparatus is used in vacuum. Namely, heat can be easily transferred when the stage apparatus is used in either environment of atmosphere or vacuum. Hence, as shown in FIG. 29C, the connecting portion 902 between each movable element 950 and the stage 901 is preferably formed at the corner of the movable element 950. The heat partition serving as mass elements as well can face the sides (flat portions) of the coils almost completely, so the heat exhaust performance is improved.

The above description applies to the use in the atmosphere as well.

Several processes against vacuum will be described. In this embodiment, a thin cover 963 is arranged outside coils 962. This aims at preventing gas release from the coils 962 and a multilayered yoke 964 inside the cover 963. The coils 962 and multilayered yoke 964 use a resin that holds their shapes. It is known that if such coils 962 and multilayered yoke 964 are directly brought into vacuum, the vacuum degree is decreased. To transfer heat generated by the coils 962 to the support member 961 and the refrigerant in it through the multilayered yoke 964, sometimes small gaps are intentionally formed between the coil 962 and multilayered yoke 964 and between the multilayered yoke 964 and support member 961, so no vacuum portion will be formed there, and a conductive material such as a resin with a good thermal conductivity may be filled in these gaps. Gas release from the conductive material in these gaps also poses a problem. When the thin cover 963 is formed outside the coil 962, a member that cannot be usually brought into vacuum, e.g., coils or yoke using a resin, can be used in vacuum.

For example, the surface of the movable element 950 is preferably Ni or chromium-plated, or a reflection member such as an aluminum foil is preferably adhered to it, so the movable element 950 will not absorb heat by radiation easily. This reflection process is preferably performed for all portions that face the coils 962. In other words, this reflection process should be performed for all the inner surface of the movable element 950. The inner surfaces of mass elements 970 formed to surround the movable element 950 and stator 960 are preferably processed with black anodized aluminum, or absorbing members such as black plates are preferably adhered to them. This helps heat radiated from the coils 962 to be absorbed easily. The mass elements 970 are supported on a surface plate 981 with V guides 980.

[Tenth Embodiment]

Figure 30:
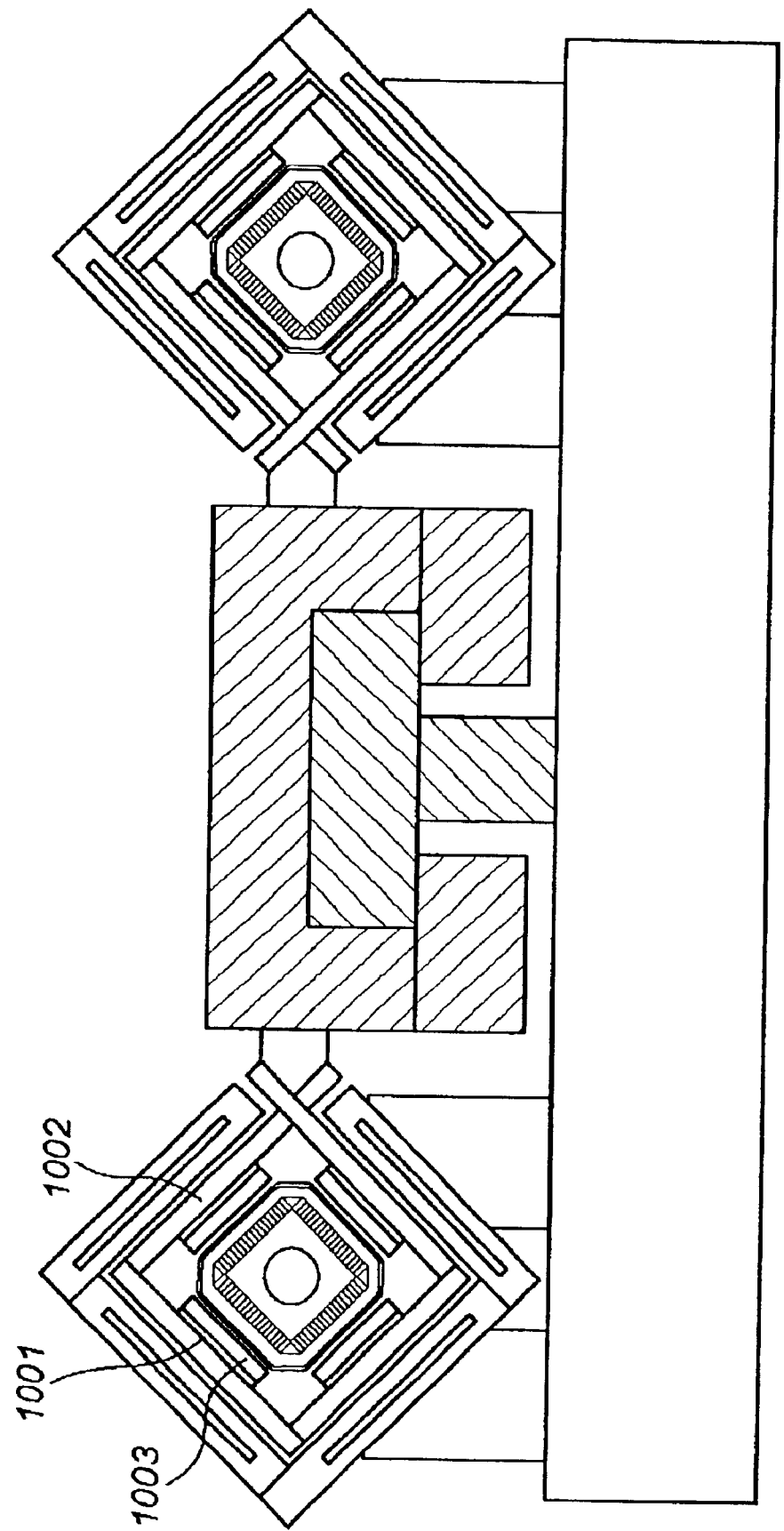
FIG. 30 is a view showing a stage apparatus according to the tenth embodiment of the present invention.

FIG. 30 is a view showing a stage apparatus according to the tenth embodiment of the present invention. In this embodiment, the ninth embodiment is improved to increase the rigidity of the attaching portions.

In the ninth embodiment, the heat exhaust ability by the mass elements 970 is considered important, and accordingly the connecting portion 902 between each movable portion 950 and the stage 901 is formed at the corner of the movable element 950. According to this arrangement, the rigidity at the corner generally tends to decrease, so the upper limit of the servo gain obtained when a positional servo is applied to the stage 901 tends to be limited. Hence, in the tenth embodiment, in order to increase the rigidity of the movable element as a whole and accordingly to increase the rigidity of the servo stage as a whole, the frame member of the movable element is formed of a high-rigidity material, e.g., a ceramic material, other than a yoke material.

In the first to ninth embodiments, the back yoke formed on the rear surface of the flat magnet array has both the function of circulating the magnetic flux of the magnet array and the function of forming the structure of the movable element. If the magnet array has a Halbach layout, the back yoke may be thin. However, to maintain the rigidity of the structure, the back yoke must be thick. In view of this, the function of magnetic flux circulation and the function of the structure are separated, and a material with a higher rigidity than that of iron is employed to form the structure, so the rigidity of the movable element with the same thickness can be increased.

In this embodiment, a necessary minimum back yoke 1001 for circulating the magnetic flux is formed on the rear side of a magnet array 1003. The magnet array 1003 and the thin back yoke 1001 are supported by a ceramic plate 1002. Four sets each having this structure are combined to form a movable element. As a result, the rigidity of the movable element is increased, and accordingly the servo performance of the stage is improved.

[Eleventh Embodiment]

Figure 31:
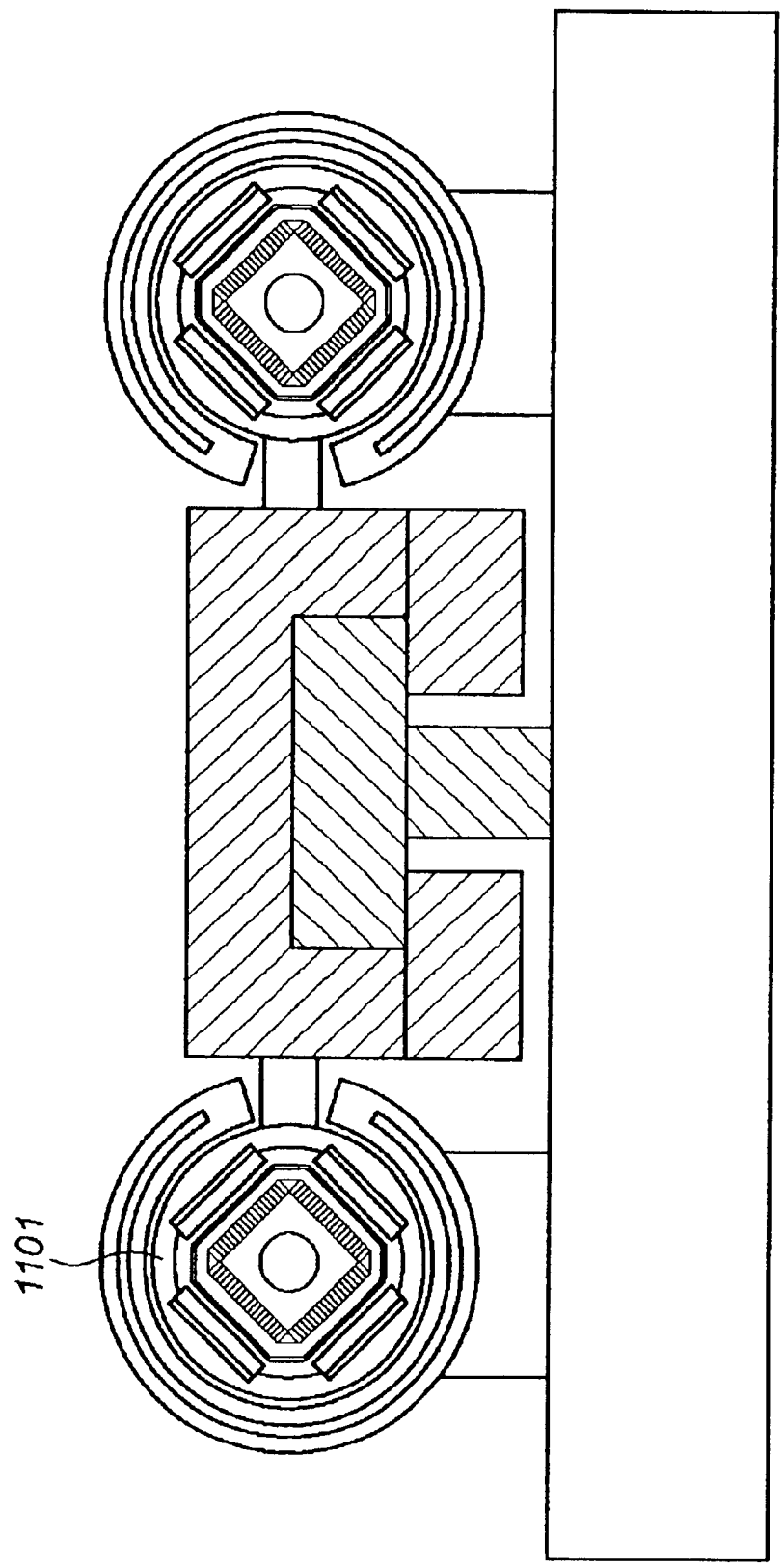
FIG. 31 is a view showing a stage apparatus according to the eleventh embodiment of the present invention.

FIG. 31 is a view showing a stage apparatus according to the eleventh embodiment of the present invention. This embodiment provides a modification of the tenth embodiment.

When the idea of separating the function of magnetic flux circulation and the function of the structure, which is indicated in the tenth embodiment, is further developed, the structure is not necessarily formed of flat surfaces. One aspect of the present invention is to form the magnet arrays of the movable element and the multilayered iron core of the stator to have substantially rectangular parallelepiped shapes or substantially flat shapes. As far as this aim is realized, the movable element can have any shape. In the first to ninth embodiments, as the back yoke serves as the structure as well, the shape of the structure is influenced by the shape of the magnet array. As in the tenth embodiment, however, when the function of magnetic flux circulation and the function of the structure are separated, the degree of freedom of the shape of the structure increases. Therefore, an annular ceramic member 1101 can be used as the structure of the movable element, as in this embodiment. According to this embodiment, since the structure of the movable element has an annular shape, the rigidity of the movable element is increased more than in the tenth embodiment.

[Twelfth Embodiment]

Figure 37:
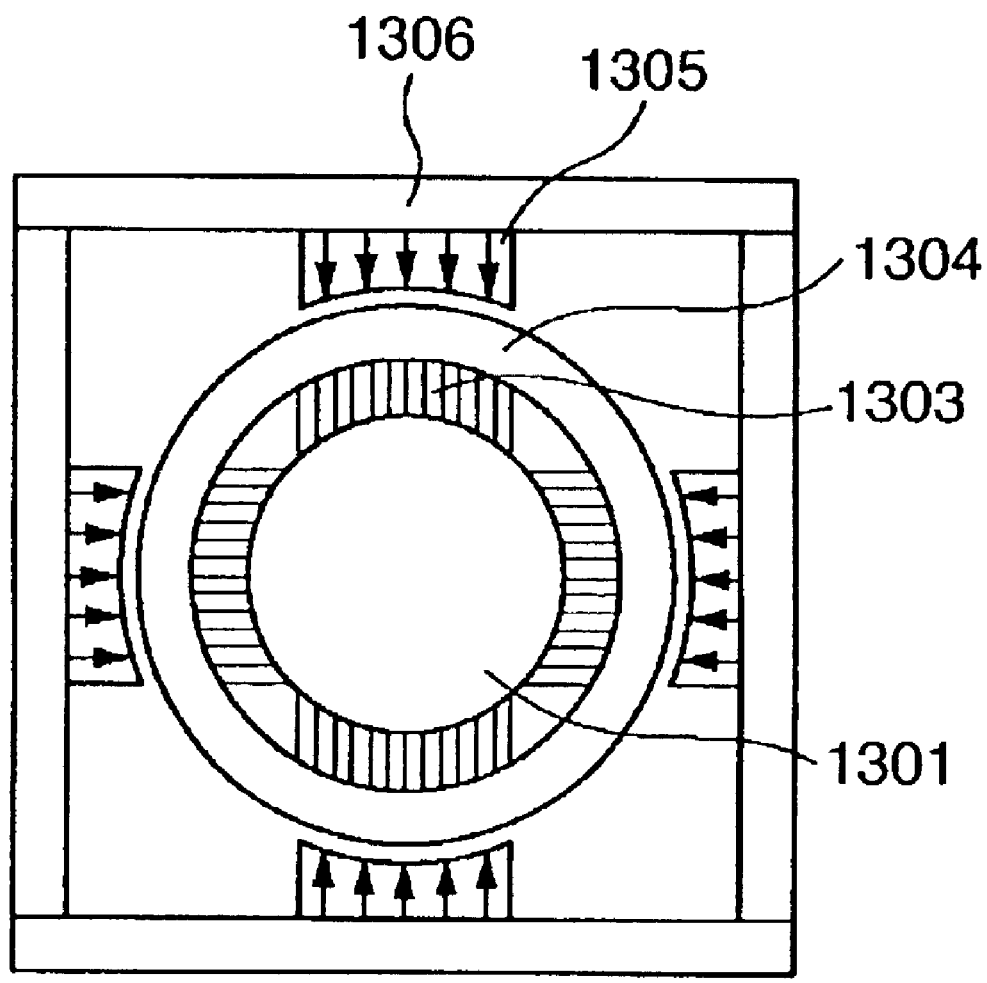
FIGS. 37 to 43 are views showing the arrangement of a linear motor according to the twelfth embodiment of the present invention.
Figure 38:
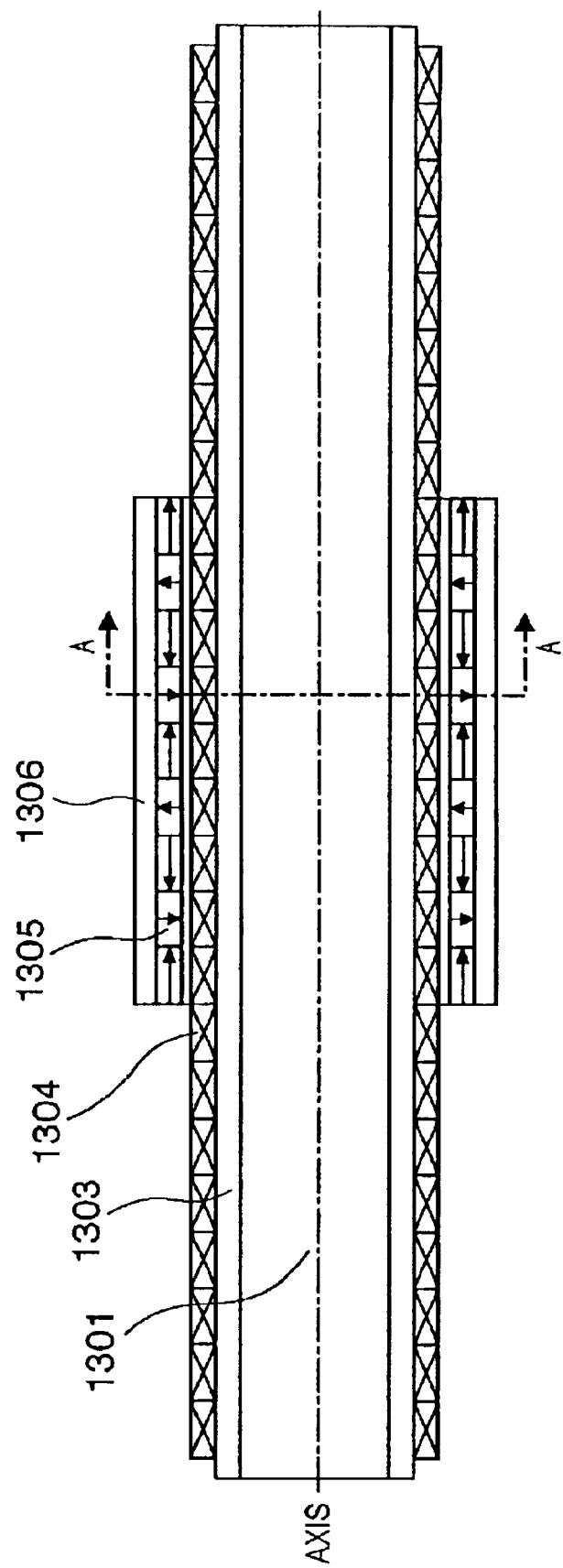

FIGS. 37 to 43 are views showing the arrangement of a linear motor according to the twelfth embodiment of the present invention. FIG. 37 is a sectional view taken along the line of arrows A—A of FIG. 38, and FIG. 38 is a sectional view of the linear motor taken along its driving axis.

Figure 39:
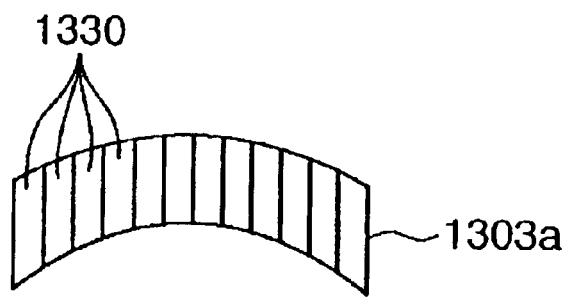
Figure 40:
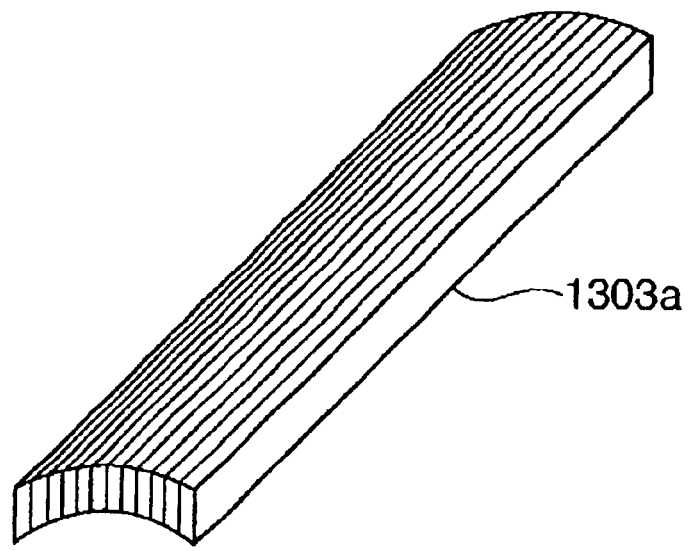
Figure 41:
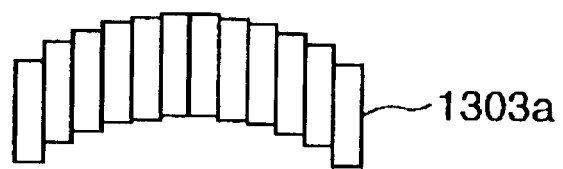

In the first to eleventh embodiments, the coil array of the stator (stator coil array) has a plurality of flat portions, and the multilayered yoke of the stator also has a plurality of flat portions. In contrast to this, in the twelfth embodiment, a coil array 1304 of the stator has an annular shape, as shown in FIG. 37, and multilayered yoke members 1303*a* which form a multilayered yoke (stator yoke) 1303 inside the coil array 1304 of the stator have arcuated surfaces, as shown in FIGS. 39 and 40 or 41.

In this embodiment as well, the movable magnet of the movable element can be formed of a plurality of magnet arrays 1305, so the movable magnet can be assembled easily. The magnetic flux of the magnet arrays 1305 circulates along the insulating layer of the multilayered yoke 1303, thereby preventing an eddy current substantially completely. Also, the windings of the coil array 1304 can be drawn out along spaces near the boundaries of the plurality of multilayered yoke members 1303*a*.

As described above, this embodiment is different from the first to eleventh embodiments in the shape of the coil array, the shape of the multilayered yoke, and the shapes of the magnet arrays.

First, according to the twelfth embodiment, the coil array 1304 has an annular shape. This is the result of considering easy winding of the coil conductor wires and the productivity. The first to eleventh embodiments have the excellent effects as described above. If, however, the multilayered yoke has a substantially square section, the tension acting on the conductor wires when winding the coil conductor wires changes largely. This poses limitation on high-speed winding. Also, the coil tends to bulge at the center of the flat portion of the multilayered yoke, thus narrowing the magnetic gap. Therefore, the gap between the movable magnet and the coils must be large. In contrast to this, in the twelfth embodiment, as the coil array 1304 has an annular shape, a change in tension which occurs when winding coil conductor wires decreases, so the coil conductor wires can be wound at a very high speed, while the coil shape has excellent uniformity (axial symmetry). Consequently, the magnetic gap need not be formed large in consideration of the coil bulge described above.

In this embodiment, because the coil array 1304 is formed to have an annular shape, the multilayered yoke 1303 is also formed of the arcuated multilayered yoke members 1303*a*. Note that each multilayered yoke member 1303*a* is not formed with a fan-like shape, as in the conventional case. In the twelfth embodiment, for example, surface-insulated magnetic thin plates 1330 with the same shape are stacked while slightly being shifted substantially along the surface of a support member 1301, thus assembling each multilayered yoke member 1303*a*. Hence, as shown in FIGS. 39 and 40 or 41, the surfaces of the thin plates 1330 directly form the surfaces at the two ends (two ends in the circumferential direction) of the multilayered yoke member 1303*a* formed by stacking in an arcuated manner. The manufacture is thus much easier than in the conventional case wherein the two ends of the multilayered yoke members are machined in the radial direction about the driving axis as the center. When fabricating an arcuated multilayered yoke member or a multilayered yoke member having arcuated surfaces, after thin plates are stacked, smooth arcuated surfaces may be formed by machining such as wire cutting. Alternatively, such machining may not be performed, but thin plates may be merely arrayed along the cylindrical surface of the cylindrical support rod 1301, and be fixed by adhesion or the like. The latter method may be simpler. Since, however, the magnetic thin plates 1330 with the same shape are arrayed along the cylindrical support rod 1301, the outer surface of the arcuated multilayered yoke member 1303a becomes identical to a shape obtained by translating the side surface of the cylindrical rod, which is not concentric with the cylindrical rod. Accordingly, a small gap is formed between the coil array 1304 and the annular coils 1303. Yet, this poses a problem only when the cylindrical rod has a small diameter, and can be solved in a design manner to a certain degree.

Because the coil array 1304 forms an annular shape, in this embodiment, that surface of each magnet array 1305 which corresponds to the coil array 1304 forms a concave arcuated surface. That surface of the magnet array 1305 which is on the side of back yoke 1306 is flat, in the same manner as in the first to eleventh embodiments. The direction of magnetization of the magnet array 1305 is not perpendicular to the cylindrical surface (i.e., the radial direction) throughout the entire width of the respective magnet array 1305, but is perpendicular to the flat surface on the rear surface of the magnet array 1305. As a result, the magnetic field formed by the magnet array 1305 becomes perpendicular to the lower surface of the magnet array 1305, so the magnetic flux circulates along the insulating layers of the respective magnetic thin plates 1330 which form the arcuated multilayered yoke member 1303a. Therefore, the eddy current can be prevented almost completely, in the same manner as in the first to eleventh embodiments.

Figure 42:
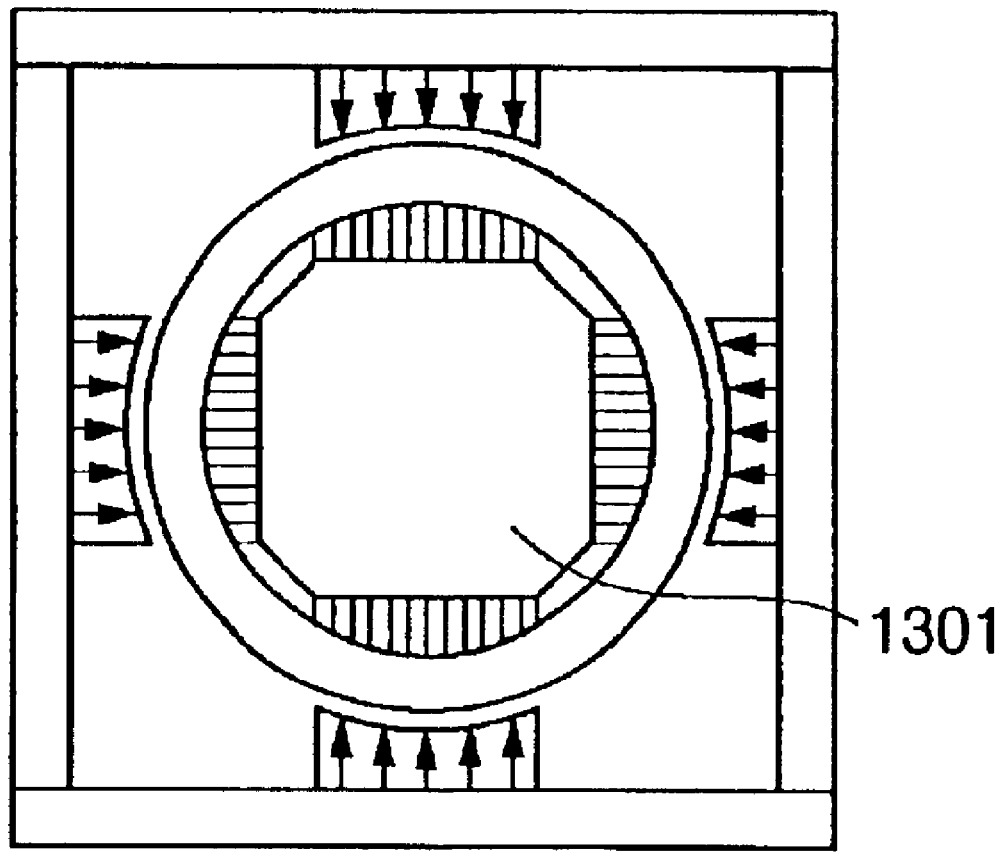
Figure 43:
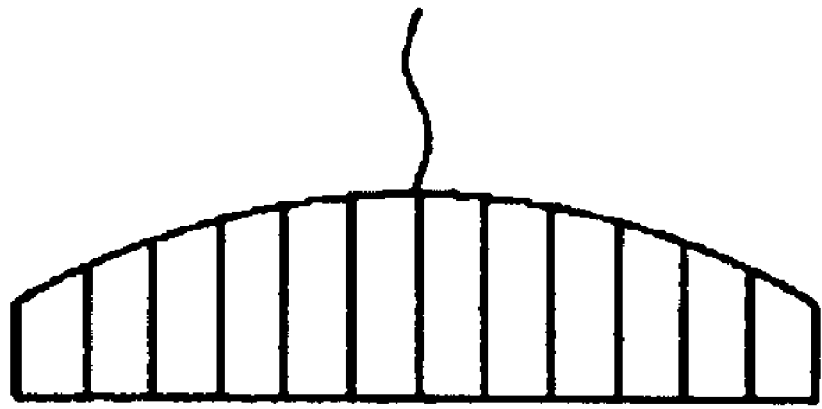

The multilayered yoke of the stator may not be arcuated as described, but its front and rear surfaces may form an arcuated surface and flat surface, respectively, as shown in FIGS. 42 and 43. An example of a method of forming this shape by machining can include a method of fabricating a plate-like multilayered yoke member as shown in the first embodiment (FIG. 5), and thereafter machining a prospective outer surface forming portion to form an arcuated surface. This method is much simpler than fabricating a structure with two arcuated surfaces, since the number of surfaces to be machined is only one.

When multilayered yoke members 1303a each with a section as shown in FIG. 43 are used, a support member 1301 for supporting them is preferably a prismatic rod with a substantially square or octagonal section, and not a cylindrical rod.

A flow channel for circulating a refrigerant is preferably formed in the support member 1301, in the same manner as in the first to eleventh embodiments. As the sectional shape of the flow channel, for example, the shape as shown in FIG. 1, 7, or 8 is suitable.

Figure 44:
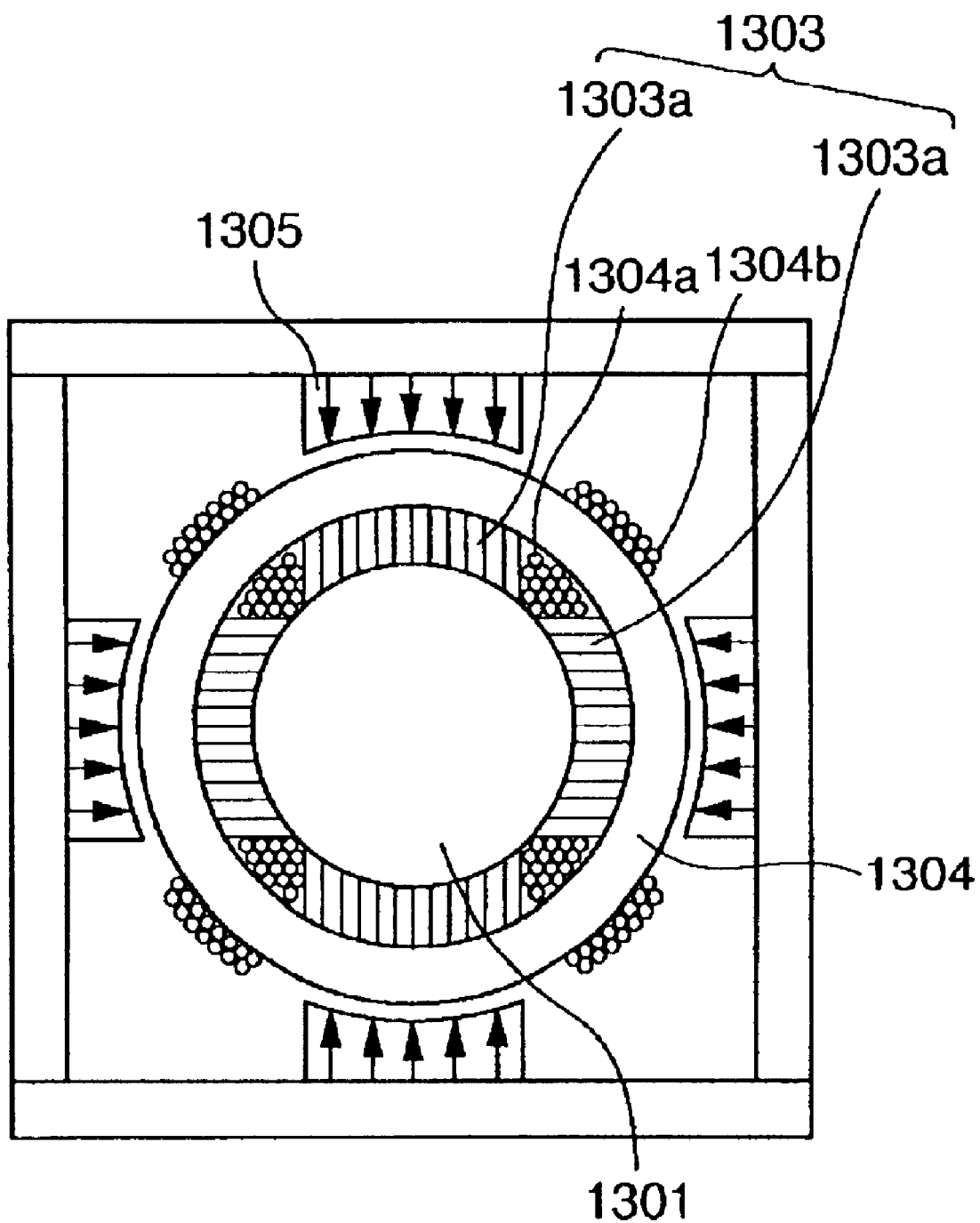
FIG. 44 is a view showing how to draw out coil windings in the twelfth embodiment of the present invention.

FIG. 44 is a view showing how to draw out coil windings in this embodiment. In this embodiment as well, in the same manner as in the first to eleventh embodiments, a winding start portion 1304a and winding end portion 1304b of each coil winding are positioned near the boundaries of the plurality of multilayered yoke members 1303a which form the multilayered yoke 1303. The conductor wires are drawn out from the coils to extend in the spaces near the boundaries in the axial direction. Thus, the thrust of the linear motor is not decreased.

The linear motor of this embodiment can be used in a stage apparatus and various types of apparatuses, e.g., an exposure apparatus, including a stage apparatus.

[Thirteenth Embodiment]

Figure 45:
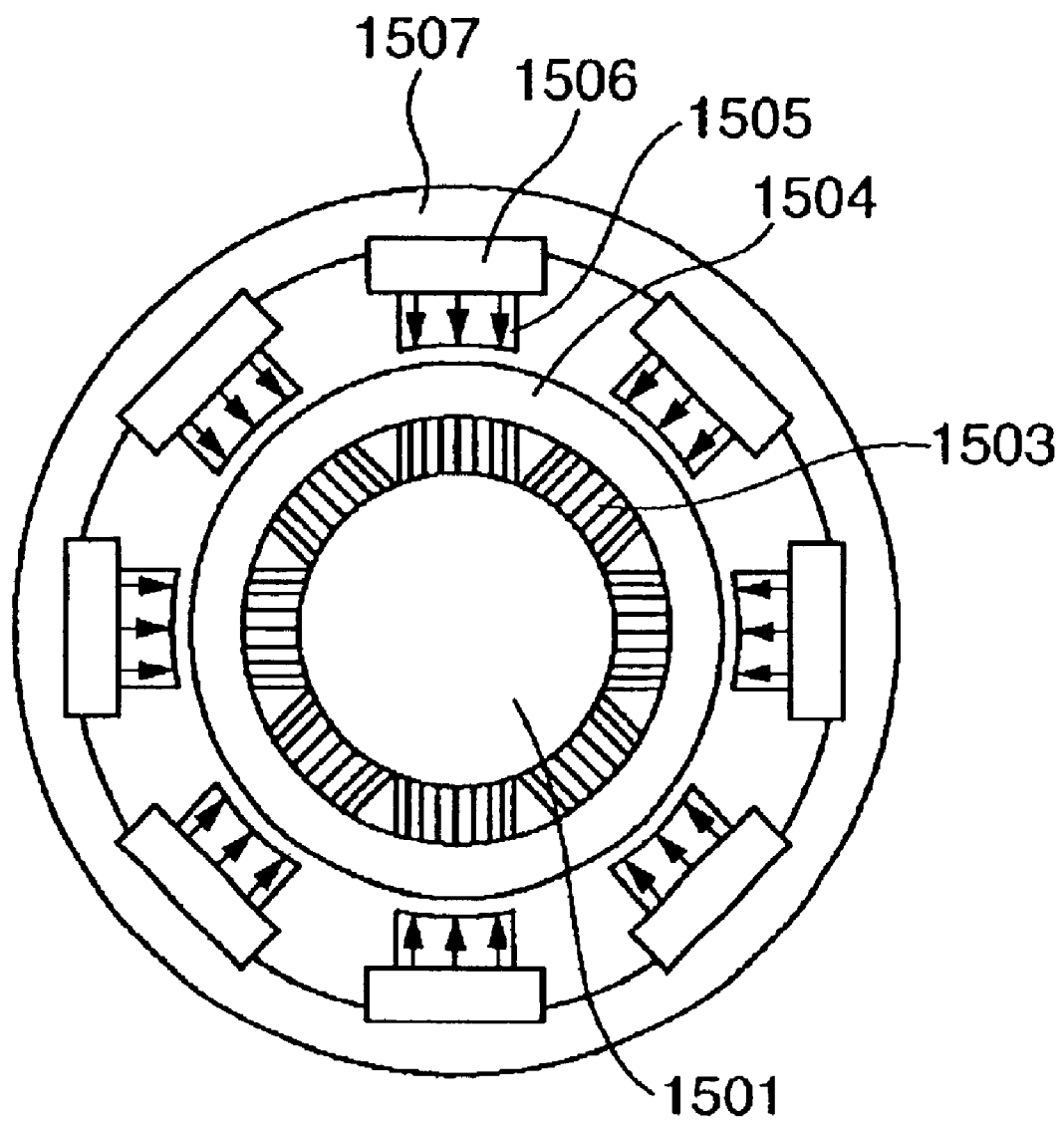
FIGS. 45 to 48 are views showing the arrangement of a linear motor according to the thirteenth embodiment of the present invention.
Figure 46:
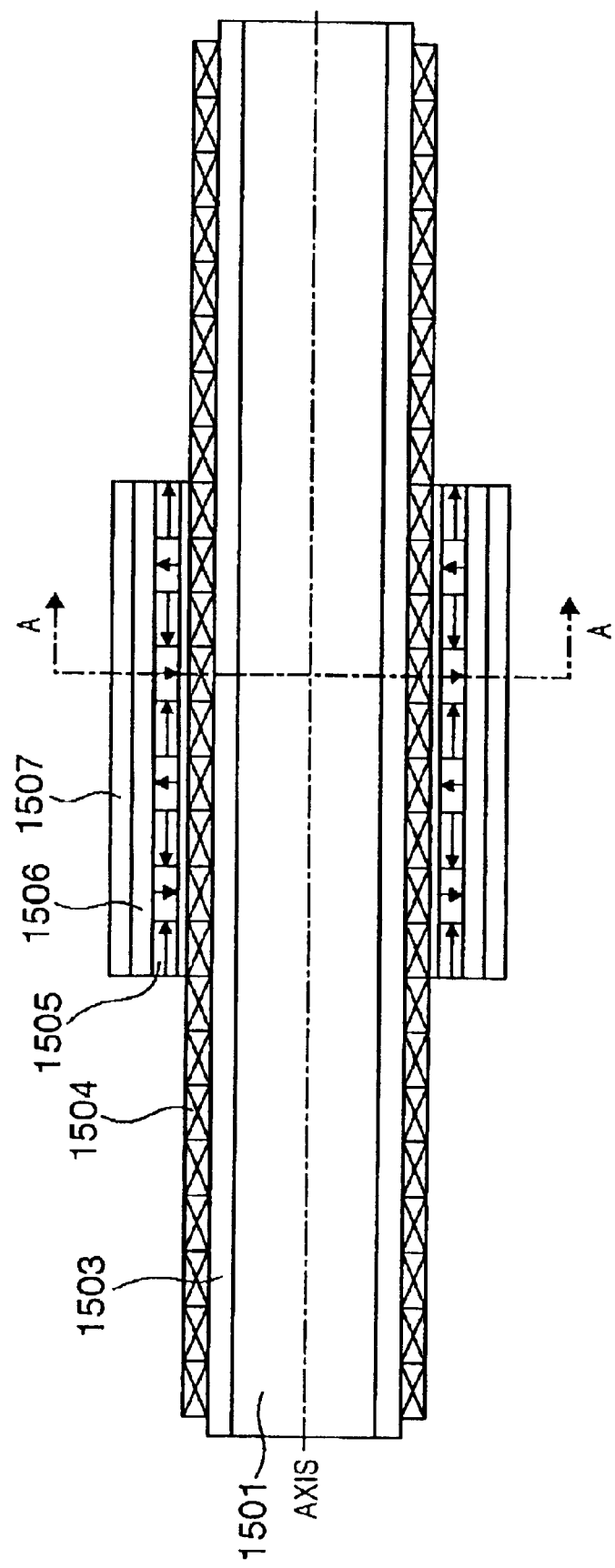
Figure 47:
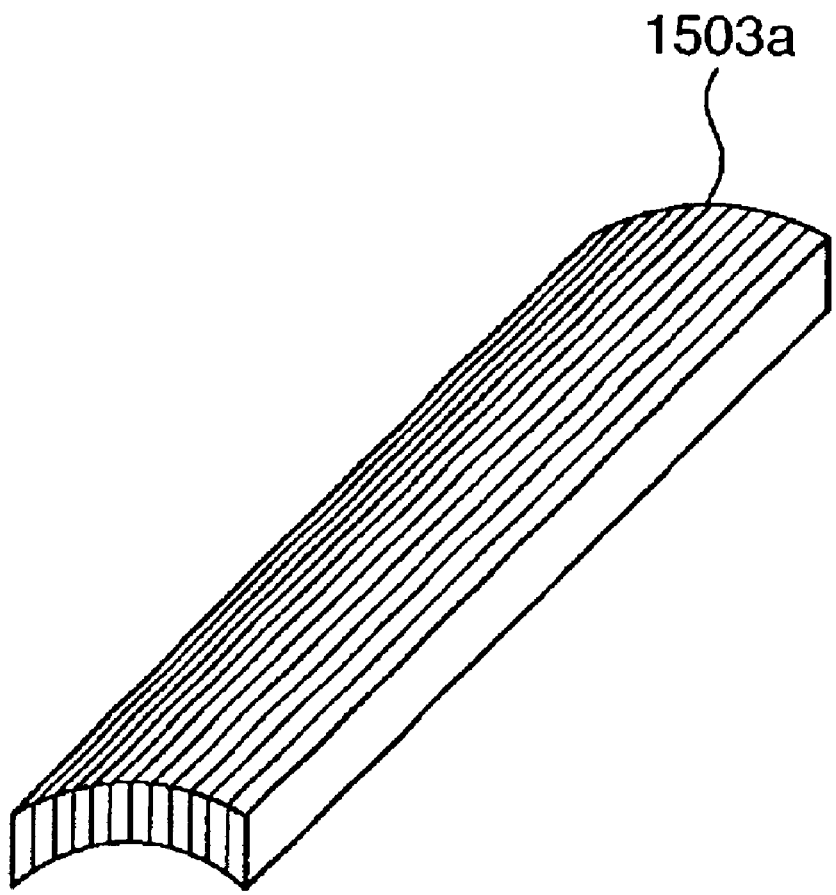
Figure 48:
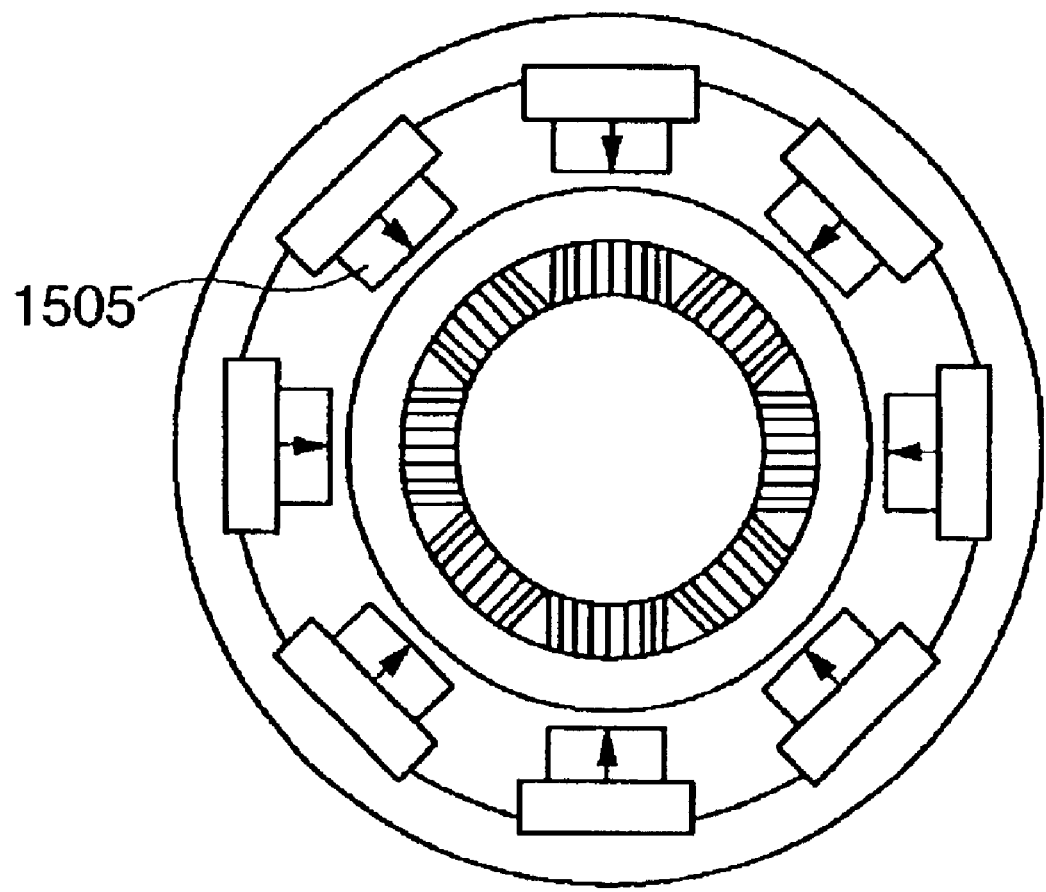

FIGS. 45 to 48 are views showing the arrangement of a linear motor according to the thirteenth embodiment of the present invention. FIG. 45 is a sectional view taken along the line of arrows A—A of FIG. 48, and FIG. 48 is a sectional view of the linear motor taken along the driving axis.

According to this embodiment, a multilayered yoke 1503 of the stator is formed of eight arcuated multilayered yoke members 1503a, and magnet arrays 1505 and back yokes 1506 of the movable element form eight units. In this embodiment, since the magnet arrays 1505 and back yokes 1506 form eight sets, the eight sets of magnet arrays 1505 and back yokes 1506 are held by a cylindrical holding member 1507. The holding member 1507 is preferably made of a ceramic material or the like with a high rigidity. In this embodiment, since the number of units is increased, the region where the coil arrays and magnet arrays face each other becomes larger than in the twelfth embodiment, so the thrust is increased.

When the number of units is increased, although the outer surfaces of the individual multilayered yoke members 1503a form arcuated surfaces, they can be practically regarded as flat surfaces. Hence, as shown in the embodiment of FIG. 48, even when the magnet arrays 1505 have flat surfaces, substantially the same thrust as that obtained with arcuated magnet arrays 1505 can be obtained. Consequently, the magnet arrays 1505 can be formed or machined easily. This embodiment is advantageous in this respect.

The linear motor of this embodiment can be used in a stage apparatus and various types of apparatuses, e.g., an exposure apparatus, including a stage apparatus.

[Fourteenth Embodiment]

Figure 49:
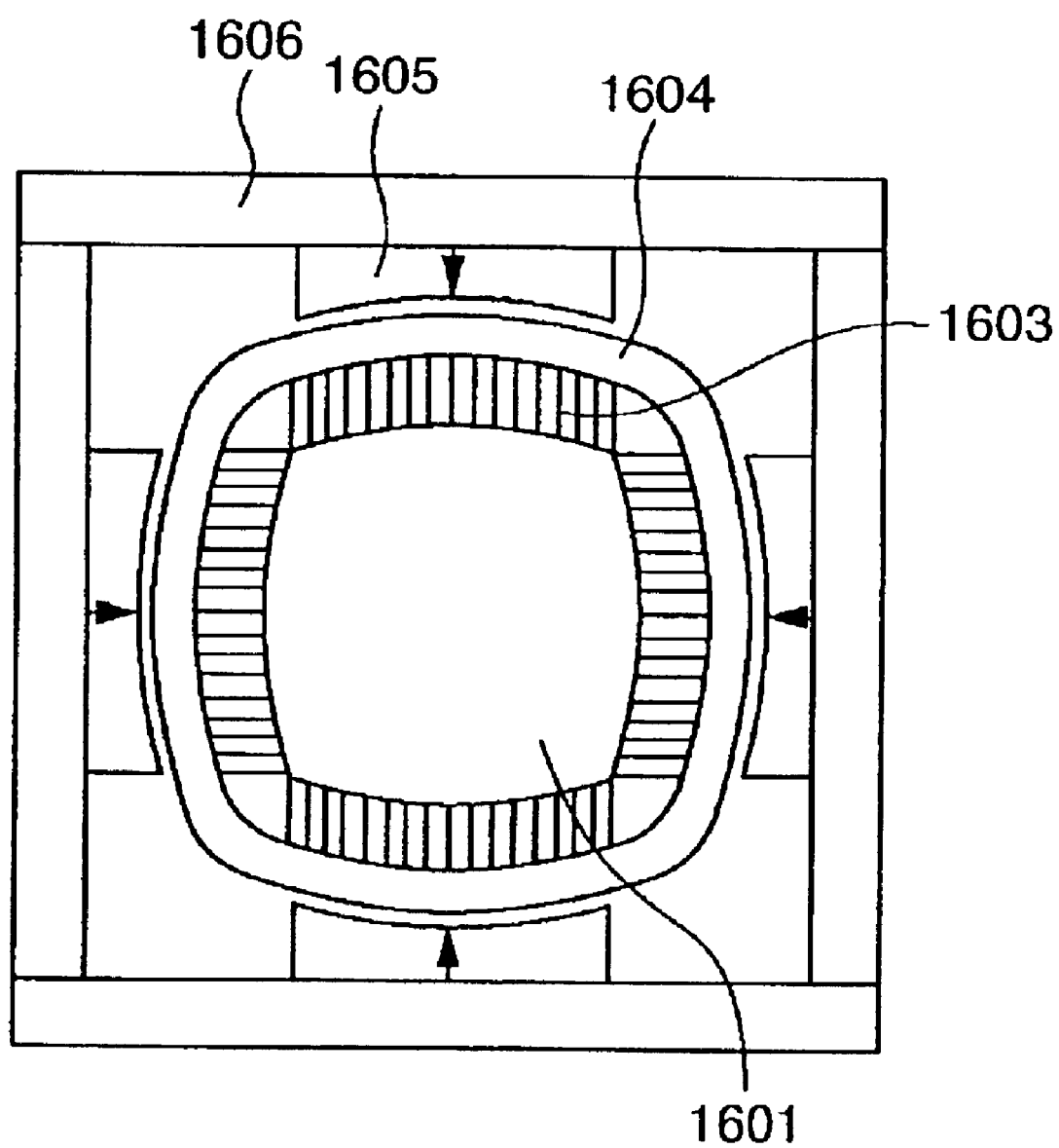
FIGS. 49 and 50 are views showing the arrangement of a linear motor according to the fourteenth embodiment of the present invention.
Figure 50:
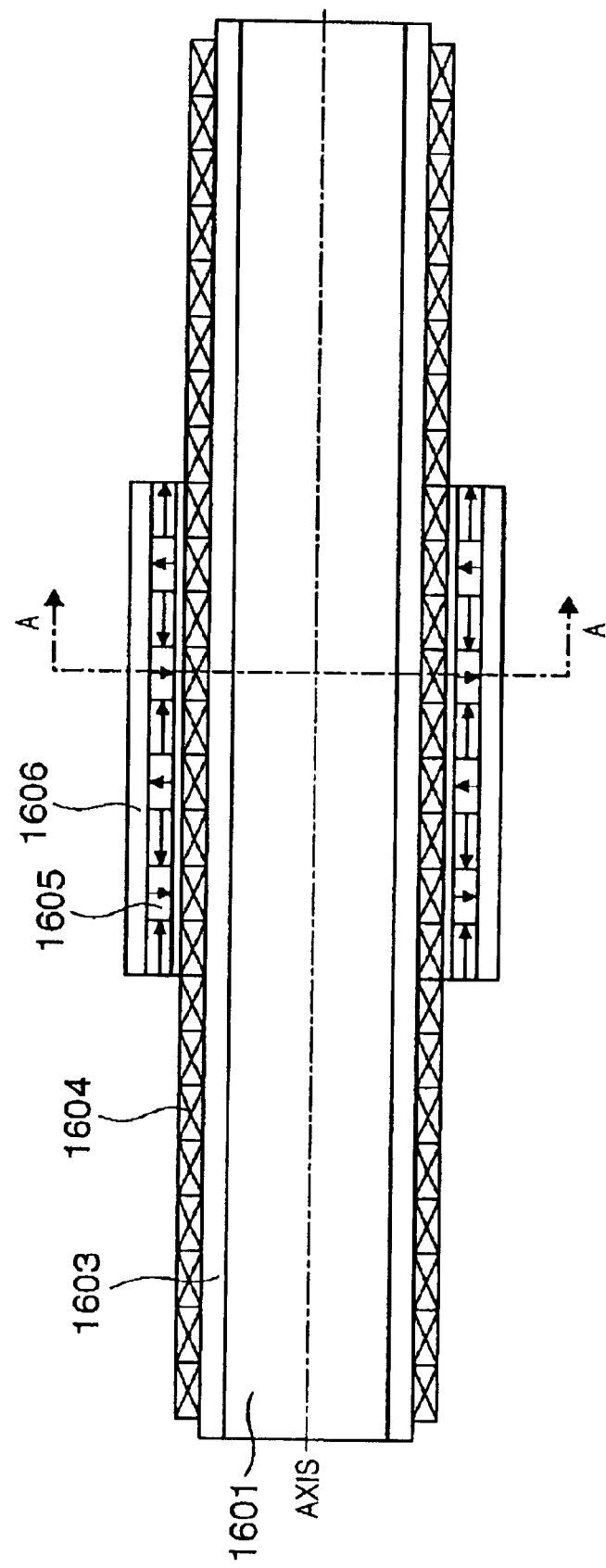

FIGS. 49 and 50 are views showing the arrangement of a linear motor according to the fourteenth embodiment of the present invention. FIG. 49 is a sectional view taken along the line of arrows A—A of FIG. 50, and FIG. 50 is a sectional view of the linear motor taken along the driving axis.

One characteristic feature of this embodiment resides in that a coil array 1604 of the stator is formed to include four smooth convex surfaces. Magnet arrays 1605 of the movable element, a multilayered yoke 1603 of the stator, and a central support member 1601 also have shapes matching the shape of the coil array 1604.

This embodiment has both the advantages of the first to eleventh embodiments and that of the twelfth embodiment. The first to eleventh embodiments are advantageous in that that region of the coil array which faces the magnet array is larger than that of the twelfth embodiment. The twelfth embodiment is advantageous in that, since its coil array forms an annular shape, a change in tension does not occur during winding the windings of the coil array, so the productivity of the coils improves, and the shape precisions of the coils improves.

This embodiment may be slightly inferior to the twelfth embodiment in that its coil array 1604 includes four smooth convex surfaces (curved surfaces), as described above. However, since a change in tension during winding of the coil windings is small, the coil windings can be wound at a high speed, and variations in shape of the coils are small. In this embodiment, since the entire shape is close to a square shape, the width of the yoke of the stator can be widened to near the corners, so the utilizing efficiency of the coil is increased.

The linear motor of this embodiment can be used in a stage apparatus or various types of apparatuses, e.g., an exposure apparatus, including a stage apparatus.

[Others]

The linear motor represented by each of the various embodiments described above, and a stage utilizing such a linear motor can be utilized as part of an apparatus, e.g., a wafer stage or reticle stage, that forms an exposure apparatus for manufacturing a device such as a semiconductor device or microdevice.

Figure 34:
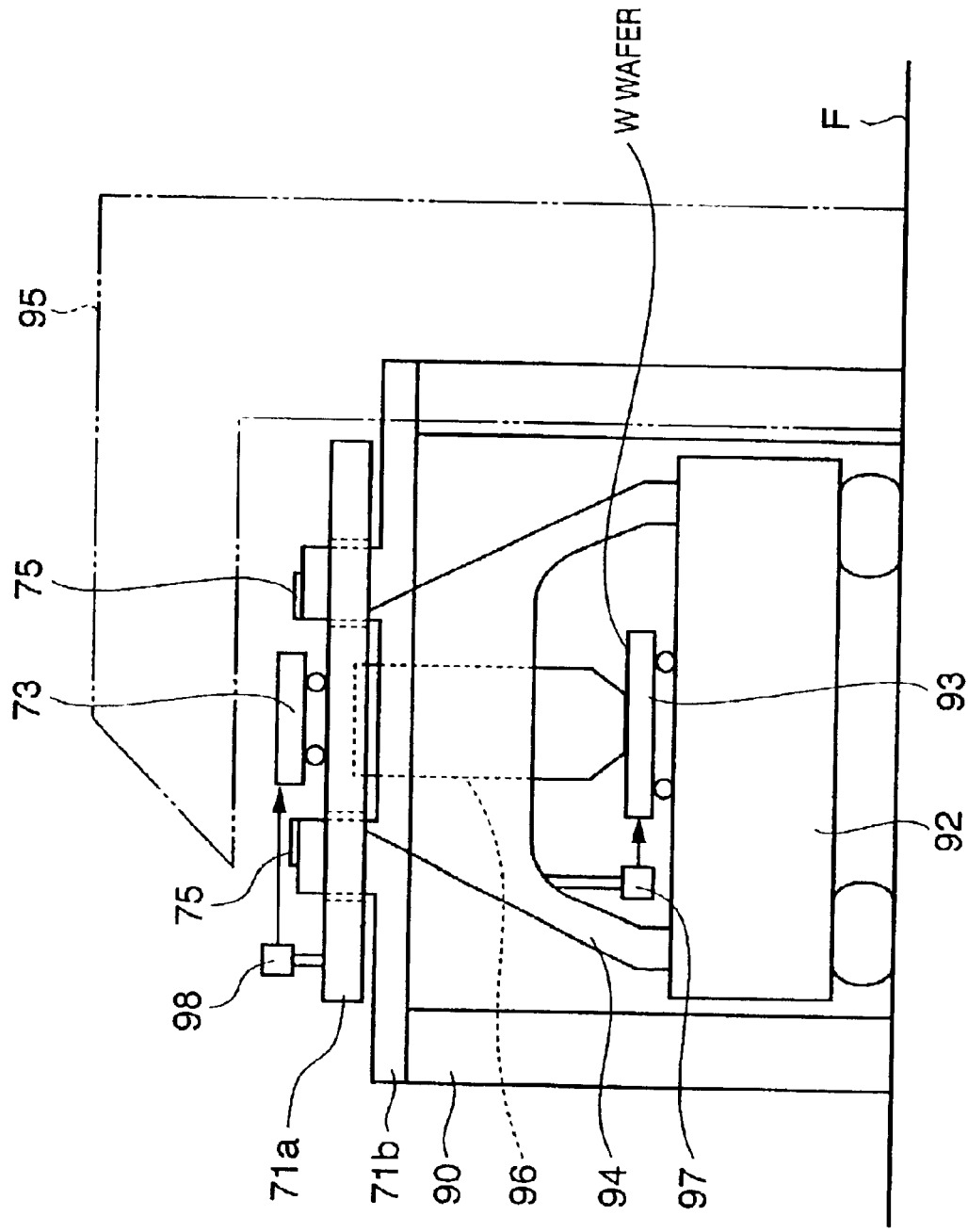
FIG. 34 is a view showing an example of an exposure apparatus according to the present invention.

An embodiment of a scanning exposure apparatus in which a stage using either one of the linear motors of the embodiments described above as a reticle stage or wafer stage will be described with reference to FIG. 34.

A reticle stage base 71a for supporting a reticle stage 73 is integral with a frame 94 standing upright on a base plate 92 which supports a wafer stage 93 of the exposure apparatus. A linear motor base 71b is supported by a support frame 90 directly fixed to a floor surface F separately from the base plate 92. An exposure beam transmitted through a reticle on the reticle stage 73 to expose a wafer W on the wafer stage 93 is generated by a light source unit 95 indicated by a broken line.

The frame 94 supports the reticle stage base 71a, and supports a projection optical system 96 between the reticle stage 73 and wafer stage 93. A stator 75 of a linear motor for accelerating or decelerating the reticle stage 73 is supported by the support frame 90 which is separate from the frame 94. Hence, the reactive force of the driving force of the linear motor for the reticle stage 73 will not be transmitted to the wafer stage 93 to serve as a disturbance to the driving portion, or to vibrate the projection optical system 96.

The wafer stage 93 is scanned by the driving portion in synchronism with the reticle stage 73. During scanning the reticle stage 73 and wafer stage 93, their positions are continuously detected by interferometers 97 and 98 and are fed back to the driving portions of the reticle stage 73 and wafer stage 93. Therefore, the scanning start positions of the reticle stage 73 and wafer stage 93 can be precisely synchronized with each other, and the scanning speed in a constant-speed scanning region can be controlled at a high precision.

Figure 35:
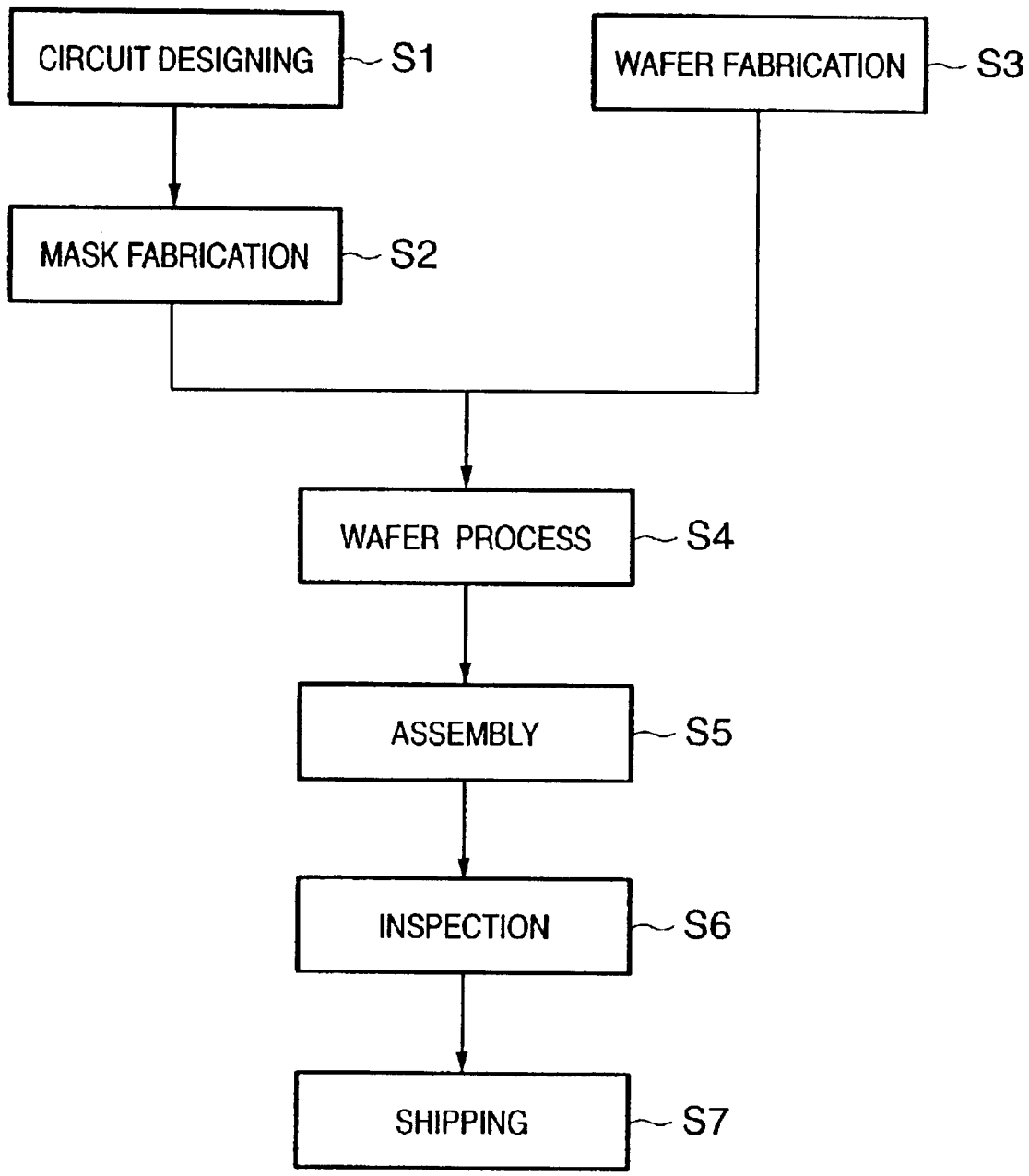
FIG. 35 is a flow chart showing an example of a device fabrication method according to the present invention.

An embodiment of a semiconductor device fabrication method utilizing the above-described exposure apparatus will be described. FIG. 35 shows a flow of the fabrication of a semiconductor device (e.g., a semiconductor chip such as an IC or LSI, a liquid crystal panel, a CCD, a thin film magnetic head, a micromachine, and the like). In step S1 (circuit designing), a circuit designing of the semiconductor device is performed. In step S2 (mask fabrication), a mask where the designed circuit pattern is formed is fabricated. On the other hand, in step S3 (wafer fabrication), a wafer as a substrate is fabricated using a material such as silicon or the like. In step S4 (wafer process), called a preprocess, the above mask and wafer are used, and an actual circuit is formed on the wafer by lithography. In step S5 (assembly), called a postprocess, a semiconductor chip is formed by using the wafer fabricated in step S4. The postprocess includes processing such as an assembly process (dicing and bonding) and a packaging process (chip sealing). In step S6 (inspection), inspections such as an operation test and a durability test are performed on the semiconductor device fabricated in step S5. The semiconductor device is completed through these processes, and is shipped (step S7).

Figure 36:
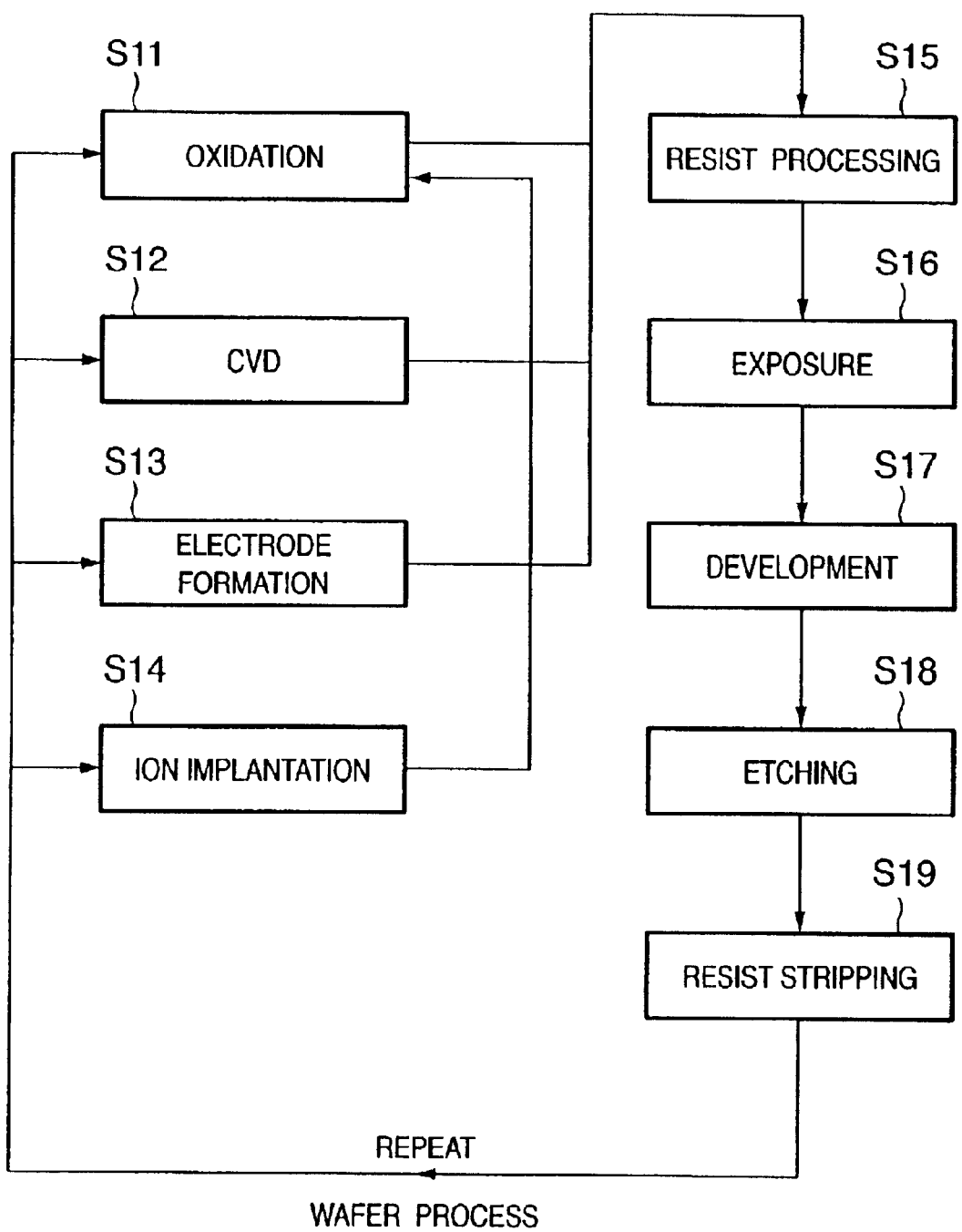
FIG. 36 is a flow chart showing the content of the wafer process of FIG. 35.

FIG. 36 shows a more detailed flow of the wafer process. In step S11 (oxidation), the surface of the wafer is oxidized. In step S12 (CVD), an insulating film is formed on the surface of the wafer. In step S13 (electrode formation), electrodes are formed by vapor deposition on the wafer. In step S14 (ion implantation), ions are injected into the wafer. In step S15 (resist processing), the wafer is coated with a photoresist. In step S16 (exposure), the above-described exposure apparatus exposure-transfers the circuit pattern of the mask onto the wafer. In step S17 (development), the exposed wafer is developed. In step S18 (etching), portions other than the developed resist image are etched. In step S19 (resist stripping), the resist unnecessary after the etching is removed. These steps are repeated, thereby, multiple circuit patterns are formed on the wafer. When the fabrication method according to this embodiment is used, a semiconductor device with a high integration degree can be manufactured.

According to the present invention, for example, a linear motor having a structure that can be fabricated easily, and a stage apparatus and exposure apparatus having this linear motor can be provided.

As many apparently widely different embodiments of the present invention can be made without departing from the spirit and scope thereof, it is to be understood that the invention is not limited to the specific embodiments thereof except as defined in the claims.

What is claimed is:

1. A linear motor comprising:

a stator element; and a movable element movable with respect to said stator element, wherein one of said stator element and said movable element includes a coil unit, the other of said stator element and said movable element includes a magnet unit, said coil unit includes an inner yoke extending in a moving direction and a coil arranged outside said inner yoke, said magnet unit includes a magnet arranged outside said coil, each of said inner yoke, coil, and magnet includes a plurality of flat portions, the plurality of flat portions of said inner yoke are parallel to an axis of said coil, each flat portion of said inner yoke is parallel to the corresponding flat portion of said coil and the corresponding flat portion of said magnet, a length of said inner yoke in a direction along the axis of said coil is longer than a length of said magnet in the direction along the axis of said coil, and said inner yoke has a prismatic structure formed by the plurality of flat portions supported by a support member.

2. The linear motor according to claim 1, wherein each flat portion of said inner yoke has a multilayered structure formed by stacking a plurality of layers perpendicular to the flat portion and parallel to the axis of said coil.

3. The linear motor according to claim 1, wherein a winding start portion of said coil is positioned near a boundary of one flat portion and another flat portion of said coil.

4. The linear motor according to claim 1, wherein a winding end portion of said coil is positioned near a boundary of one flat portion and another flat portion of said coil.

5. The linear motor according to claim 1, wherein a winding end portion and a winding start portion of said coil are positioned near a boundary of one flat portion and another flat portion of said coil.

6. The linear motor according to claim 5, wherein a conductor wire drawn out from said coil is arranged to extend near the boundary of one flat portion and another flat portion of said coil along the axis of said coil.

7. The linear motor according to claim 1, wherein each of said inner yoke, coil, and magnet has four flat portions.

8. The linear motor according to claim 1, wherein each of said inner yoke, coil, and magnet has three flat portions.

9. The linear motor according to claim 1, wherein each of said inner yoke, coil, and magnet has two flat portions.

10. The linear motor according to claim 1, wherein a support member for supporting said inner yoke from inside has a flow channel therein through which a refrigerant is to flow.

11. The linear motor according to claim 10, wherein the flow channel has a circular section.

12. The linear motor according to claim 10, wherein the flow channel comprises a plurality of flow channels formed in the support member.

13. The linear motor according to claim 10, wherein the flow channel has a plurality of grooves arranged radially about the axis of said coil as a center.

14. The linear motor according to claim 10, wherein the flow channel has a honeycomb-like section.

15. The linear motor according to claim 1, wherein the support member supporting said inner yoke is made of a metal.

16. The linear motor according to claim 1, wherein the support member supporting said inner yoke is made of a ceramic material.

17. The linear motor according to claim 1, further comprising a partition arranged between said coil and said magnet, and a flow channel through which a refrigerant is to flow is formed between said coil and the partition.

18. The linear motor according to claim 17, wherein the partition has a polygonal section.

19. The linear motor according to claim 17, wherein the partition has a circular section.

20. The linear motor according to claim 19, wherein the partition is made of an insulating material.

21. The linear motor according to claim 1, wherein
said coil has a plurality of partial stator coils arrayed in a direction of the axis of said coil, and
the linear motor further has an aligning member for aligning said plurality of partial coils.

22. The linear motor according to claim 21, wherein said aligning member has a comb tooth shape at a section thereof taken along a direction of the axis of said coil, and said partial coils are aligned among comb teeth that form the comb tooth shape.

23. The linear motor according to claim 1, wherein said coil has a plurality of partial coils arrayed in a direction of the axis of said coil, each of said partial coils being wound on a bobbin.

24. The linear motor according to claim 23, wherein the bobbin has a notch in a side plate thereof.

25. The linear motor according to claim 23, wherein a side plate of the bobbin has a thickness larger than one half a diameter of a winding of said coil.

26. The linear motor according to claim 1, further comprising a gas release-preventive cover outside said coil.

27. The linear motor according to claim 1, wherein said magnet unit has a back yoke outside said magnet.

28. The linear motor according to claim 27, wherein said back yoke has a plurality of flat portions arranged to be parallel to the plurality of flat portions of said magnet.

29. The linear motor according to claim 28, further comprising a support member supporting the plurality of flat portions that form said back yoke.

30. A stage apparatus comprising:
the linear motor according to claim 1; and
a stage driven by the linear motor.

31. The stage apparatus according to claim 30, further comprising:
a mass element connected to a coil unit of the linear motor; and
a surface plate for slidably supporting a structure including said coil unit and said mass element.

32. The stage apparatus according to claim 31, wherein
said magnet unit has a reflection body at least on that surface thereof which faces said coil unit, and
said mass element has an absorption body at least on that surface thereof which faces said coil unit.

33. An exposure apparatus comprising:
the stage apparatus according to claim 30, as a stage apparatus for aligning a substrate.

34. A device fabrication method including the steps of:
exposing a wafer with a device pattern using the exposure apparatus according to claim 33; and
developing the exposed wafer.

35. An exposure apparatus comprising:
the stage apparatus according to claim 30 as a stage apparatus for aligning a master.

36. A device fabrication method including the steps of:
exposing a wafer with a device pattern using the exposure apparatus according to claim 35; and
developing the exposed wafer.

37. A linear motor comprising:
a stator element; and
a movable element movable with respect to said stator element,
wherein one of said stator element and said movable element includes a coil unit,
the other of said stator element and said movable element includes a magnet unit,
said coil unit has an inner yoke and a coil arranged outside said inner yoke, and
said magnet unit has a magnet arranged outside said coil and a back yoke outside said magnet,
said inner yoke, coil, magnet, and back yoke each having a plurality of flat portions, the plurality off flat portions of said coil being parallel to an axis of said coil, and the flat portions of said inner yoke being parallel to the corresponding flat portions of said coil, the corresponding flat portions of said magnet, and the corresponding flat portions of said back yoke, and
said back yoke having a hollow prismatic structure which is formed by connecting the plurality of flat portions that form said back yoke.

38. A stage apparatus comprising:
a linear motor including a stator element and a movable element movable with respect to said stator element, wherein one of said stator element and said movable element has a coil unit, and the other of said stator element and said movable element has a magnet unit, said coil unit has an inner yoke and a coil arranged outside said inner yoke, said magnet unit has a magnet arranged outside said coil, each of said inner yoke, coil, and magnet has a plurality of flat portions, the plurality of flat portions of said coil are parallel to an axis of said coil, and the flat portions of said inner yoke are parallel to the corresponding flat portions of said coil and the corresponding flat portions of said magnet;
a stage driven by said linear motor;
a mass element connected to said coil unit of the linear motor and arranged to surround said coil unit and magnet unit of the linear motor; and
a surface plate for slidably supporting a structure including said coil unit and said mass element.

39. The stage apparatus according to claim 38, wherein said mass element has a flow channel therein through which a refrigerant flows.

40. A linear motor comprising:

a stator element; and a movable element movable with respect to said stator element, wherein one of said stator element and said movable element includes a coil unit, the other of said stator element and said movable element includes a magnet unit, said coil unit has an inner yoke and a coil arranged outside said inner yoke, and said magnet unit has a magnet arranged outside said coil, and said magnet and said inner yoke each having a plurality of rectangular portions, said coil having a plurality of flat portions parallel to an axis of said coil unit, and the rectangular portions of said magnet being parallel to the corresponding rectangular portions of said inner yoke and the corresponding flat portions of said coil.

41. A linear motor comprising:

a stator element; and a movable element movable with respect to said stator element, wherein one of said stator element and said movable element includes a coil unit, the other of said stator element and said movable element includes a magnet unit, said coil unit has an inner yoke comprising a plurality of multilayered bodies each formed by stacking a large number of layers parallel to an axis of said coil unit, and a coil arranged adjacent to said inner yoke, and said magnet unit has a magnet arranged to face said coil, said multilayered bodies of said inner yoke being rectangular parallelepiped shapes or non-arcuate shapes similar to rectangular parallelepiped shapes, and at least one of said coil and magnet having a plurality of rectangular parallelepiped portions, the plurality of rectangular parallelepiped portions being arranged to be parallel to the plurality of multilayered bodies of said inner yoke.

42. A linear motor comprising:

a stator element; and a movable element movable with respect to said stator element, wherein one of said stator element and said movable element includes a coil unit, the other of said stator element and said movable element includes a magnet unit, said coil unit has a coil wound around a driving axis, and an inner yoke arranged inside said coil, said magnet unit has a magnet arranged outside said coil, and which generates a thrust, upon interaction of said coil and magnet, to drive said magnet toward the driving axis, and said inner yoke has a plurality of multilayered yoke members, each of said multilayered yoke members being formed by stacking thin plates with the same shape to be parallel to each other.

43. A linear motor comprising:

a stator element; and a movable element movable with respect to said stator element, wherein one of said stator element and said movable element includes a coil unit, the other of said stator element and said movable element includes a magnet unit, said coil unit has a coil wound around a driving axis and an inner yoke arranged inside said coil, said magnet unit has a magnet arranged outside said coil, and which generates a thrust, upon interaction of said coil and magnet, to drive said magnet toward said driving axis, said inner yoke has a plurality of multilayered yoke members, each of said multilayered yoke members being formed by stacking thin plates to be parallel to each other, said magnet has a plurality of magnets respectively opposing said plurality of multilayered yoke members, and directions of magnetization of said magnets in predetermined sections perpendicular to the driving axis being parallel to surfaces of said thin plates that form said multilayered yoke members opposing said magnets.

44. The linear motor according to claim 43, wherein, of each of said yoke members, a first surface which opposes said magnets includes a convex surface, and a second surface opposite to the first surface includes a flat surface.

45. A linear motor comprising:

a stator element; and a movable element movable with respect to said stator element, wherein one of said stator element and said movable element includes a coil unit, the other of said stator element and said movable element includes a magnet unit, said coil unit has an inner yoke and a coil arranged outside said inner yoke, said magnet unit has a magnet arranged outside said coil and an annular back yoke arranged to surround said coil, and said inner yoke, coil, and magnet each having a plurality of flat portions, the plurality of flat portions of said coil being parallel to an axis of said coil unit, and the flat portions of said inner yoke being parallel to the corresponding flat portions of said coil and the corresponding flat portions of said magnet.

46. A linear motor comprising:

a stator element; and a movable element movable with respect to said stator element, wherein one of said stator element and said movable element includes a coil unit, the other of said stator element and said movable element includes a magnet unit, said coil unit has an inner yoke and a coil arranged outside said inner yoke, said magnet unit has a magnet arranged outside said coil and a back yoke having an annular shape and arranged to surround said coil, said back yoke having a flat portion in which said magnet is attached, and said inner yoke, coil, and magnet each having a plurality of flat portions, the plurality of flat portions of said coil being parallel to an axis of said coil unit, and the flat portions of said inner yoke being parallel to the corresponding flat portions of said coil and the corresponding flat portions of said magnet.

47. A linear motor comprising:

a stator element; and a movable element movable with respect to said stator element, wherein one of said stator element and said movable element includes a coil unit, the other of said stator element and said movable element includes a magnet unit, said coil unit has an inner yoke and a coil arranged outside said inner yoke, said magnet unit has a magnet arranged outside said coil, and said inner yoke, coil, and magnet each having a plurality of flat portions, the plurality of flat portions of said coil being parallel to an axis of said coil unit, and the flat portions of said inner yoke being parallel to the corresponding flat portions of said coil and the corresponding flat portions of said magnet, and at least one of planes of the flat portions of said coil intersecting each other and planes of the flat portions of said inner yoke intersecting each other.

48. A linear motor comprising:

a stator element; and a movable element movable with respect to said stator element, wherein one of said stator element and said movable element includes a support member extending along a moving direction and having a plurality of flat portions, a plurality of inner yokes on said flat portions, and a coil unit outside said plurality of inner yokes, the other of said stator elements and said movable element includes, outside said coil unit, a plurality of magnets each having a surface parallel to the corresponding flat portion of said support members, and the plurality of magnets each having a magnet arranged outside of said coil unit and a back yoke having an annular shape and arranged to surround said coil unit.

* * * * *

UNITED STATES PATENT AND TRADEMARK OFFICE
CERTIFICATE OF CORRECTION

PATENT NO. : 6,864,602 B2
DATED : March 8, 2005
INVENTOR(S) : Nobushige Korenaga It is certified that error appears in the above-identified patent and that said Letters Patent is hereby corrected as shown below:

<u>Title page,</u>
Item [56], References Cited, U.S. PATENT DOCUMENTS, the eleventh-listed patent "5,841,250 A 11/1998 Korenage et al. ….…...318/135" should read -- 5,841,250 A 11/1998 Korenaga et al. ….……...318/135 --.
FOREIGN PATENT DOCUMENTS, the first document listed "DE   101 50 520 A 1 10/2001" should read -- DE    101 50 520 A1 10/2001 --.

<u>Column 1,</u>
Line 45, "intensity" should read -- intensify --.

<u>Column 13,</u>
Line 3, "invention" should read -- invention, --.

<u>Column 16,</u>
Line 55, "Ni" should read -- Ni- --.

<u>Column 24,</u>
Line 38, "off" should read -- of --.

<u>Column 28,</u>
Line 15, "members," should read -- member, --.

Signed and Sealed this

Second Day of August, 2005

JON W. DUDAS
*Director of the United States Patent and Trademark Office*